(12) United States Patent
Tsuboi et al.

(10) Patent No.: US 9,810,738 B2
(45) Date of Patent: Nov. 7, 2017

(54) SEMICONDUCTOR DEVICE, DIAGNOSTIC TEST, AND DIAGNOSTIC TEST CIRCUIT

(71) Applicant: Renesas Electronics Corporation, Kawasaki-shi (JP)

(72) Inventors: Yukitoshi Tsuboi, Kawasaki (JP); Hideo Nagano, Kawasaki (JP); Hiroshi Nagaoka, Kawasaki (JP); Yusuke Matsunaga, Kawasaki (JP); Yutaka Igaku, Kawasaki (JP); Naotaka Kubota, Kawasaki (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 280 days.

(21) Appl. No.: 14/676,743

(22) Filed: Apr. 1, 2015

(65) Prior Publication Data

US 2015/0293173 A1 Oct. 15, 2015

(30) Foreign Application Priority Data

Apr. 11, 2014 (JP) .................................. 2014-081852
Jan. 30, 2015 (JP) .................................. 2015-016443

(51) Int. Cl.
| | | |
|---|---|---|
| *G11C 29/00* | (2006.01) | |
| *G06F 11/00* | (2006.01) | |
| *G01R 31/3177* | (2006.01) | |
| *G01R 31/3185* | (2006.01) | |
| *G06F 11/08* | (2006.01) | |

(52) U.S. Cl.
CPC . *G01R 31/3177* (2013.01); *G01R 31/318544* (2013.01); *G06F 11/08* (2013.01)

(58) Field of Classification Search
CPC ........ G01R 31/3177; G01R 31/318514; G01R 31/318541; G01R 31/318544; G01R 31/318533; G01R 31/318536; G01R 31/31853; G01R 31/318525; G06F 11/08
USPC ........ 714/729, 726, 727, 728, 733, 30, 5.11, 714/10, 11, 51, 50
See application file for complete search history.

(56) References Cited

U.S. PATENT DOCUMENTS 6,191,603 B1   2/2001 Muradali et al.
7,181,705 B2 * 2/2007 Dervisoglu .... G01R 31/318505
                                                        714/727

(Continued)

FOREIGN PATENT DOCUMENTS

JP          10-11319 A      1/1998
JP       2012-194111 A     10/2012

OTHER PUBLICATIONS

Extended European Search Report dated Sep. 9, 2015.
Extended European Search Report dated Jun. 22, 2016.

*Primary Examiner* — Christine Tu
(74) *Attorney, Agent, or Firm* — McGinn IP Law Group, PLLC

(57) ABSTRACT

Deterioration in operation performance due to a fault diagnosis is prevented. A semiconductor device 90 according to the present invention includes a plurality of CPU cores 91 to 94 each including a scan chain, and a diagnostic test circuit 95 that performs a scan test for the plurality of CPU cores 91 to 94 by using the scan chain of the CPU core. The diagnostic test circuit 95 performs a scan test for each of the plurality of CPU cores 91 to 94 in a predetermined order on a periodic basis so that execution time periods of the scan tests do not overlap each other.

20 Claims, 36 Drawing Sheets

(56) References Cited

U.S. PATENT DOCUMENTS

| | | | |
|---|---|---|---|
| 8,332,699 B2* | 12/2012 | Chandra | G01R 31/318583 |
| | | | 714/724 |
| 8,839,057 B2* | 9/2014 | Hughes | G11C 29/16 |
| | | | 714/718 |
| 2004/0006729 A1 | 1/2004 | Pendurkar | |
| 2004/0054950 A1 | 3/2004 | Larson et al. | |

* cited by examiner

Fig. 9

SEMICONDUCTOR DEVICE, DIAGNOSTIC TEST, AND DIAGNOSTIC TEST CIRCUIT

CROSS-REFERENCE TO RELATED APPLICATIONS

This application is based upon and claims the benefit of priority from Japanese patent application No. 2014-081852, filed on Apr. 11, 2014, and Japanese patent application No. 2015-016443, filed on Jan. 30, 2015, the disclosure of which are incorporated herein in its entirety by reference.

BACKGROUND

The present invention relates to a semiconductor device, a diagnostic test, and a diagnostic test circuit in a semiconductor device. For example, the present invention can be suitably used for a diagnosis of a plurality of CPU cores.

To achieve high calculation performance, a CPU (Central Processing Unit) system having a multi-core architecture is desirable. However, if a failure occurs in one of the CPU cores, it is necessary to immediately detect the failure and bring the system into a safe state in view of functional safety. However, the use of a program (software) for performing a self-diagnosis based on an instruction set to perform a fault diagnosis of a high-performance CPU cannot provide a satisfactory result in terms of both the fault detection rate (diagnosis coverage) and the diagnosis time (program execution time). For example, even if a self-diagnosis program by which high diagnosis coverage can be achieved can be created, it is certain that the execution time of that self-diagnosis program will be considerably long. Therefore, the execution of that program in a normal operation state lowers the operation performance, thus making it unrealistic.

Japanese Unexamined Patent Application Publication No. H10-11319 discloses a technique in which a boundary scan test for a plurality of CPU boards is carried out by using one scan chain extending through the plurality of CPU boards and a fault diagnosis of the plurality of CPU boards is thereby performed. Further, Japanese Unexamined Patent Application Publication No. 2012-194111 discloses a technique in which when the execution of an application is requested while a fault diagnosis of a process is being performed by performing a scan test, the scan test is interrupted and the application is executed.

SUMMARY

However, the present inventors have found the following problem. In the technique disclosed in Japanese Unexamined Patent Application Publication No. H10-11319, since the boundary scan test is performed by using the scan chain extending through all the CPU boards, none of the CPU boards can be operated when the boundary scan test is performed, thus causing a problem that the operation performance deteriorates. Further, although Japanese Unexamined Patent Application Publication No. H10-11319 discloses a technique for individually selecting a CPU board to be tested, it does not disclose any specific method for selecting a CPU board for which a boundary scan test is performed to prevent or minimize the deterioration in the operation performance. Similarly, Japanese Unexamined Patent Application Publication No. 2012-194111 also does not disclose any specific method for selecting a processor for which a scan test is performed to prevent or minimize the deterioration in the operation performance. Other objects and features will be more apparent from the following description of certain embodiments taken in conjunction with the accompanying drawings.

A first aspect of the present invention is a semiconductor device that performs a scan test for each of a plurality of CPU cores in a predetermined order on a periodic basis so that execution time periods (execution periods) of the scan tests do not overlap each other.

According to the first aspect, it is possible to prevent or minimize the deterioration in the operation performance due to the fault diagnosis.

BRIEF DESCRIPTION OF THE DRAWINGS

The above and other aspects, advantages and features will be more apparent from the following description of certain embodiments taken in conjunction with the accompanying drawings, in which:

FIG. 9 is an explanatory diagram showing the content of test data stored in a FLASH memory shown in FIG. 3;

DETAILED DESCRIPTION

Preferable embodiments are explained hereinafter with reference to the drawings. Specific values and the like shown in the below-shown embodiments are merely examples for facilitating the understanding of embodiments. That is, the present invention is not limited to those values, unless otherwise specified. Further, in the following descriptions and the drawings, matters obvious for those skilled in the art may be omitted or simplified as appropriate for clarifying the explanations.

First Embodiment

Firstly, a configuration and an operation according to a first embodiment are explained with reference to the drawings.

Figure 1:
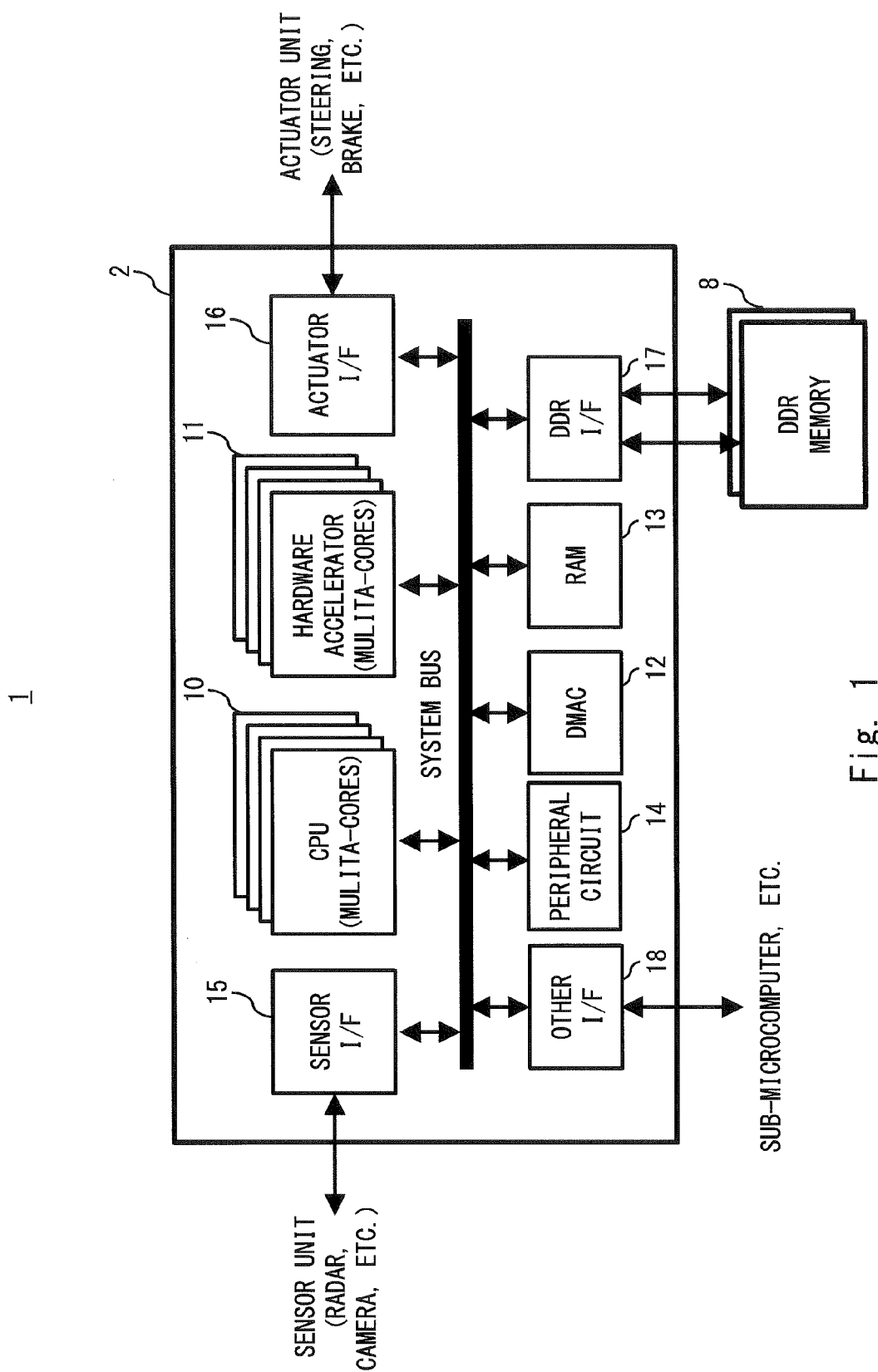
FIG. 1 is a block diagram showing an example of a CPU system that achieves high operation performance.

FIG. 1 is a block diagram showing an example of a configuration of a CPU system 2 for an ADAS (Advanced Driver Assistance System) of a car-mounted ECU (Electronic Control Unit) 1 requiring high operation performance. The car-mounted ECU 1 includes the CPU system (main microcomputer) 2 and a plurality of DDR (Double-Data-Rate) memories 8 serving as external memories. The CPU system 2 includes as internal processing circuits, a CPU (multi-cores) having a multi-core architecture 10, a hardware accelerator (multi-cores) having a multi-core architecture 11, a DMAC (Direct Memory Access Controller) 12, a RAM (Random Access Memory) 13, and other peripheral circuits 14. Further, the CPU system 2 includes as circuits for external interfaces, a sensor I/F 15, an actuator I/F 16, a DDR I/F 17, and other I/Fs 18.

These circuits 10 to 18 are connected to an internal system bus. A sensor unit mounted on the car such as a radar device and a camera, which is positioned on the input side of the CPU system 2, is connected to the sensor I/F 15. An actuator unit mounted on the car such as a steering wheel and a brake, which is positioned on the output side of the CPU system. 2, is connected to the actuator I/F 16. Further, a plurality of DDR memories 8 are connected to the DDR I/F 17.

The CPU 10 controls the actuator unit according to a detection result of the sensor unit. The sensor unit generates sensor data indicating a detected item(s). In the case of a radar device, the sensor data is, for example, data indicating a distance to an obstacle. Further, In the case of a camera, the sensor data is, for example, data indicating an image obtained by an image pickup operation. The CPU 10 acquires the sensor data generated by the sensor unit through the sensor I/F 15, and determines whether or not there is an obstacle in the traveling direction of the car based on the acquired sensor data. When the CPU 10 determines that there is an obstacle, the CPU 10 generates control data for controlling the actuator unit to avoid the obstacle and transmits the generated data to the actuator unit through the actuator I/F 16. When the control data is data sent to the steering wheel, the control data is data for controlling the steering wheel so that the traveling direction of the car is changed to a direction in which there is no obstacle. When the control data is data sent to the brake, the control data is data for controlling the brake so that the car is stopped before the car collides with the obstacle.

Note that although the above explanations are given for a case where the CPU 10 performs control as a pre-crash safe system, the present invention is not limited to such cases. The CPU 10 may perform arbitrary control other than the pre-crash safe system.

Note that a program(s) (software) including instructions for performing the above-described control is stored in the RAM 13 or the DDR memory 8. The CPU 10 implements the above-described control by executing the program stored in the RAM 13 or the DDR memory 8.

The hardware accelerator 11 performs part of arithmetic processing in the above-described control performed by the CPU 10 in a supplemental manner. For example, the hardware accelerator 11 performs part of arithmetic processing relating to the sensor data in a supplemental manner when the CPU 10 determines whether or not there is an obstacle in the traveling direction of the car based on the sensor data. As the hardware accelerator 11, a GPU (Graphics Processing Unit) including a plurality of CPU cores, for example, may be used.

The DMAC 12 transfers data between the circuits 13 to 18 connected to the system bus. For example, the DMAC 12 transfers sensor data generated by the sensor unit to the DDR memory 8 through the sensor I/F 15 and the DDR I/F 17. As a result, the CPU 10 can obtain the sensor data generated by the sensor unit from the DDR memory 8. Further, the DMAC 12 transfers control data stored in the DDR memory 8 to the actuator unit through the DDR I/F 17 and the actuator I/F 16. As a result, the CPU 10 can transmit control data to the actuator unit by storing that control data into the DDR memory 8.

Various data is stored in the RAM 13. For example, data relating to arithmetic processing performed by the CPU 10 and the hardware accelerator 11 is stored in the RAM 13. Further, the CPU system 2 may include arbitrary circuits as the peripheral circuits 14.

The sensor I/F 15 is an interface circuit for connecting the sensor unit with the system bus. The actuator I/F 16 is an interface circuit for connecting the actuator unit with the system bus. The DDR I/F 17 is an interface circuit for connecting the DDR memory 8 with the system bus. The other I/F 18 is an interface circuit (s) for connecting other units included in the car-mounted ECU 1 such as a sub-microcomputer with the system bus.

Various data is stored in the DDR memory 8. Examples of the data include the above-described sensor data and control data. That is, as described above, the CPU 10 acquires sensor data from the sensor unit and transmits control data to the actuator unit through the DDR memory 8 by using the transfer function of the DMAC 12. For example, data relating to arithmetic processing performed by the CPU 10 and the hardware accelerator 11 is stored in the DDR memory 8.

Figure 2:
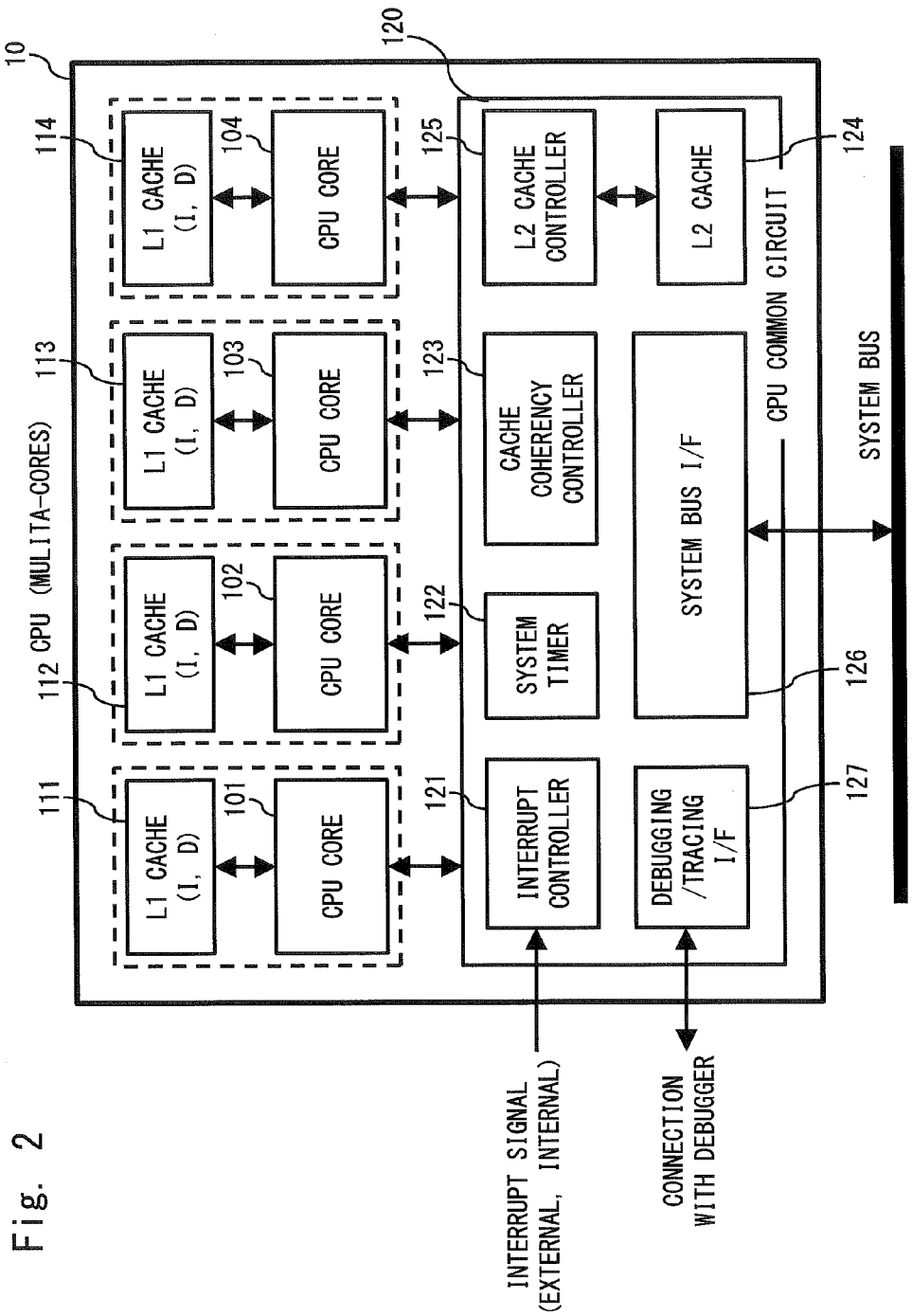
FIG. 2 is a block diagram showing a configuration of a CPU shown in FIG. 1.
Figure 10:
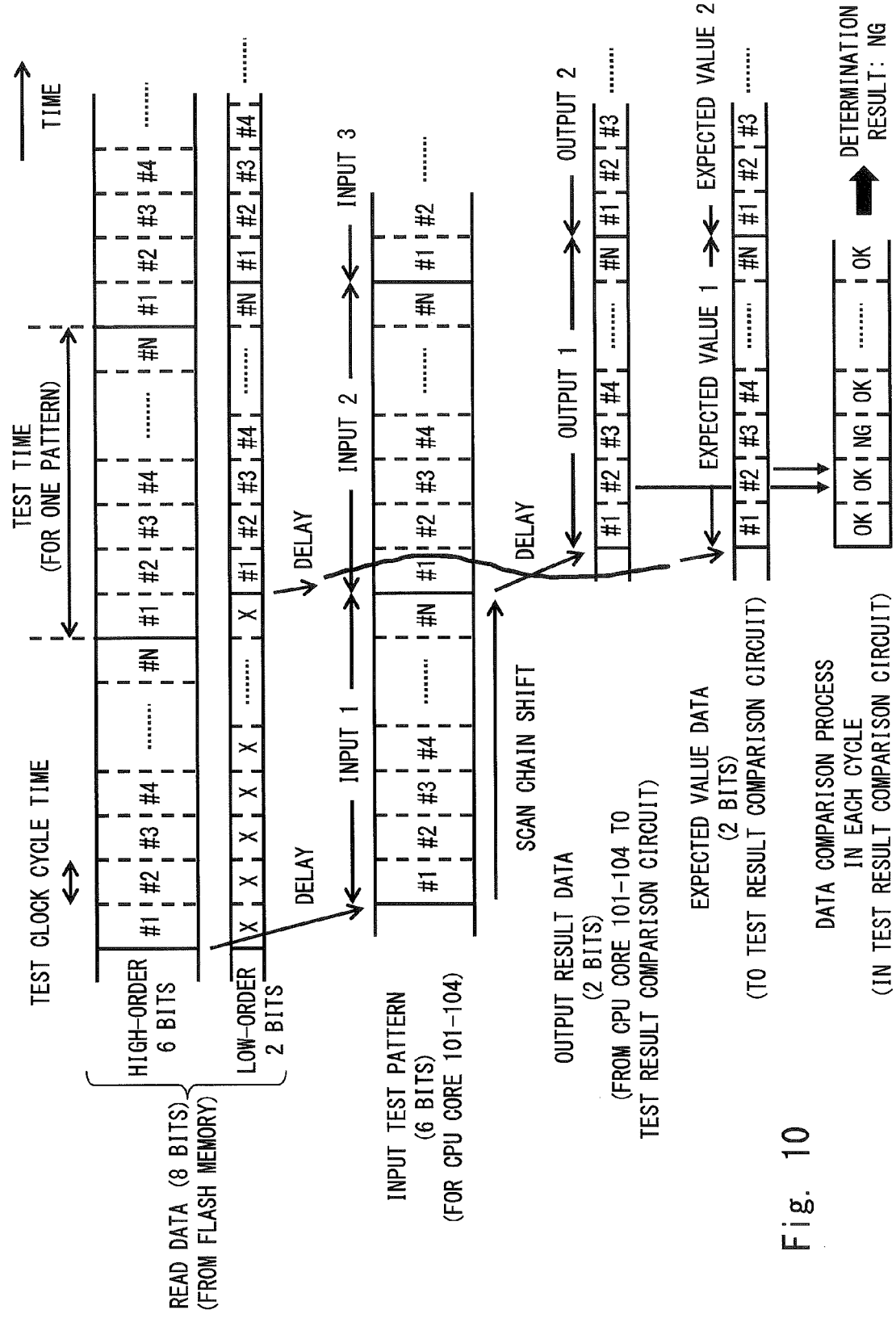
FIG. 10 is an explanatory diagram showing a state where a scan test is performed by the diagnostic test controller shown in FIG. 8 by using the test data shown in FIG. 9.

FIG. 2 is a block diagram showing a configuration of the CPU 10 shown in FIG. 10. The CPU 10 includes four CPU cores 101 to 104 and a CPU common circuit 120. The CPU 10 also includes L1 caches (I, D) 111 to 114 associated with the CPU cores 101 to 104, respectively. Note that I represents an instruction and D represents data. Further, the CPU common circuit 120 includes an interrupt controller 121, a system timer 122, a cache coherency controller 123, an L2 cache 124, an L2 cache controller 125, a system bus I/F 126, and a debugging/tracing I/F 127.

The CPU cores 101 to 104 are circuits that perform the above-described arithmetic processing in the CPU 10 in a distributed manner. As arithmetic processing, each of the CPU cores 101 to 104 executes an instruction I stored in the RAM 13 or the DDR memory 8 for data D stored in the RAM 13 or the DDR memory 8. When the instruction I and the data D are cached in the L2 cache 124, the CPU cores 101 to 104 use the cached instruction I and data D. Further, when the instruction I and the data D are cached in a respective one of the L1 caches 111 to 114, each of the CPU cores 101 to 104 uses the cached instruction I and data D. Note that an example of the data D is the above-described sensor data. Further, an example of the instruction I is an instruction included in the above-described program.

The L1 caches 111 to 114 are cache memories corresponding to the CPU cores 101 to 104, respectively, and data relating to arithmetic processing of the CPU cores 101 to 104, respectively, are temporarily stored in these cache memories. The CPU core 101 uses its corresponding L1 cache 111 and the CPU core 102 uses its corresponding L1 cache 112. Further, the CPU core 103 uses its corresponding L1 cache 113 and the CPU core 104 uses its corresponding L1 cache 114.

Interrupt causes that are input from outside or inside of the CPU system 2 are input to the interrupt controller 121. More specifically, a plurality of interrupt signals each of which is associated with a respective one of a plurality of interrupt causes are externally or internally input to the interrupt controller 121. When the interrupt controller 121 receives an interrupt signal, the interrupt controller 121 generates an interruption in an arbitrary CPU core.

The system timer 122 is a circuit that measures the time of the CPU system 2. The CPU cores 101 to 104 can acquire time information from the system timer 122. Further, the system timer 122 can generate a timer interruption for the CPU cores 101 to 104 every time a predetermined time has elapsed.

The cache coherency controller 123 is a circuit that establishes cache coherency among the L1 caches 111 to 114. For example, when data writing is performed at an address in the address area of the RAM 13 by one of the CPU cores 101 to 104, the cache coherency controller 123 invalidates data stored at that address of the L1 caches corresponding to the other CPU cores.

The L2 cache 124 is a cache memory in which data used for arithmetic processing performed by the CPU cores 101 to 104 is temporarily stored. The L2 cache 124 is a cache memory that is a lower-order cache memory than the L1 caches 111 to 114.

The L2 cache controller 125 controls the operation of the L2 cache 124, and establishes cache coherency between the L1 caches 111 to 114 corresponding to the CPU cores 101 to 104, respectively, and the L2 cache 124. The L2 cache controller 125 continuously monitors data read and write operations performed by the CPU cores 101 to 104 through the CPU common circuit 120 and thereby establishes the cache coherency of the L2 cache 124.

The system bus I/F 126 is an interface circuit for connecting the CPU 10 with the system bus. The debugging/tracing I/F 127 is an interface circuit for externally connecting a debugger with the CPU system 2.

Figure 3:
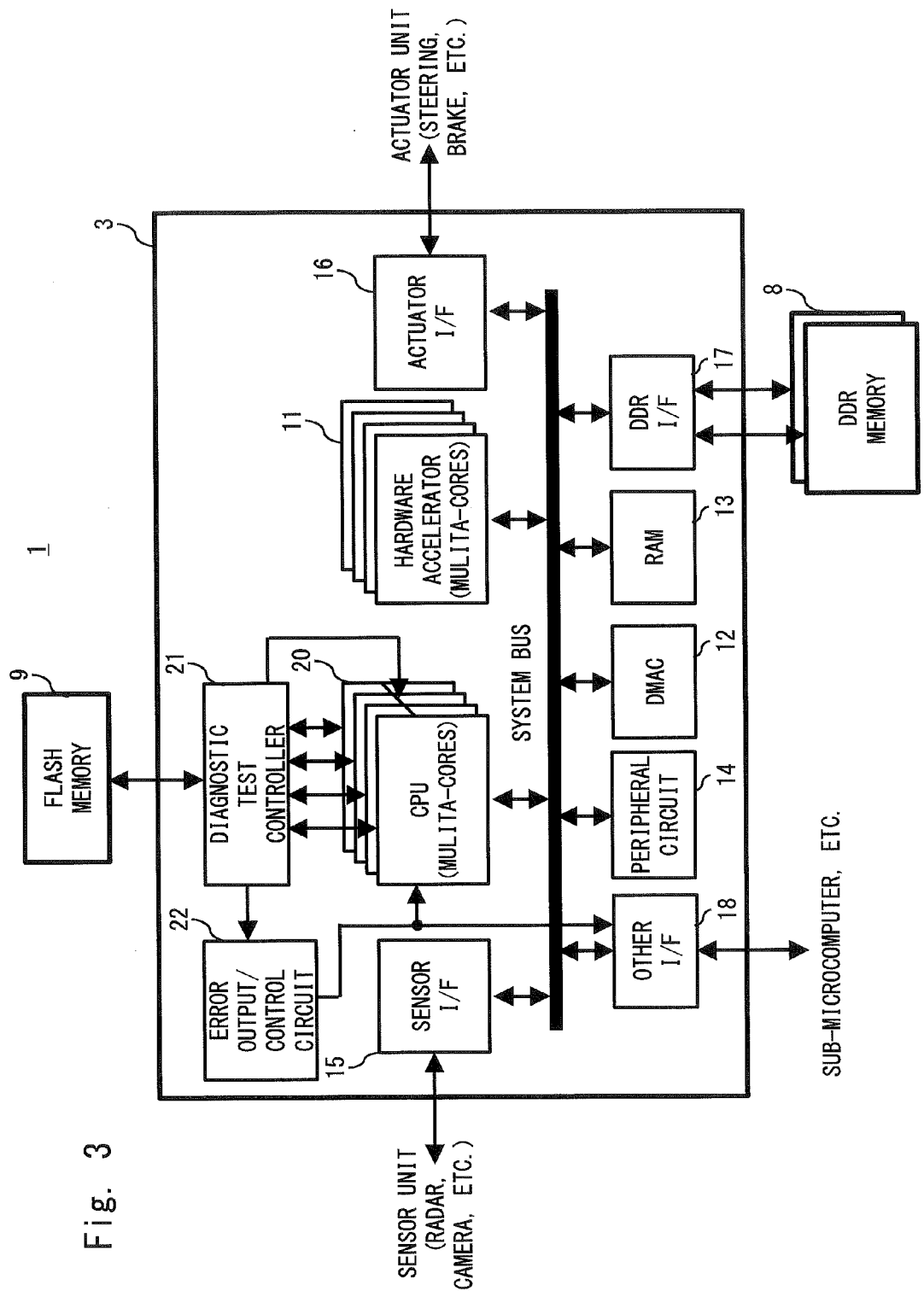
FIG. 3 is a block diagram showing a configuration of a CPU system according to a first embodiment.

FIG. 3 is a block diagram showing a configuration of a CPU system 3 according to the first embodiment. The configuration of the CPU system 3 is obtained by adding a diagnostic test controller 21 and an error output/control circuit 22 for a fault diagnosis of a CPU 20 in the CPU system 2 shown in FIG. 1 in order to achieve more robust functional safety. Note that the CPU 20 is obtained by adding circuits for a diagnosis in the CPU 10, and its details are explained later. Note that as an external memory of the CPU system 3, a FLASH memory 9 for supplying test data to the diagnostic test controller 21 is additionally connected to the CPU system 3.

The diagnostic test controller 21 corresponds to a diagnostic test circuit and performs a fault diagnosis of the CPU 20. The diagnostic test controller 21 acquires test data stored in the FLASH memory 9 and determines whether or not there is a failure in the CPU 20 based on the acquired test data. When the diagnostic test controller 21 determines that there is a failure in the CPU 20, the diagnostic test controller 21 outputs a notification signal indicating the failure in the CPU 20 to the error output/control circuit 22.

The error output/control circuit 22 performs control when a failure is detected in the CPU 20. More specifically, when the error output/control circuit 22 receives a notification signal indicating a failure in the CPU 20 from the diagnostic test controller 21, the error output/control circuit 22 performs a process for notifying a driver or a passenger (hereinafter simply called "driver") of the car of the failure in the CPU 20 or performs a process for degenerating the failed part in the CPU 20 for which the failure is reported. As the process for notifying the driver of the car of the failure in the CPU 20, the error output/control circuit 22 transmits an instruction signal instructing to notify the driver of the car of the failure to a sub-microcomputer through the other I/F 18. Upon receiving the instruction signal from the error output/control circuit 22, the sub-microcomputer notifies the driver of the failure by using an output device mounted on the car. For example, when the output device is an LED (Light Emitting Diode) for indicating a failure, the sub-microcomputer turns on the LED. When the output device is a display device, the sub-microcomputer displays an image for indicating the failure in the display device. When the output device is a speaker, the sub-microcomputer outputs a sound for indicating the failure from the speaker.

The FLASH memory 9 corresponds to a test data storage unit and test data is stored in the FLASH memory 9 as described above. The RAM 13, the DDR memory 8, and the FLASH memory 9 function as storage units in which various data (information) is stored.

Figure 4:
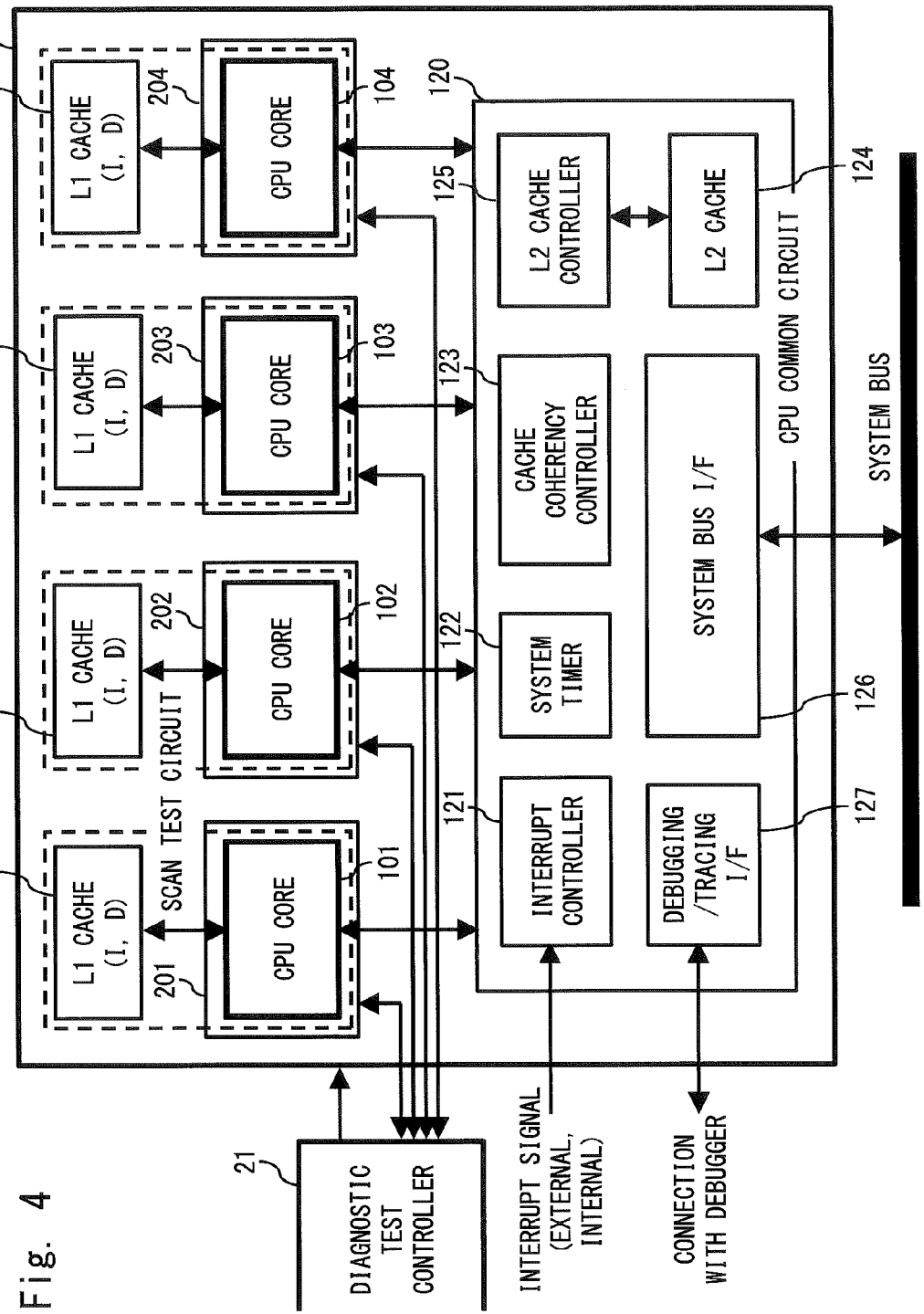
FIG. 4 is a block diagram showing a configuration of a CPU shown in FIG. 3.

FIG. 4 is a block diagram showing a configuration of the CPU 20 shown in FIG. 3. The CPU 20 shown in FIG. 4 is obtained by adding scan test circuits 201 to 204 in the CPU cores 101 to 104, respectively, in the CPU 10 shown in FIG. 2.

The diagnostic test controller 21 serves as a diagnostic test circuit for the above-described CPU 20 and performs a fault diagnosis of the CPU cores 101 to 104 included in the CPU 20. The diagnostic test controller 21 performs a fault diagnosis of the CPU cores 101 to 104 by performing, for example, a scan test. Specifically, the diagnostic test controller 21 controls scan tests performed by the scan test circuits 201 to 204 of the CPU cores 101 to 104, respectively. Further, the diagnostic test controller 21 outputs a flag signal indicating the start or the end of a scan test (diagnostic test) for a fault diagnosis to the CPU 20. This flag signal is input to an input port (not shown) provided in the CPU common circuit 120 or input to the interrupt controller 121 as one of the internal interrupt causes.

This flag signal is a signal by which a CPU core for which a diagnostic test is performed (hereinafter called "CPU core to be diagnostically-tested") can be specified. The flag signal may be transmitted/received through one of separate signal lines provided for the respective CPU cores so that the CPU core for which a scan test is performed (hereinafter called "CPU core to be scan-tested") can be specified. Alternatively, the flag signal may include therein data indicating the CPU core to be scan-tested so that the CPU core to be scan-tested can be specified. Further, when the flag signal is provided as a signal indicating an interrupt cause, different interrupt causes may be associated with their respective CPU cores 101 to 104 in advance so that the CPU core corresponding to the interrupt cause can be specified as the CPU core to be scan-tested.

By performing this fault diagnosis, the diagnostic test controller 21 detects a failure in the CPU cores 101 to 104. Then, for the CPU core in which the failure is detected among the CPU cores 101 to 104, a degenerating process is performed as an abnormal part by the above-described error output/control circuit 22.

Figure 5:
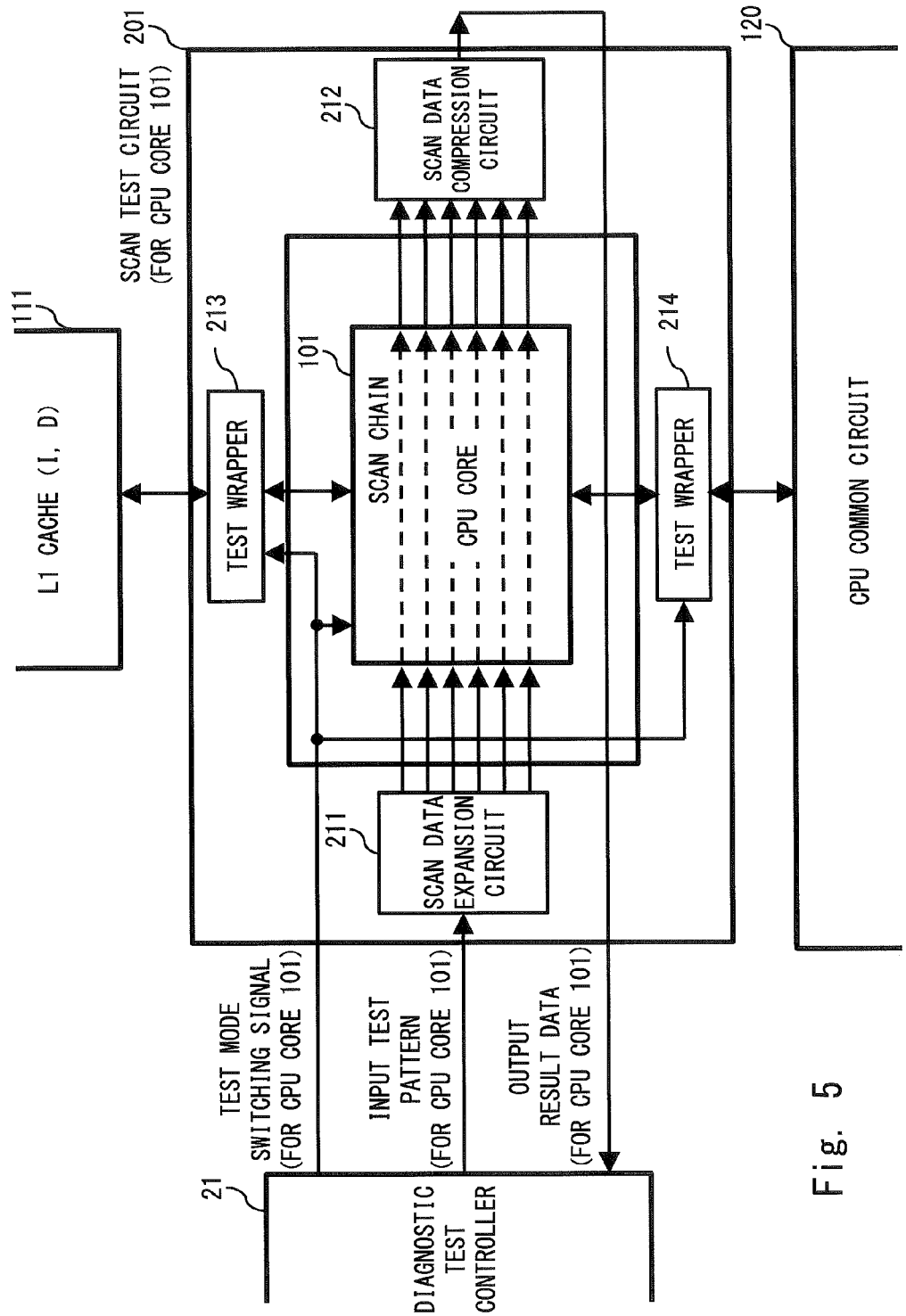
FIG. 5 is a block diagram showing a configuration of a CPU core shown in FIG. 4.

FIG. 5 is a block diagram showing a configuration of the CPU core 101 and the scan test circuit 201 shown in FIG. 4. The CPU core 101 includes a plurality of scan chains (e.g., 480 scan chains) that are enabled in a scan test mode. The CPU core 101 and the scan test circuit 201 change their mode from a normal mode to a scan test mode in response to the input of a test mode switching signal that is sent from the diagnostic test controller 21 and indicates the switching to the scan test mode.

Further, the scan test circuit 201 includes a scan data expansion circuit 211, a scan data compression circuit 212, a test wrapper 213, and a test wrapper 214.

The diagnostic test controller 21 supplies an input test pattern (s) included in the test data acquired from the FLASH memory 9 to the scan data expansion circuit 211. The input test pattern, which is input from the diagnostic test controller 21 to the scan data expansion circuit 211, is input in a form in which a plurality of bits (e.g., 6 bits) are arranged in parallel. The scan data expansion circuit 211 expands the input test pattern to the number of the scan chains included in the CPU core 101 (e.g., 480 bits) and supplies the expanded input test pattern to the scan chains included in the CPU core 101. Further, the scan data compression circuit 212 contracts the output of those scan chains from the number of the scan chains included in the CPU core 101 to a form in which a plurality of bits (e.g., 2 bits) are arranged in parallel. The scan data compression circuit 212 outputs the data having the plurality of contracted bits to the diagnostic test controller 21 as output result data. The above-described method in which the number of inputs/outputs of a scan test is reduced (compressed) from the number of scan chains included in the circuit to be test is called "compression scan method".

The test wrapper 213 is interposed between the CPU core 101 and the L1 cache 111. Further, the test wrapper 214 is interposed between the CPU core 101 and the CPU common circuit 120.

The test wrapper 213 is a circuit for shutting off normal input/output signals transmitted/received between the CPU core 101 and the L1 cache 111 in a scan test mode. The test wrapper 214 is a circuit for shutting off normal input/output signals transmitted/received between the CPU core 101 and the CPU common circuit 120 in a scan test mode.

In a normal mode, the test wrapper 213 allows normal input/output signals transmitted/received between the CPU core 101 and the L1 cache 111 to pass therethrough. In a normal mode, the test wrapper 214 allows normal input/output signals transmitted/received between the CPU core 101 and the CPU common circuit 120 to pass therethrough. The test wrappers 213 and 214 and the CPU core 101 change their mode from a scan test mode to a normal mode in response to the input of a test mode switching signal that is sent from the diagnostic test controller 21 and indicates the switching to the normal mode. In the normal mode, the scan chains included in the CPU core 101 are disabled.

Note that the configuration of each of the scan test circuits 202 to 204, which are disposed so as to correspond to the CPU cores 102 to 104, is equivalent to that shown in FIG. 5, and therefore its explanations are omitted.

Figure 6:
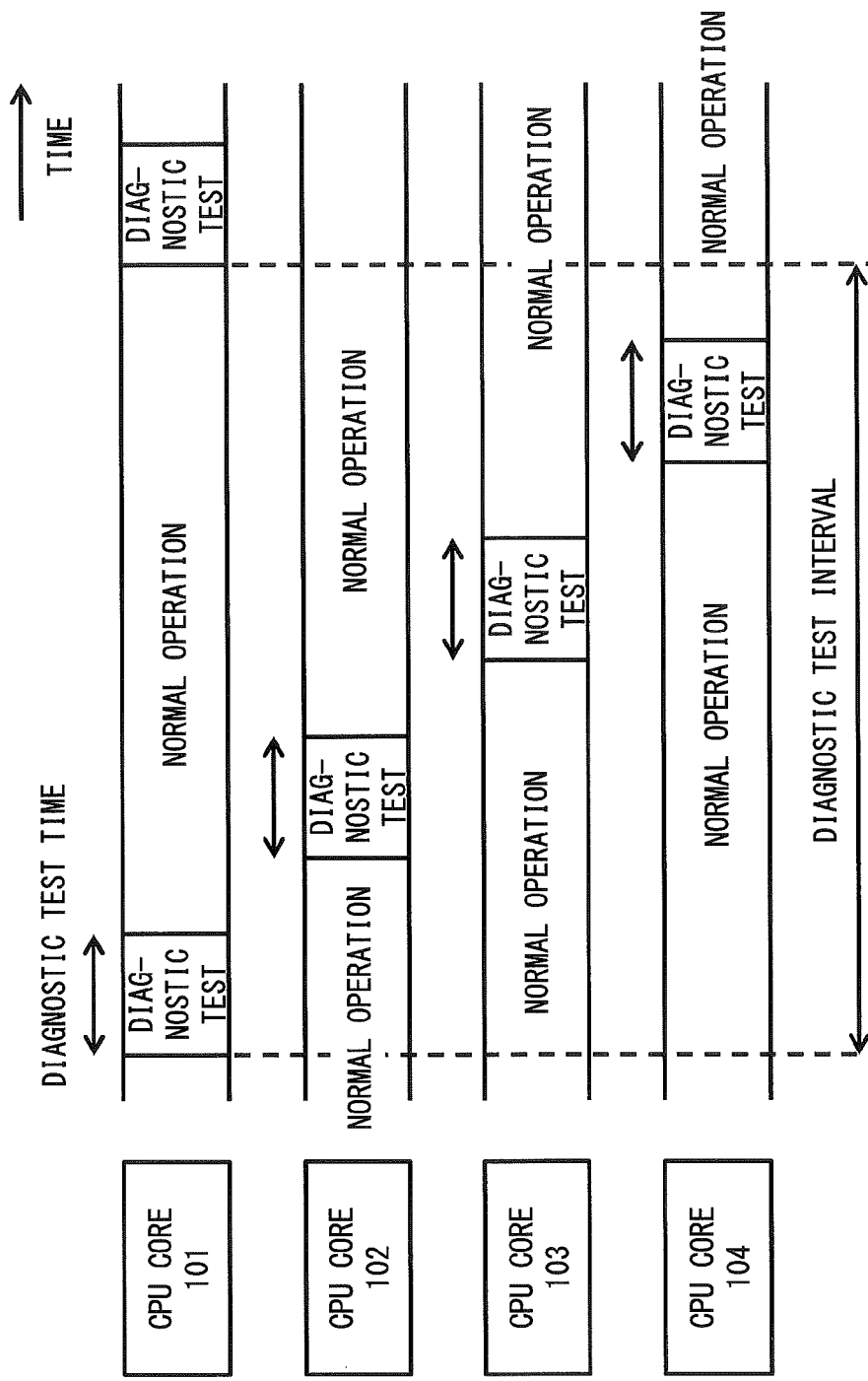
FIG. 6 is an explanatory diagram showing an execution state of a diagnostic test for each CPU core of a CPU in the first embodiment.

FIG. 6 shows an execution state of a diagnostic test for each of the CPU cores 101 to 104 of the CPU 20 according to the first embodiment. The CPU system 3 for an ADAS of a car needs to have high calculation performance so that a meticulous recognition/determination process, which is originally performed by a human brain, can be performed in a short time. Therefore, the CPU system 3 includes the multi-core architecture CPU 20 including the four high-performance CPU cores 101 to 104. In a normal operation, apart of a task for a recognition/determination process (a program for a bunch of processes) is assigned to a respective one of the CPU cores 101 to 104. Therefore, the recognition/determination process is performed by using the total performance of the four CPU cores 101 to 104. An example of this recognition/determination process is the above-described process for controlling the actuator unit according to a detection result of the sensor unit. The time that a person takes to recognize the latest situation and determine an action that person should take is in the order of 0.1 seconds. In view of functional safety, it is important that even if a failure occurs in the CPU cores 101 to 104, which constitute the core of the CPU system 3, the system should be brought into a safe state (which is the action to be taken) in a time comparable to the aforementioned time. For robust functional safety, it is necessary to find a failure in the CPU 20 at a high fault detection rate. The transit to the safe state has to be carried out within a FTTI (Fault Tolerant Time Interval) after the failure occurs.

Therefore, the diagnostic test controller 21 periodically performs a diagnostic test for each of the CPU cores 101 to 104 while selecting the CPU cores 101 to 104 one by one at a diagnostic test interval equal to or shorter than the FTTI (e.g., 0.1 s). In this diagnostic test, the mode of the selected one of the CPU cores is changed to a scan test mode and a high-speed hardware scan test is performed. The CPU core to be diagnostically-tested cannot be used for the normal operation for the period corresponding to this diagnostic test time (e.g., 0.01 s or shorter). However, the remaining three CPU cores continue to perform the normal operation even for this period. As a result, although the total performance is temporarily lowered to ¾ of the original performance, the total performance is restored to the original level upon completion of the diagnostic test. On the average, the decrease in the performance due to the diagnostic test is less than 10%. Note that one of the examples of the method for performing a fault diagnosis of the CPU common circuit 120 is to make its circuit redundant. Note that a comparison circuit for checking the match between (a plurality of) output signals of the redundant circuits may be provided. Then, when at least one of the output signals does not match the counterpart output signal, a notification signal indicating a failure in the CPU common circuit 120 may be output to the error output/control circuit 22.

That is, as shown in FIG. 6, the diagnostic test controller 21 performs a scan test for each of the CPU cores 101 to 104 in a predetermined order on a periodic basis so that execution time periods (execution periods) of the scan tests do not overlap each other. The diagnostic test controller 21 performs scan tests for all of the CPU cores 101 to 104 at same diagnostic test intervals on a periodic basis so that the execution time periods (execution periods) of the scan tests are less likely to overlap each other. The diagnostic test interval is defined to an arbitrary value equal to or less than the FTTI (e.g., 0.1 s). The diagnostic test times for the CPU cores 101 to 104 do not necessarily have to be shifted from one another at regular intervals (diagnostic test period ×¼), provided that they do not overlap each other. However, the diagnostic test times for the CPU cores 101 to 104 are preferably shifted from one another at regular intervals so that the bias in the performances due to the timings of the execution time periods (execution periods) of the diagnostic tests (i.e., the bias in the performances that is caused because the diagnostic test execution periods are too close to each other or too far away from each other) can be reduced.

Figure 7:
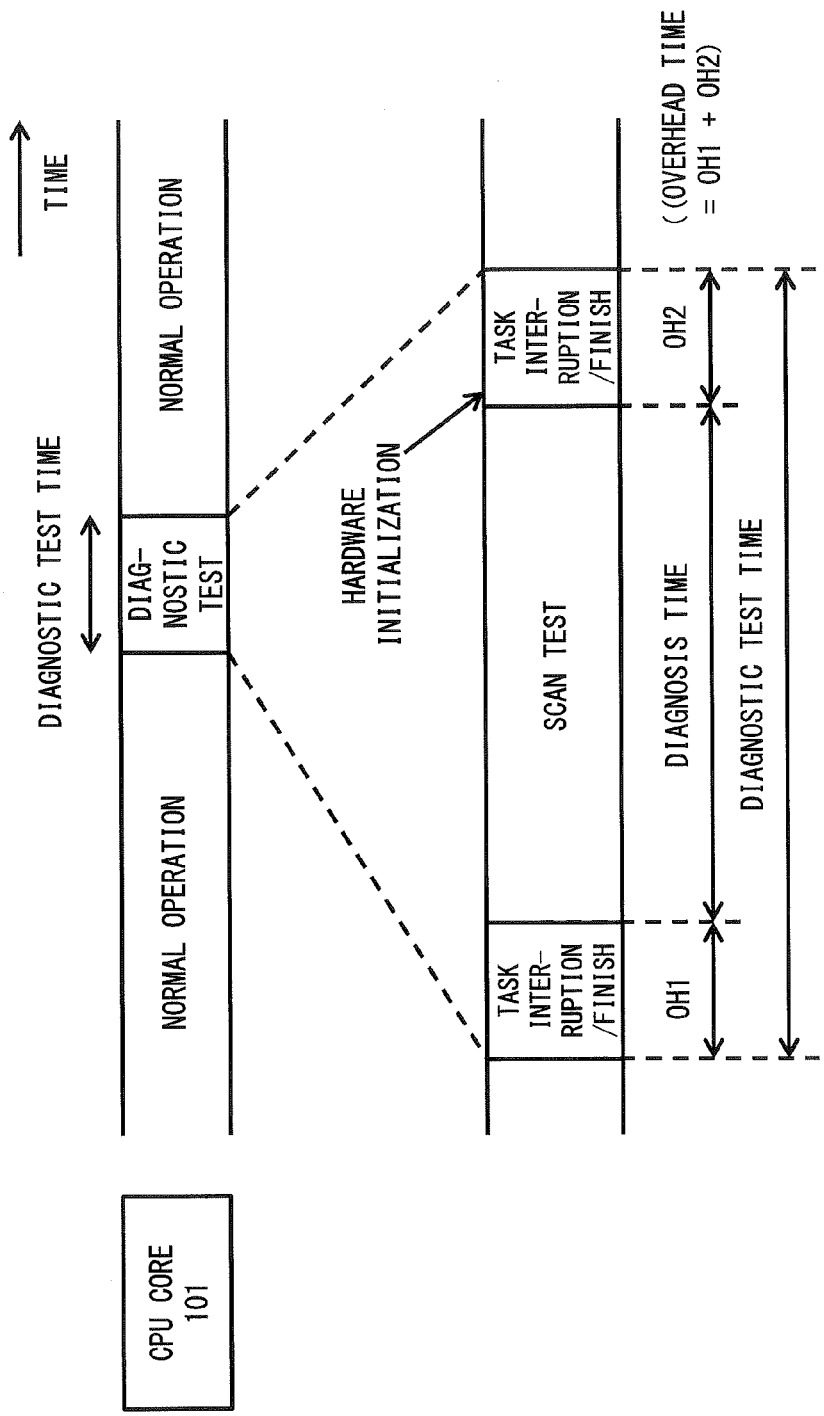
FIG. 7 is an explanatory diagram showing details of the execution of the diagnostic test for the CPU core shown in FIG. 6.

FIG. 7 shows details of the execution of the diagnostic test for the CPU core 101 shown in FIG. 6. For the diagnostic test, in reality, some software processes are performed before and after the execution of the hardware scan test. When the mode is changed from a normal mode to a scan test mode, a process for interrupting or finishing the task that is currently executed by the CPU core 101 at that moment (hereinafter called "currently-executed task") is performed. In response to the input of a flag signal indicating the start of the diagnostic test sent from the diagnostic test controller 21 to the CPU 20, the CPU core 101 performs the process for interrupting or finishing the currently-executed task. That is, it is assumed that this flag signal designates the CPU core 101 as the CPU core to be diagnostically-tested. Further, in response to the input of this flag signal sent from the diagnostic test controller 21 to the CPU 20, the CPU common circuit 120 prevents any access from the CPU common circuit 120 to the diagnostically-tested CPU core 101. After that, the CPU core 101 and the scan test circuit 201 enter a hardware scan test mode in response to the input of a test mode switching signal that is sent from the diagnostic test controller 21 and indicates the switching to the scan test mode.

A task is a program including a bunch of processes, and its main process is a loop process in which predetermined arithmetic processing is repeatedly performed a number of times. Therefore, when the CPU core 101 has already performed certain arithmetic processing almost to the end of that processing, the CPU core 101 completes that certain arithmetic processing, continues the process until that loop is completed, stores the result data of the certain arithmetic processing into an external memory (e.g., the DDR memory 8), and then finishes the task. When the CPU core 101 has already performed certain arithmetic processing to the middle of that processing, the CPU core 101 writes its internal work data at that moment into a memory (e.g., the RAM 13) and then interrupts the task. When the interrupted task is restored, the internal work data temporarily-stored in the memory is read and then the process is resumed from the interrupted point. When the CPU core 101 has performed certain arithmetic processing only to the beginning of that processing, the CPU core 101 may abandon that certain processing, discard its internal work data, and then terminate the task. After the terminating the task, when the same task is input (or started) again, the execution of the process is started from the start of the loop.

On the other hand, when the mode is changed from the scan test mode to the normal mode, the CPU core 101 resumes (restores) the interrupted task or newly inputs (starts) the same task as the terminated task. This process is performed after the CPU core 101 goes out of the scan test mode and is elapsed-time threshold. The CPU core 101 goes out of the scan test mode in response to the input of a test mode switching signal that is sent from the diagnostic test controller 21 and indicates the switching to the normal mode. That is, the CPU core 101 disables the scan chain. After supplying the test mode switching signal to the CPU core 101, the diagnostic test controller 21 outputs a reset signal to the diagnostically-tested CPU core 101 and thereby initializes the CPU core 101 in a hardware manner (hereinafter called "hardware initialization"). After that, the CPU common circuit 120 cancels the prevention of access to the diagnostically-tested CPU core 101 in response to the input of a flag signal indicating the end of the diagnostic test sent from the diagnostic test controller 21 to the CPU 20. It is assumed that this flag signal designates the CPU core 101 as the CPU core to be diagnostically-tested.

After that, the CPU core 101 is initialized in a software manner (hereinafter called "software initialization") so that the CPU core 101 can perform a normal operation. Then, a process for restoring or inputting (or starting) the task is performed. Although it is short, the time taken for these software processes (the task interruption or termination process time OH1 and the task restoration or input (or start) process time OH2) becomes an overhead time. The sum of this overhead time and the actual diagnosis time taken for the hardware scan test becomes the diagnostic test time.

Note that it is possible to determine which of the beginning, the middle, and the end of the loop the above-described task has been processed to at that moment by, for example, recording the progress state of the process in a memory (e.g., the RAM 13). Note that it is assumed that the ranges of the beginning, the middle, and the end of the certain processing that is performed through one loop are defined in advance. The process of the task includes a process for storing progress state record data indicating that the beginning of the loop has been already finished into a memory and a process for storing progress state record data indicating that the middle of the loop has been already finished into the memory.

In this way, when the CPU core 101 performs a task, the CPU core 101 stores progress state record data into a memory according to the progress state of the process in the loop. If progress state recode data indicating that the begging of the process has been already finished is stored in the memory when the CPU core 101 changes its mode to a scan test mode, the CPU core 101 determines that the CPU core 101 is executing the middle of the loop. If the progress state recode data indicating that the middle of the process has been already finished is stored in the memory, the CPU core 101 determines that the CPU core 101 is executing the end of the loop. When no progress state record data is stored in the memory, the CPU core 101 determines that the CPU core 101 is executing the beginning of the loop. Note that the CPU 10 may delete the progress state record data when the loop is finished, so that the CPU core 101 can determine that the CPU core 101 is executing the beginning of the loop when it is performing the second or subsequent loop. Further, when the CPU core 101 determines that the CPU core 101 is executing the beginning or the end of the loop, the CPU core 101 may terminate or finish the task. Further, when the CPU core 101 determines that the CPU core 101 is executing the middle of the loop, the CPU core 101 may temporarily store the work data into the memory so that the interrupted process can be resumed. Note that an example of the work data is register data of the CPU core 101.

According to this feature, the task interruption or termination process time OH1 and the task restoration or input process time OH2 can be shortened. This is because the work data is discarded and the task is immediately terminated only when the beginning of the loop is being performed and the time required for redoing the operation is short. Further, the work data is stored and the process is resumed by using the stored data only when the middle of the loop is being performed and the time required for redoing the operation is long. Further, the process of the task is continued until the end of loop only when the end of the loop is being performed and the time required for completing the loop is short. By completing the loop, there is no need to restore any work data when the process is resumed.

Note that examples of the above-described loop process include the above-described process for controlling the actuator unit based on the sensor data. This loop process is repeatedly performed at regular intervals by having the CPU core 101 perform a task for carrying out that process.

Note that details of the execution of diagnostic tests of the CPU cores 102 to 104 are similar to those shown in FIG. 7, and therefore their explanations are omitted.

Figure 8:
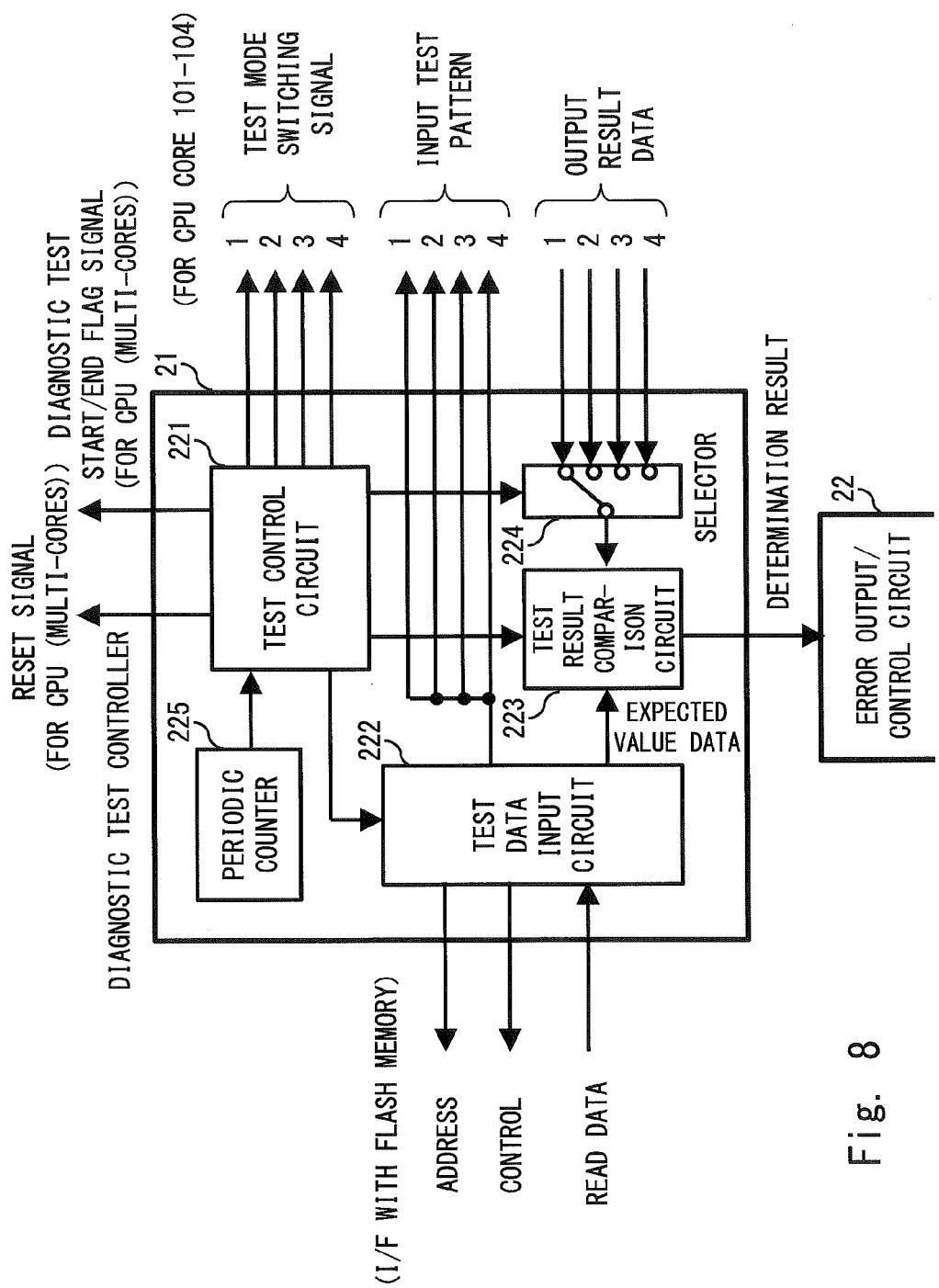
FIG. 8 is a block diagram showing a configuration of a diagnostic test controller shown in FIG. 3.

FIG. 8 is a block diagram showing a configuration of the diagnostic test controller 21 shown in FIG. 3. The diagnostic test controller 21 includes a test control circuit 221, a test data input circuit 222, a test result comparison circuit 223, a selector 224, and a periodic counter 225.

The test control circuit 221 selects one of the CPU cores 101 to 104 one by one and determines the start timing of the diagnostic test based on a periodic trigger signal supplied from the periodic counter 225. That is, the test control circuit 221 determines a timing that occurs every time the trigger signal is supplied a predetermined times as the timing at which the diagnostic test of a CPU core starts. Further, the test control circuit 221 switches the CPU core to be diagnostically-tested in a predetermined order every time the timing at which the diagnostic test of a CPU core starts occurs. Therefore, in the example shown in FIG. 6, the time period in which the trigger signal is counted the predetermined times corresponds to a time period from the start of a diagnostic test for a given CPU core to the start of a diagnostic test for the next CPU core. Further, the time period in which the counting of the trigger signal of the predetermined times is repeated four times and hence the diagnostic tests for all the CPU cores have been completed, i.e., one round of diagnostic tests have been completed corresponds to the diagnostic test interval.

The test control circuit 221 outputs a flag signal indicating the start of a diagnostic test to the CPU 20 at the timing at which the diagnostic test starts, and thereby notifies the CPU 20 which of the CPU cores a diagnostic test starts for from now. The test control circuit 221 outputs a test mode switching signal for the CPU core to be diagnostically-tested and its scan test circuit and thereby changes the mode of that CPU core and the scan test circuit to a scan test mode after the time that is taken to complete the software process for interrupting or finishing the task has elapsed after test control circuit 221 outputs the flag signal.

Note that as the time from when the flag signal is output to when the test mode switching signal is output, a time that is sufficiently longer than the time of the task interruption or finish process performed by the CPU cores 101 to 104 is defined in advance. Then, after changing the mode of the CPU core to be diagnostically-tested and its scan test circuit to the scan test mode, the test control circuit 221 outputs an instruction signal indicating the start of the scan test to the test data input circuit 222 and the test result comparison circuit 223.

In response to the input of the instruction signal from the test control circuit 221, the test data input circuit 222 starts to read test data from the external FLASH memory 9 and successively outputs an input test pattern to the CPU core in the form in which a plurality of bits of the input test pattern (6 bits) are arranged in parallel. This input test pattern is input to the scan test circuits 201 to 204. However, the input test pattern is processed only by the scan test circuit that is in the scan test mode and input only to the CPU core that is in the scan test mode.

As a result, the execution of the scan test for the CPU core to be diagnostically-tested is started. After a predetermined time that is determined according to the length of the scan chain has elapsed after the input test pattern is output, output result data, which is the process result of that input test pattern, is successively returned to the diagnostic test controller 21. Here, the output result data from the diagnostically-tested CPU core is selected by the selector 224 and input to the test result comparison circuit 223. The selector 224 is controlled by the test control circuit 221 so that the selector 224 selects the output result data from the diagnostically-tested CPU core and outputs the selected output result data to the test result comparison circuit 223.

The test result comparison circuit 223 has also already started the operation of the diagnostic test in response to the input of the instruction signal from the test control circuit 221. The test result comparison circuit 223 successively compares the output result data with its expected value data (2 bits). This expected value data is included in the test data read from the FLASH memory 9. After the above-described predetermined time that is determined according to the length of the scan chain has elapsed after the input test pattern is output to the CPU core, the test data input circuit 222 supplies expected value data corresponding to that input test pattern to the test result comparison circuit 223. As a result, the expected value data is input to the test result comparison circuit 223 at the same timing as the timing at which the output result data is input to the test result comparison circuit 223, so that the test result comparison circuit 223 can compare these data with each other. This mechanism is described later with reference to FIGS. 9 and 10. The test result comparison circuit 223 performs this comparison in each cycle of a test clock in the scan test. Further, the test result comparison circuit 223 determines that the result is "OK" when the data match each other and determines that the result is "NG" when the data do not match each other. After a series of test patterns are all input to the CPU core and their output result data are all output, the final determination result (OK or NG) is determined and the determined final result is sent to the error output/control circuit 22.

That is, when the test result comparison circuit 223 determines that the final determination result is OK, the test result comparison circuit 223 outputs a notification signal indicating that the diagnostically-tested CPU core is normal to the error output/control circuit 22. On the other hand, when the test result comparison circuit 223 determines that the final determination result is NG, the test result comparison circuit 223 outputs a notification signal indicating that there is a failure in the diagnostically-tested CPU core to the error output/control circuit 22.

Figure 9:
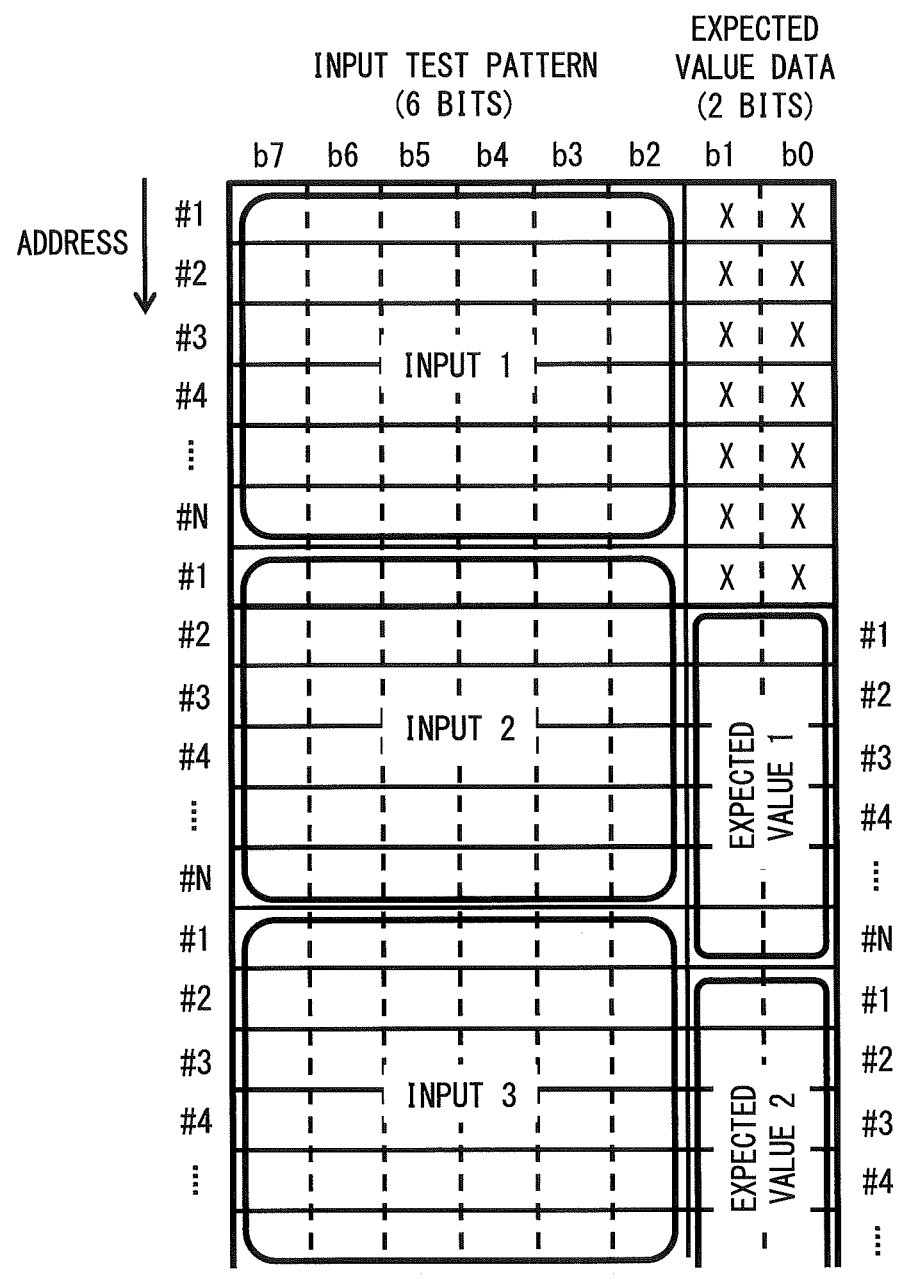

FIG. 9 shows the content of test data stored in the FLASH memory 9 shown in FIG. 3 according to the first embodiment. The vertical axis indicates that the address of the FLASH memory 9 increases in the downward direction, and the horizontal axis indicates the arrangement of one byte (8 bits), which is the data unit of the FLASH memory 9. This data unit of one byte becomes the unit of data that is simultaneously read in one read operation by the test data input circuit 222. The one byte of test data, which is simultaneously read in one read operation, consists of high-order 6 bits used as an input test pattern and low-order 2 bits used as expected value data. In each input test pattern, N data (6 bits), which corresponds to the length of the scan chain of the CPU core, constitute one set (N is a positive integer determined according to the circuit of the CPU core). Further, a plurality of such sets constitute the whole input test pattern. Similarly, in the expected value data of an output result that is supposed to be output from the CPU core according to the input test pattern, N data (2 bits) constitute one set, and a plurality of such sets constitute the whole expected value data. Note that the input test pattern and the expected value data are stored in the FLASH memory 9 with such a correspondence relation that they are shifted from each other by an amount corresponding to predetermined addresses (i.e., predetermined number of cycles) (the expected value data is shifted backward from the input test pattern).

FIG. 10 shows a state where a scan test is performed by the diagnostic test controller 21 shown in FIG. 8 by using the test data shown in FIG. 9. The input test pattern read from the FLASH memory 9 by the test data input circuit 222 (high-order 6 bits of the read data) is output to the CPU core after a certain processing delay time has elapsed. Every time the test data input circuit 222 supplies one data piece of the input test pattern to the CPU core, the test data input circuit 222 also supplies a test clock to the CPU core. By repeating these operations N times, one set of the input test pattern is input to the scan chain of the CPU core. Then, the test data input circuit 222 makes the CPU core operate by using the input test pattern input to that scan chain. After that, the test data input circuit 222 shifts the scan chain of the CPU core by supplying the test clock to the CPU core a plurality of times that is determined according to the length of the scan chain of the CPU core. In this process, the test data input circuit 222 also supplies the next one set of the input test pattern to the CPU core. Then, as the time corresponding to the number of cycles corresponding to the plurality of test clocks has elapsed, one set of output result data is output from the CPU core to the test result comparison circuit 223.

Meanwhile, expected value data read from the FLASH memory 9 by the test data input circuit 222 (low-order 2 bits of the read data) is also supplied to the test result comparison circuit 223 after a certain processing delay time has elapsed. Then, the test result comparison circuit 223 compares the output result data from the CPU core with its corresponding expected value data in each cycle of the test clock in an on-the-fly manner. That is, the test result comparison circuit 223 successively compares the output result data (2 bits) with the expected value data in each cycle of the test clock. To carry out this process, as shown in FIG. 9, the input test pattern and the expected value data are stored in the FLASH memory 9 with such a correspondence relation that they are shifted from each other by an amount corresponding to predetermined number of cycles (the expected value data is shifted backward from the input test pattern).

As described above, according to the example according to the first embodiment, as shown in FIG. 10, the input test patterns are input in such a manner that when the second input test pattern in a given set is input to the CPU core, a set of output result data corresponding to a set of the input test pattern that precedes the second input test pattern by one step starts to be input to the test result comparison circuit 223. In other words, when an input test pattern is input to the CPU core, a set of output result data corresponding to a set of an input test pattern that has started to be input N+1 steps before the aforementioned input test pattern starts to be input to the test result comparison circuit 223. Therefore, as shown in FIG. 9, the input test pattern and its expected value data are stored in the FLASH memory 9 in such a manner that the start address of a given set of an input test pattern and the start address of the expected value data of the output result data of that set of the input test pattern are shifted from each other by an amount corresponding to N+1 read operations. According to this feature, when the test data input circuit 222 reads one byte test data and supplies the input test pattern included in that test data to the CPU core, the test result comparison circuit 223 can obtain the expected value data corresponding to the output result data input to the test result comparison circuit 223 as the expected value data included in that test data.

As the final determination result (OK or NG), the test result comparison circuit 223 determines that the result is OK when the comparison results match each other in every cycle and determines that the result is NG when the comparison results do not match each other in at least one cycle.

According to the first embodiment explained above, a scan test is performed for each of a plurality of CPU cores in a predetermined order on a periodic basis so that the execution time periods (execution periods) of the scan tests do not overlap each other. According to this feature, since the scan tests are performed so that the execution time periods (execution periods) of the scan tests do not overlap each other, the decrease in the operation performance can be reduced. Further, since scan tests are performed on a periodic basis, a failure in a CPU core can be immediately detected. Therefore, it is possible to achieve high diagnosis coverage, which is indispensable for the functional safety, while minimizing the influence to the normal operation (i.e., the deterioration in the operation performance). Further, if a failure occurs in a CPU core, the failure can be immediately detected and the system can be brought into a safe state.

Further, in the first embodiment, the FLASH memory 9 stores a plurality of input test patterns and a plurality of expected value data, which serve as the expect values of a plurality of output result data, so that a given input test pattern and expected value data that is generated based on an input test pattern preceding the aforementioned given input test pattern by a predetermined number of cycles are simultaneously read from the FLASH memory 9. This predetermined number of cycles is the number of cycles corresponds to the period from when the diagnostic test controller 21 supplies an input test pattern to a CPU core to when output result data generated based on that input test pattern is output from the CPU core to the diagnostic test controller 21. Further, the diagnostic test controller 21 diagnoses a CPU core currently in a diagnosed state (hereinafter called "currently-diagnosed CPU core") by reading expected value data from the FLASH memory 9 and successively comparing the read expected value data with output result data corresponding to the aforementioned input test pattern in an on-the-fly manner. According to this feature, since the scan test can be performed in the on-the-fly manner, the diagnosis time of the CPU core can be shortened.

Second Embodiment

Next, a configuration and an operation according to a second embodiment are explained with reference to the drawings.

The configuration and the operation of the second embodiment are fundamentally similar to those of the first embodiment. That is, the components of the second embodiment are fundamentally similar to those in the CPU system 3 shown in FIG. 3, including the CPU 20 shown in FIG. 4, and the CPU core 101 (each of the CPU cores 102 to 104 is similar to the CPU core 101) and the scan test circuit 201 (each of the scan test circuits 202 to 204 is similar to the scan test circuit 201) shown in FIG. 5. Further, the execution of diagnostic tests for the CPU cores 101 to 104 according to the second embodiment is also similar to that of the diagnostic test for a CPU core shown in FIGS. 6 and 7.

However, an input test pattern for a scan test input to the CPU cores 101 to 104 has 8 bits (compared to 6 bits in the first embodiment) in the second embodiment. Therefore, the configuration of the scan data expansion circuit 211 included in each of the scan test circuits 201 to 204, which are associated with the CPU cores 101 to 104, respectively, is modified to cope with this feature in the second embodiment.

In this regard, the content of test data stored in the FLASH memory 9 (shown in FIG. 9 in the first embodiment) and the execution of a scan test performed by the diagnostic test controller 23 (shown in FIG. 10 in the first embodiment) in the second embodiment are different from those in the first embodiment.

Figure 11:
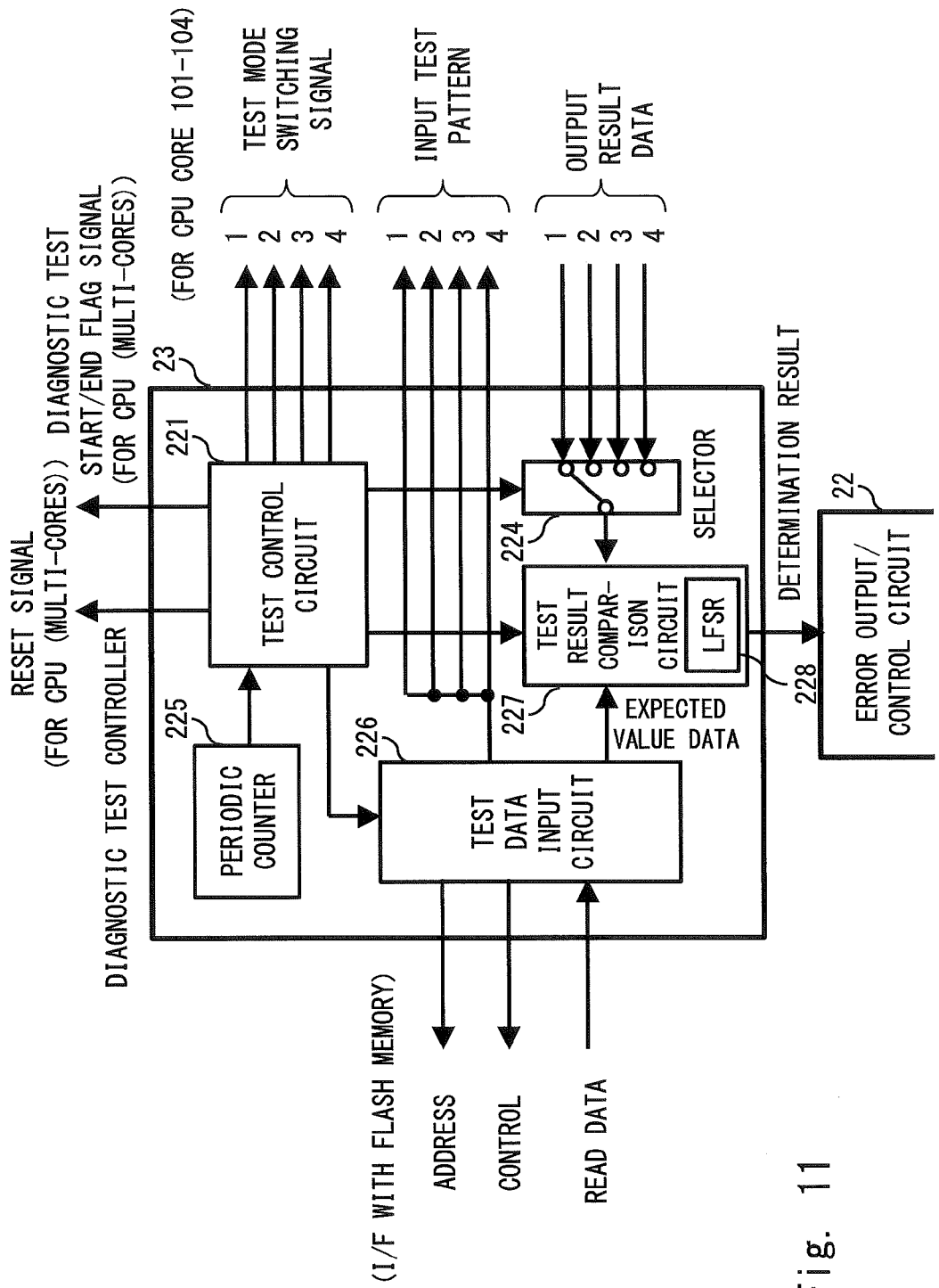
FIG. 11 is a block diagram showing a configuration of a diagnostic test controller according to a second embodiment.

FIG. 11 is a block diagram showing a configuration of a diagnostic test controller 23 according to the second embodiment. The configuration of the diagnostic test controller 23 shown in FIG. 11 is fundamentally similar to that of the diagnostic test controller 21 according to the first embodiment shown in FIG. 8. However, a part of the operation of the diagnostic test controller 23 is different from that in the first embodiment. More specifically, the operations of a test data input circuit 226 and a test result comparison circuit 227 according to the second embodiment shown in FIG. 11 are different from those of the test data input circuit 222 and the test result comparison circuit 223 according to the first embodiment shown in FIG. 8.

As described above, the test data input circuit 226 supplies 8-bit data to the CPU cores 101 to 104 as an input test pattern. Further, in this regard, the test data input circuit 226 supplies 8-bit expected value data three times to the test result comparison circuit 227. Its details are described later together with the content of data stored in the FLASH memory 9 shown in FIG. 12.

The test result comparison circuit 227 does not compare output result data with expected value data in each cycle of a test clock, but does perform cumulative calculation for output result data. The test result comparison circuit 227 includes an LFSR (Liner Feedback Shift Register) 228 as a circuit for performing the cumulative calculation. The test result comparison circuit 227 collectively determines whether or not there is a failure in the CPU core in the end of the process based on a cumulative calculation result of output result data.

Figure 12:
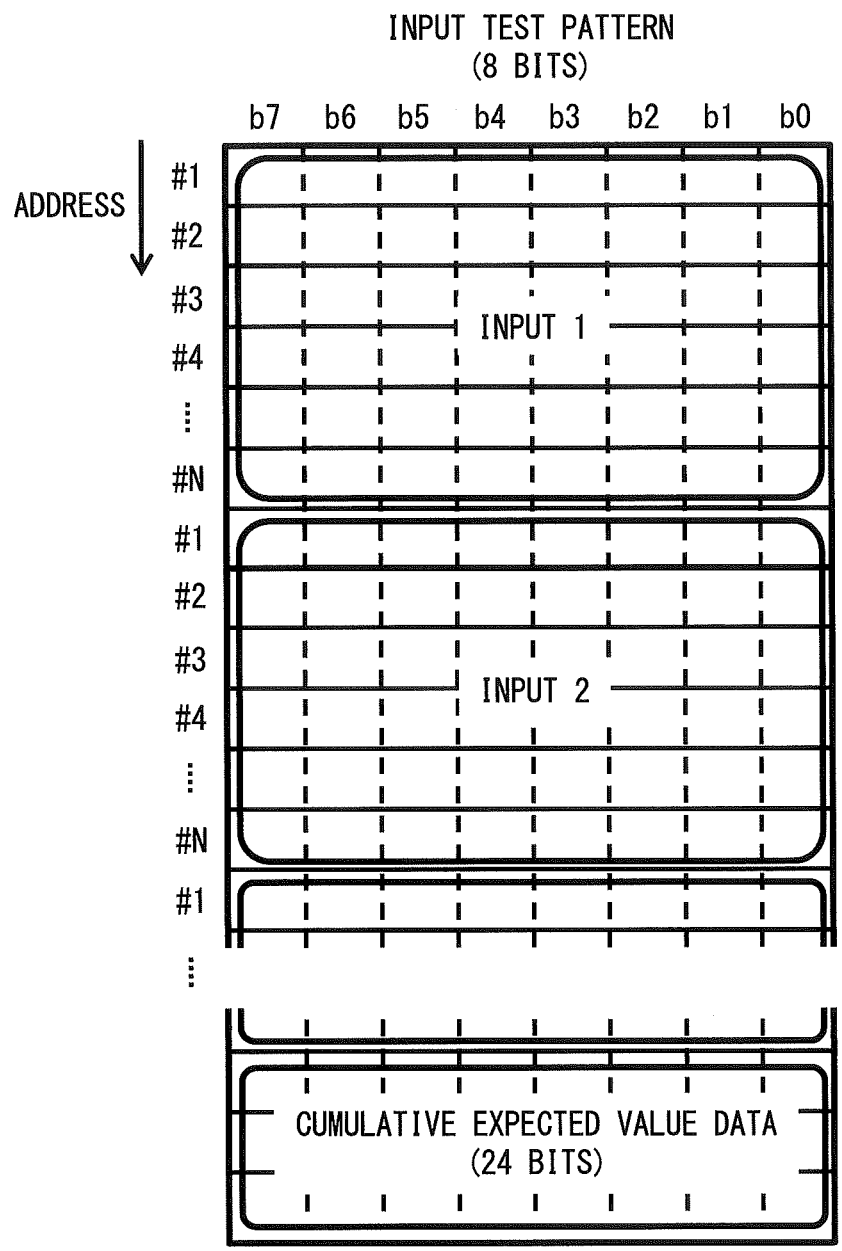
FIG. 12 is an explanatory diagram showing the content of test data to be stored in a FLASH memory in the second embodiment.

FIG. 12 shows the content of test data stored in the FLASH memory 9 according to the second embodiment. N input test patterns (8 bits) constitutes one set and a plurality of such sets constitute the whole input test pattern. In the FLASH memory 9, the series of input test patterns are first stored and then one cumulative expected value data (e.g., 24 bits) is stored. This cumulative expected value data is expected value data of one cumulative output that is obtained by accumulating a plurality of output result data that are supposed to be output from the CPU core according to the series of the input test patterns in the respective cycles of the test clock. In reality, this cumulative process is a process for generating a signature by using the LFSR.

Figure 13:
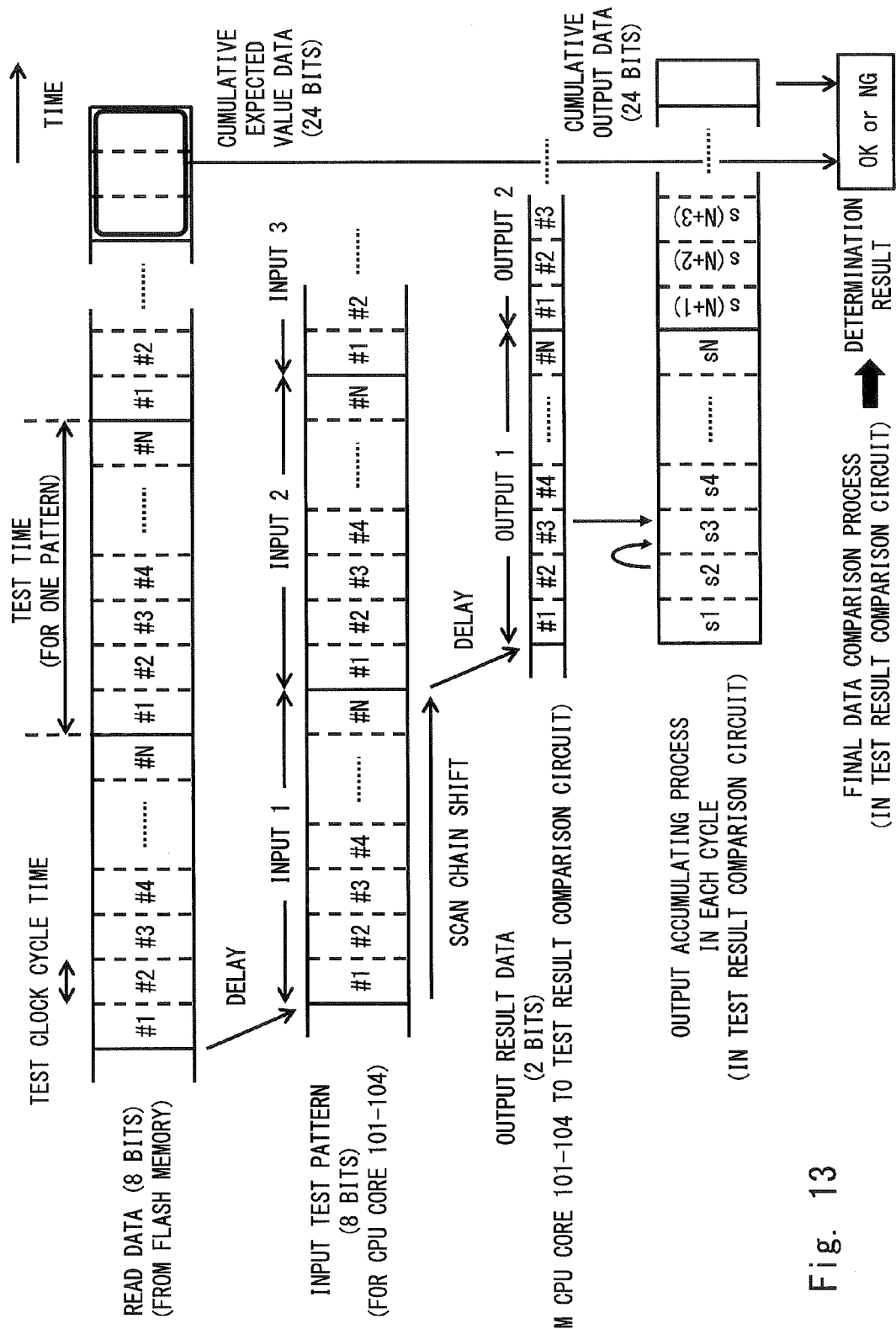
FIG. 13 is an explanatory diagram showing a state where a scan test is performed by a diagnostic test controller by using the test data shown in FIG. 12.

FIG. 13 shows a state where a scan test is performed by the diagnostic test controller 21 by using the test data shown in FIG. 12. The input test pattern read from the FLASH memory 9 by the test data input circuit 226 (8-bit read data itself) is output to the CPU core after a certain processing delay time has elapsed. As explained above in the first embodiment, the test data input circuit 226 supplies one set of input test patterns to the scan chain of the CPU core and makes the CPU core operate. After that, the test data input circuit 226 shifts the scan chain of the CPU core by supplying a plurality of test clocks, which are determined according to the length of the scan chain of the CPU core, to the CPU core. As the time corresponding to the number of cycles corresponding to the plurality of test clocks has elapsed, one set of output result data is output from the CPU core to the test result comparison circuit 227 through the selector 224.

All of the output result data (2 bits), which are output when the above-described operations are performed for all the sets of the input test patterns, are input to the LFSR 228 included in the test result comparison circuit 227 in the respective cycles of the test clock and cumulatively processed in an on-the-fly manner. As a result, a signature of the output result data corresponding to the series of input test patterns is generated. Then, the test result comparison circuit 227 compares this cumulative output data (signature) with cumulative expected value data (24 bits), which is read from the FLASH memory 9 at the end of the process, and determines the final determination result (OK or NG).

As described above, according to the second embodiment, when the test data input circuit 226 reads data in an area where the input test pattern is stored from the FLASH memory 9, the test data input circuit 226 outputs the whole of the 1-byte data (8 bits) obtained by one read operation to the CPU core. The test data input circuit 226 counts the number of times in each of which an input test pattern is read. Then, when the counted number reaches the number of the times (threshold) in which all the input test patterns are read, the test data input circuit 226 switches the output destination of the data read from the FLASH memory 9 from the CPU core to the test result comparison circuit 227. As a result, when the test data input circuit 226 reads data in an area where the cumulative expected value data is stored from the FLASH memory 9, the test data input circuit 226 outputs the whole of the 1-byte data (8 bits) obtained by one read operation to the test result comparison circuit 227. Therefore, in the example shown in FIG. 12, part of the data read from the FLASH memory 9 that are read in the last three read operations is output to the test result comparison circuit 227.

The test result comparison circuit 227 combines a plurality of data output from the test data input circuit 226, uses the combined data as the expected value data of the cumulative output data, and thus compares the combined data with cumulative output data that is obtained by cumulative calculation performed by the LFSR 228. Therefore, in the example shown in FIG. 11, the test result comparison circuit 227 generates 24-bit data that is obtained by combining three one-byte (8 bits) data output from the test data input circuit 226 as the cumulative expected value data.

Note that the test data input circuit 226 may recognize the number of the times (threshold) in which all the input test patterns are read by using an arbitrary method. For example, a threshold may be stored in advance in a specific area of the FLASH memory 9 and the test data input circuit 226 may recognize the aforementioned number of the times by reading that threshold. Further, the test data input circuit 226 may recognize it by receiving a notification of the threshold from the CPU 20 when the CPU system 3 is started up. In this case, the diagnostic test controller 23 may be also connected to the system bus so that the test data input circuit 226 may receive the notification of the threshold from the CPU 20 through the system bus. Further, the CPU 20 may read cumulative expected value data (24 bits) from the FLASH memory 9 and set the read cumulative expected value data in a register of the test data input circuit 226 or the test result comparison circuit 227.

According to the second embodiment explained above, similarly to the first embodiment, it is possible to achieve high diagnosis coverage, which is indispensable for the functional safety, while minimizing the influence to the normal operation (i.e., the deterioration in the operation performance). Further, if a failure occurs in a CPU core, the failure can be immediately detected and the system can be brought into a safe state.

Further, according to the second embodiment, a signature is generated from the result output data of a scan test and its corresponding cumulative expected value data is prepared as a first cumulative calculation result in the FLASH memory 9. That is, the diagnostic test controller 23 diagnoses a currently-diagnosed CPU core by comparing a first cumulative calculation result read from the FLASH memory 9 with a second cumulative calculation result obtained by the cumulative calculation of a plurality of output result data successively output from the currently-diagnosed CPU core. This makes it possible to increase the number of bits of an input test pattern (which is input to the scan data expansion circuit 211 included in each of the scan test circuits 201 to 204 of the CPU cores 101 to 104 to be diagnostically-tested in the parallel state) without increasing the amount of test data stored in the external FLASH memory 9. This can reduce the scan data expansion ratio in the scan data expansion circuit 211, thus increasing the efficiency of the scan test. That is, when the length of the pattern (N data×a plurality of sets) is unchanged, the fault detection rate increases. To put it in the other way around, the length of the input test pattern necessary to achieve the equivalent fault detection rate comparable to that in the first embodiment can be shortened.

Third Embodiment

Next, a configuration and an operation according to a third embodiment are explained with reference to the drawings.

Figure 14:
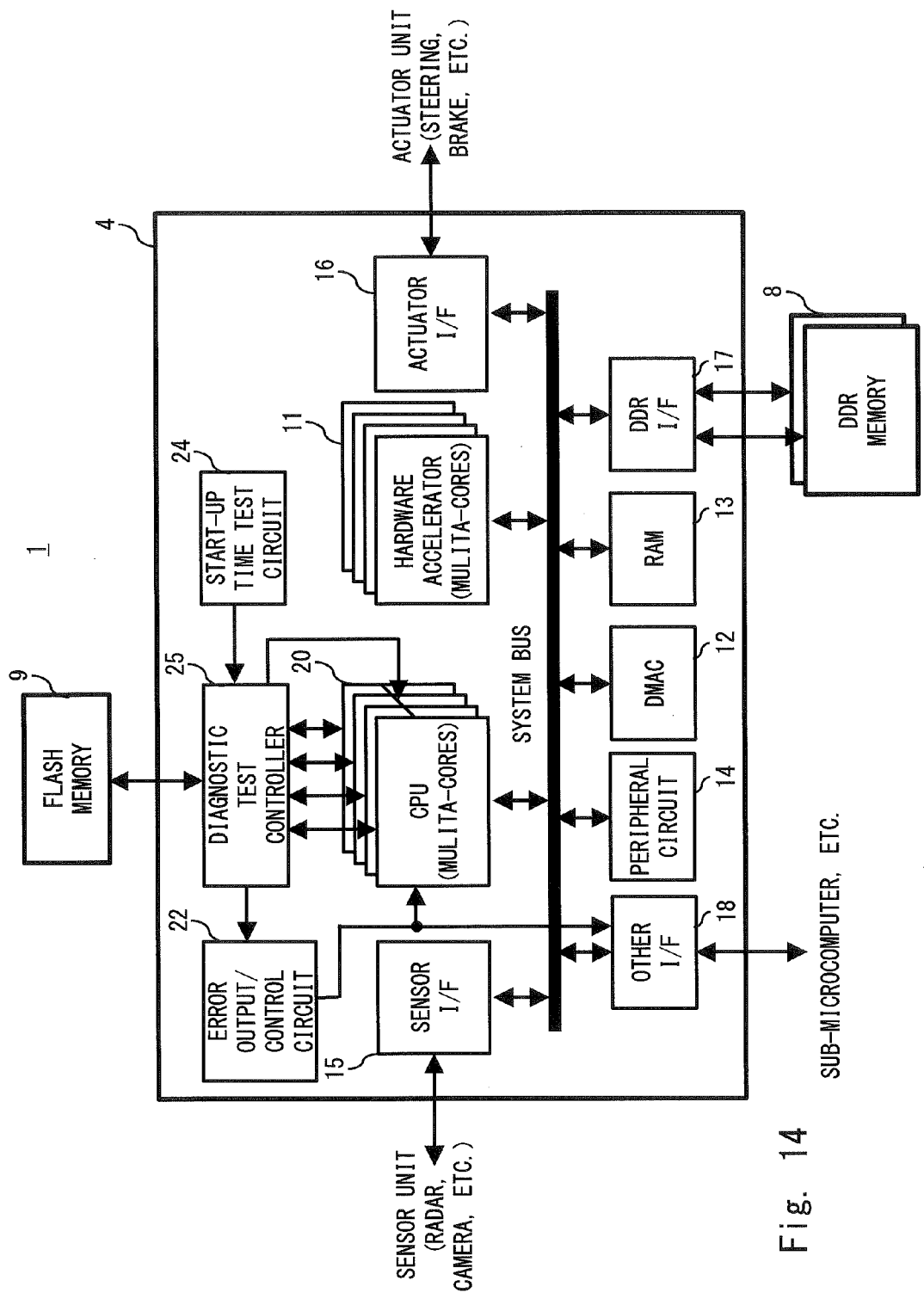
FIG. 14 is a block diagram showing a configuration of a CPU system according to a third embodiment.

FIG. 14 is a block diagram showing a configuration of a CPU system 4 according to the third embodiment. The difference from the CPU system 3 according to the first embodiment shown in FIG. 3 lies in that the CPU system 4 additionally includes a start-up time test circuit 24 that performs a diagnostic test for the diagnostic test controller 25 when the system is started up.

When the CPU system 4 is started up, the start-up time test circuit 24 performs a diagnostic test for the diagnostic test controller 25 before the diagnostic test controller 25 starts the execution of diagnostic tests for the CPU cores 101 to 104. Note that the diagnostic test controller 25 according to the third embodiment is obtained by adding a circuit(s) that performs a diagnostic test for the diagnostic test controller 25 in the diagnostic test controller 21. Its details are described later.

Figure 15:
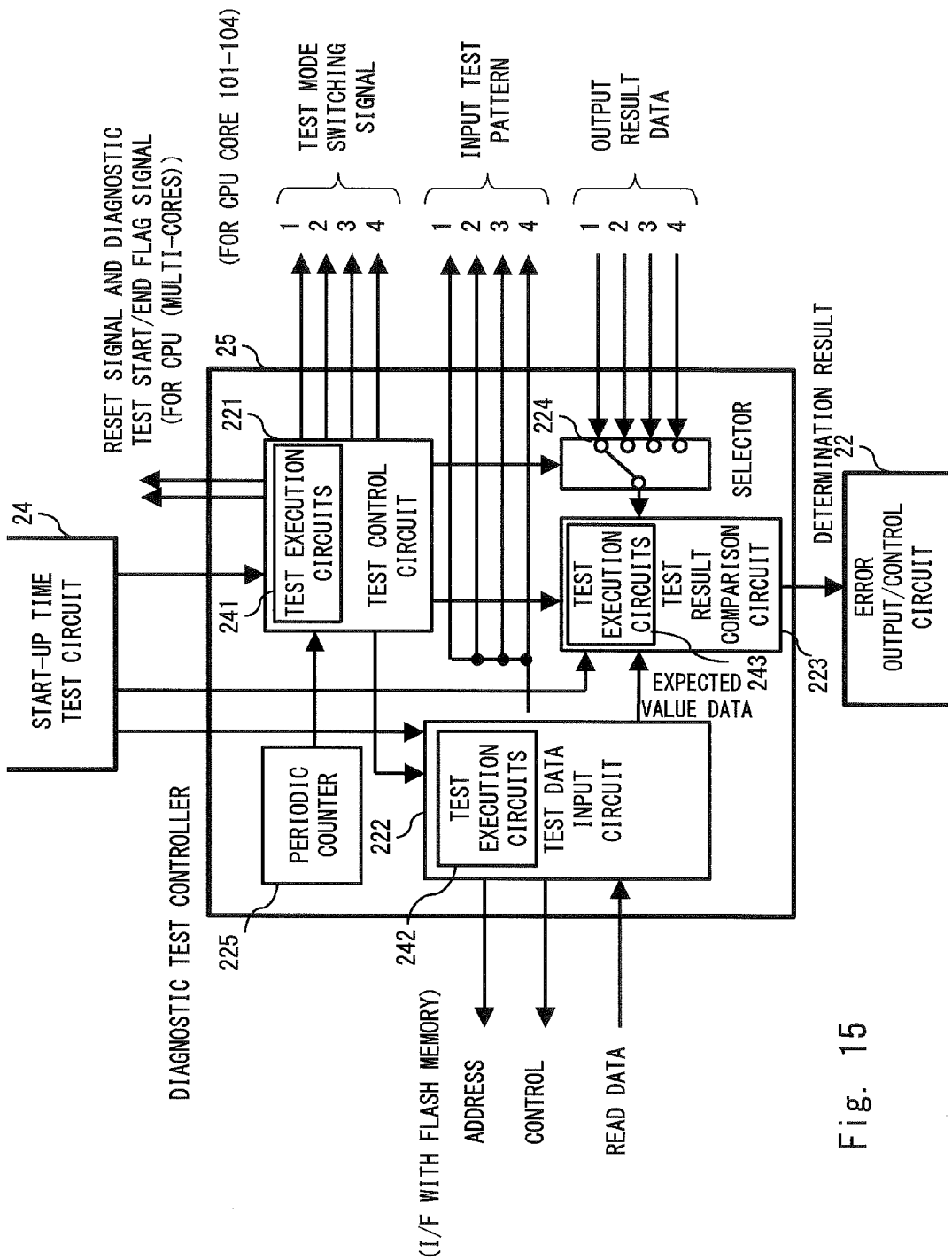
FIG. 15 is a block diagram showing a configuration of a diagnostic test controller shown in FIG. 14.

FIG. 15 is a block diagram showing a configuration of the diagnostic test controller 25 shown in FIG. 14. The difference from the diagnostic test controller 21 according to the first embodiment shown in FIG. 8 lies in that the diagnostic test controller 25 further includes test execution circuits 241 to 243 and that a test instruction signal is supplied from the start-up time test circuit 24 to each of the test execution circuits 241 to 243.

The test execution circuit 241 performs a diagnostic test for the test control circuit 221 in response to the input of the test instruction signal from the start-up time test circuit 24. The test execution circuit 242 performs a diagnostic test for the test data input circuit 222 in response to the input of the test instruction signal from the start-up time test circuit 24. The test execution circuit 243 performs a diagnostic test for the test result comparison circuit 223 in response to the input of the test instruction signal from the start-up time test circuit 24. The test execution circuits 241 to 243 perform scan tests as the diagnostic tests for the test control circuit 221, the test data input circuit 222, and the test result comparison circuit 223, respectively. Further, the test execution circuit 242 also performs, as another diagnostic test, a diagnostic test for the FLASH memory 9 (including its data).

Note that in the example shown in FIG. 15, the test execution circuits 241, 242 and 243 are included in the test control circuit 221, the test data input circuit 222, and the test result comparison circuit 223, respectively. Therefore, in the example shown in FIG. 15, the test instruction signal (s) supplied from the start-up time test circuit 24 is input to the test control circuit 221, the test data input circuit 222, and the test result comparison circuit 223 located within the diagnostic test controller 25. Alternatively, the test execution circuits 241 to 243 may be disposed outside the circuits 221 to 223 for which scan tests are performed.

The start-up time test circuit 24 is configured to supply individual test instruction signals to the respective test execution circuits 241 to 243 at appropriate timings when the system is started up. Needless to say, if diagnostic tests can be simultaneously performed at the same timing as each other upon start-up, one common test instruction signal may be collectively used instead of those individual test instruction signals.

Note that the appropriate timings mean, for example, timings at which scan tests for the test control circuit 221, the test data input circuit 222, the test result comparison circuit 223 can be performed without mutually affecting the other circuits. That is, when the simultaneous execution of scan tests for the circuits 221 to 223 mutually affects each other, the start-up time test circuit 24 shifts the timings at which test instruction signals are output to the circuits 221 to 223 from one another so that the time periods in which the scan tests are performed for the circuits 221 to 223 do not overlap each other. For example, the start-up time test circuit 24 first outputs a test instruction signal to the test control circuit 221 and then outputs a test instruction signal to the test data input circuit 222, for which the next scan test is performed, after a predetermined time has elapsed after the start-up time test circuit 24 outputs the test instruction signal to the test control circuit 221. Note that the predetermined time is determined in advance in such a manner that the scan test for the test control circuit 221 can be certainly completed within the predetermined time. Further, after outputting the test instruction signal to the test data input circuit 222, the start-up time test circuit 24 outputs a test instruction signal to the test result comparison circuit 223, for which the next scan test is performed, after a predetermined time has elapsed after the start-up time test circuit 24 outputs the test instruction signal to the test data input circuit 222. Note that the predetermined time is determined in advance in such a manner that the scan test for the test data input circuit 222 can be certainly completed within the predetermined time. Note that the above-described order of scan tests is merely an example, and the order of scan tests is not limited to the above-described order.

In view of functional safety, it is necessary to perform a diagnostic test for a circuit(s) relating to the diagnostic tests for the fault diagnoses of the CPU cores 101 to 104 (that is, for the control circuit that performs a scan test) and for the external memory that stores test data (e.g., the FLASH memory 9) by using a different method when the system is started up. The diagnostic test controller 25 corresponds to the former control circuit that performs scan tests, and the external FLASH memory 9 corresponds to the latter external memory that stores test data. The control circuit includes a separate circuit for performing a hardware fault diagnosis (e.g., a scan test), and performs a diagnostic test before the control circuit starts the original (or ordinary) operation (i.e., the control of diagnostic tests for CPU cores) when the system is started up.

The test execution circuits 241 to 243, which perform diagnostic tests for the diagnostic test controller 25, which functions as the control circuit, when the system is started up, operate based on a test instruction signal supplied from the start-up time test circuit 24. The test execution circuits 241 to 243 include therein a circuit that generates patterns for scan tests based on pseudo random numbers, and a circuit that supplies the generated patterns to the scan chains of blocks to be tested of the diagnostic test controller 25 (i.e., the test control circuit 221, the test data input circuit 222, and the test result comparison circuit 223) and determines whether their output result data is normal or not. This circuit for determining whether output result data is normal or not includes an LFSR, which is a circuit that performs cumulative calculation of output result data, and a circuit (e.g., register) that stores cumulative expected value data serving as expected values of cumulative calculation results. With this configuration, the test execution circuits 241 to 243 determine that the blocks to be diagnostically-tested are normal when the cumulative calculation results matches the cumulative expected value data, and determine that there is a failure in the blocks to be diagnostically-tested when the cumulative calculation results do not match the cumulative expected value data.

Further, the FLASH memory 9 stores data in such a manner that a CRC (Cyclic Redundancy Check) is added to a bunch of data (i.e., a predetermined number of data). For example, a CRC may be given to each test data unit of 16 bytes. In this case, data that is read from the FLASH memory 9 by one read operation includes 16-byte test data including an input test pattern and expected value data, and a CRC calculated from that input test pattern and the expected value data. Further, for example, the FLASH memory 9 may store data in such a manner that in an area of several bytes subsequent to an area where one set of test data consisting of N data is stored, a CRC of that one set of test data is stored.

The test execution circuit 242, which corresponds to the error output/control circuit 22, reads test data stored in the FLASH memory 9 in response to a test instruction signal supplied from the test execution circuit 242 upon start-up, and checks whether the test data is properly read or not by using an attached CRC. Note that the CPU system may be configured so that checking using a CRC is always performed when test data is read even after the diagnostic test controller 25 starts the original (or ordinary) operation. The test execution circuit 242 reads data from the FLASH memory 9 in a unit in which a CRC is added to the data, and also calculates a CRC for the read data. The test execution circuit 242 compares the CRC attached to the read data with the CRC calculated from the read data. Then, the test execution circuit 242 determines that the FLASH memory 9 is normal when these data match each other, and determines that there is a failure in the FLASH memory 9 (or that the test data is corrupted) when these data do not match each other.

When the test execution circuits 241 to 243 determine that their respective diagnostically-test circuits (including diagnostically-tested memories) are normal, they allow those circuits to be diagnostically-test to start their operations. That is, they allow the test control circuit 221, the test data input circuit 222, and the test result comparison circuit 223 to start diagnostic tests for the CPU cores 101 to 104. When each of the test execution circuits 241 to 243 determines that the circuit to be diagnostically-test is abnormal, it may send a notification signal indicating that abnormality to the error output/control circuit 22. In this case, the sub-microcomputer notifies the driver or the like of the abnormality by using an output device as in the case of the above-described case where an abnormality in the CPU 20 (CPU cores 101 to 104) is detected. Further, in this case, it is necessary to provide a signal line(s) for transferring a notification signal between the test execution circuits 241 to 243 and the test data input circuit 222.

Alternatively, the diagnostic tests for the circuit relating to the diagnostic tests for the CPU cores (that is, the control circuit that performs scan tests) and the external memory that stores test data may be performed by using a different method, in addition to or instead of the above-described method, when the system is started up.

For example, the diagnostic test controller 25 may include therein a test mode (test circuit) for a software diagnostic test. In this case, the diagnostic test controller 25 is brought into a suspended state where the original operation (control of diagnostic tests for the CPU cores 101 to 104) is suspended based on a test instruction signal from the start-up time test circuit 24 when the system is started up. When the CPU cores 101 to 104 become operable before the diagnostic test controller 25, at least one of the CPU cores 101 to 104 executes a software program and thereby performs diagnostic tests for blocks to be tested of the diagnostic test controller 25 (i.e., the test control circuit 221, the test data input circuit 222, and the test result comparison circuit 223), which are in a test mode, one by one.

For example, as a diagnostic test, a CPU core that performs the diagnostic test writes data into registers of the test control circuit 221, the test data input circuit 222, and the test result comparison circuit 223, reads result output data obtained by operating them in a test mode, and compares the read output data with expected value data. To that end, for example, the CPU system may be configured so that the diagnostic test controller 25 is also connected to the system bus and the CPU core reads and writes data through the system bus. The CPU core determines that the circuits are normal when the compared data match each other, and determines that there is a failure in the circuits when the compared data do not match each other.

When the CPU core determines that all the circuits 221 to 223 are normal, it allows those circuits to start their original operations. For example, when the CPU core determines that all the circuits 221 to 223 are normal, it transmits a signal for cancelling the test mode to each of the circuits 221 to 223. Note that when the CPU core determines that there is a failure in one of the circuits 221 to 223, the CPU core may send a notification signal indicating that abnormality to the sub-microcomputer through the other I/F 18. In this case, the sub-microcomputer may notify the driver or the like of the failure by using an output device as in the case of the above-described case where an abnormality in the CPU 20 (CPU cores 101 to 104) is detected.

Further, the FLASH memory 9 stores data in such a manner that an ECC (Error Correction Code), instead of the CRC, is added to a bunch of data (i.e., a predetermined number of data). (For example, an 8-bit ECC may be added to 64-bit data.) In this case, the test execution circuit 242 performs "1-bit error correction/2-bit error detection" for test data by using this ECC when the test data is read from the FLASH memory 9 based on a test instruction signal from the start-up time test circuit 24. The test execution circuit 242 may determine that there is a failure only when "2-bit error detection" is carried out. However, for the diagnostic test that is performed when the system is started up, the test execution circuit 242 preferably determines that there is a failure when either "1-bit error correction" or "2-bit error detection" is carried out. Note that the check using this ECC is preferably performed whenever the diagnostic test controller 25 is performing the original (or ordinary) operation, rather than performed only when the system is started up.

Note that although an example where in the test of the FLASH memory 9 by using the above-described error detection code (CRC or ECC), an error detection code is added for each data having a predetermined size in the entire area of the FLASH memory 9 is explained above, the present invention is not limited to such cases. For example, test data (data and its error correction code) may be stored in only a part of the FLASH memory 9 (e.g., the head or the end) and fault detection may be performed by using that test data. Alternatively, test data may be stored in several parts of the FLASH memory 9 (e.g., the head, the middle part, and the end) in a scattered manner and fault detection may be performed by using those test data.

Further, although an example where the test execution circuits 241 to 243 are provided for the respective circuits 221 to 223 to be tested is explained above, the present invention is not limited to such cases. For example, only one test execution circuit may be provided outside of the circuits 221 to 223 to be tested. In this case, the test execution circuit performs scan tests for the circuits 221 to 223 one by one according to the input of the test instruction signal from the start-up time test circuit 24. Further, the test execution circuit(s) may be disposed outside of the diagnostic test controller 25 rather than inside thereof. In this case, the test execution circuit may be included in the start-up time test circuit 24.

Further, in the above explanations, an example where the start-up time test circuit 24 and the test execution circuits 241 to 243 according to the third embodiment are applied to the first embodiment is explained. However, needless to say, they can be applied to the second embodiment.

According to the third embodiment explained above, as in the case of the first and second embodiments, it is possible to achieve high diagnosis coverage, which is indispensable for the functional safety, while minimizing the influence to the normal operation (i.e., the deterioration in the operation performance). Further, if a failure occurs in the CPU cores 101 to 104, the failure can be immediately detected and the system can be brought into a safe state.

Further, according to the third embodiment, diagnostic tests are performed for the control circuit that is added for performing fault diagnoses of the CPU cores 101 to 104 and/or for the external memory when the system is started up. That is, the start-up time test circuit 24 and the test execution circuits 241 to 243 perform a test for the diagnostic test controller 25 before the diagnostic test controller 25 starts scan tests for the CPU cores 101 to 104. Therefore, a system that is more superior in view of functional safety can be provided.

Further, according to the third embodiment, the FLASH memory 9 is diagnosed by calculating error correction codes from test data stored in the FLASH memory 9 and comparing the calculated error correction codes with error correction codes stored in the FLASH memory 9 before the diagnostic test controller 25 starts scan tests for the CPU cores 101 to 104. According to this feature, false detection in scan tests that occurs due to the use of incorrect test data can be avoided.

Fourth Embodiment

Further, a configuration and an operation according to a fourth embodiment are explained with reference to the drawings.

Figure 16:
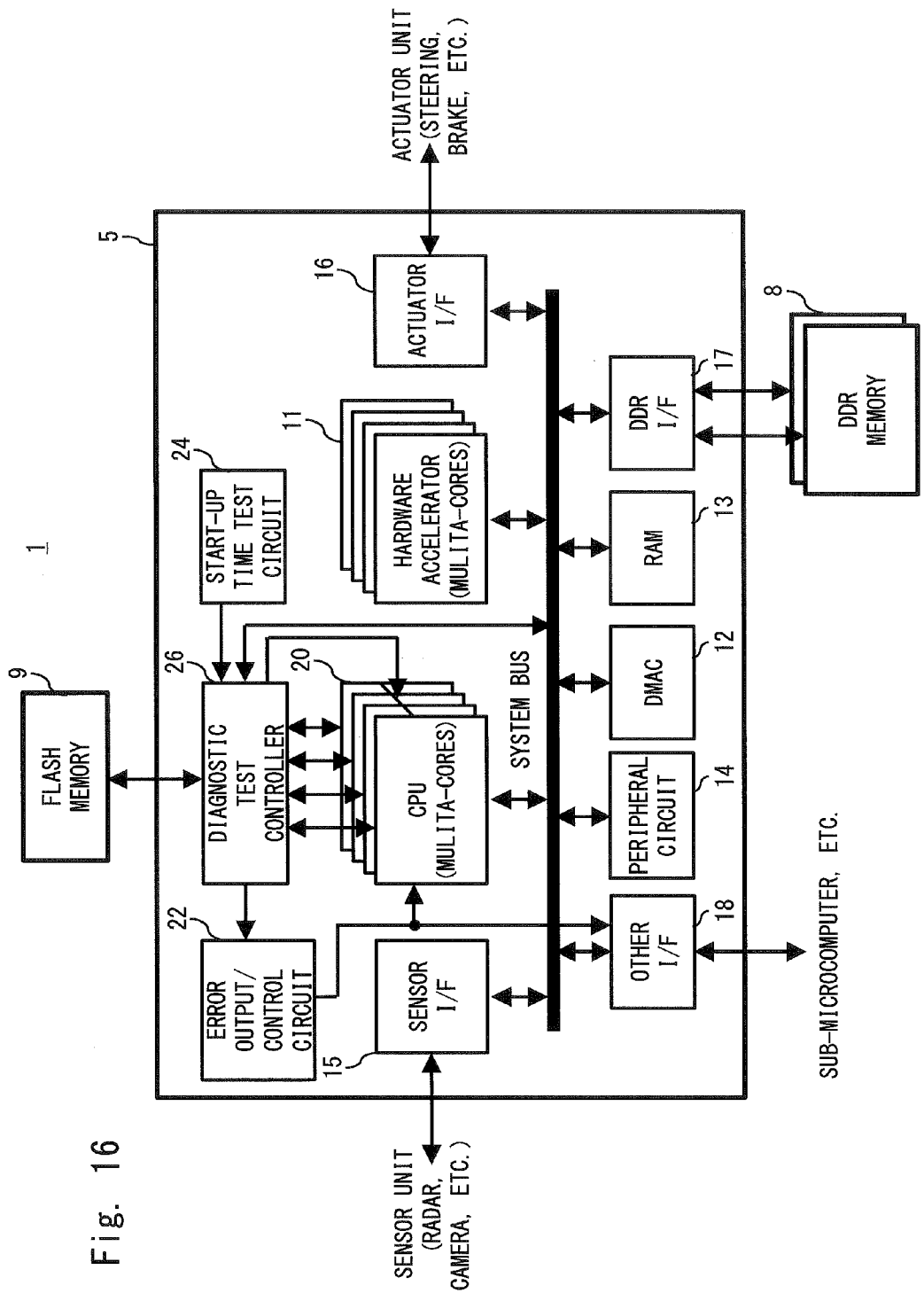
FIG. 16 is a block diagram showing a configuration of a CPU system according to a fourth embodiment.

FIG. 16 is a block diagram showing a configuration of a CPU system 5 according to the fourth embodiment. The difference between the CPU system 5 according to the fourth embodiment and the CPU system 4 according to the third embodiment shown in FIG. 14 lies in that a diagnostic test controller 26 is connected to the system bus in the CPU system 5. This configuration enables the CPU 20 and the diagnostic test controller 26 to transmit/receive arbitrary data (signal) to/from each other through the system bus.

Figure 17:
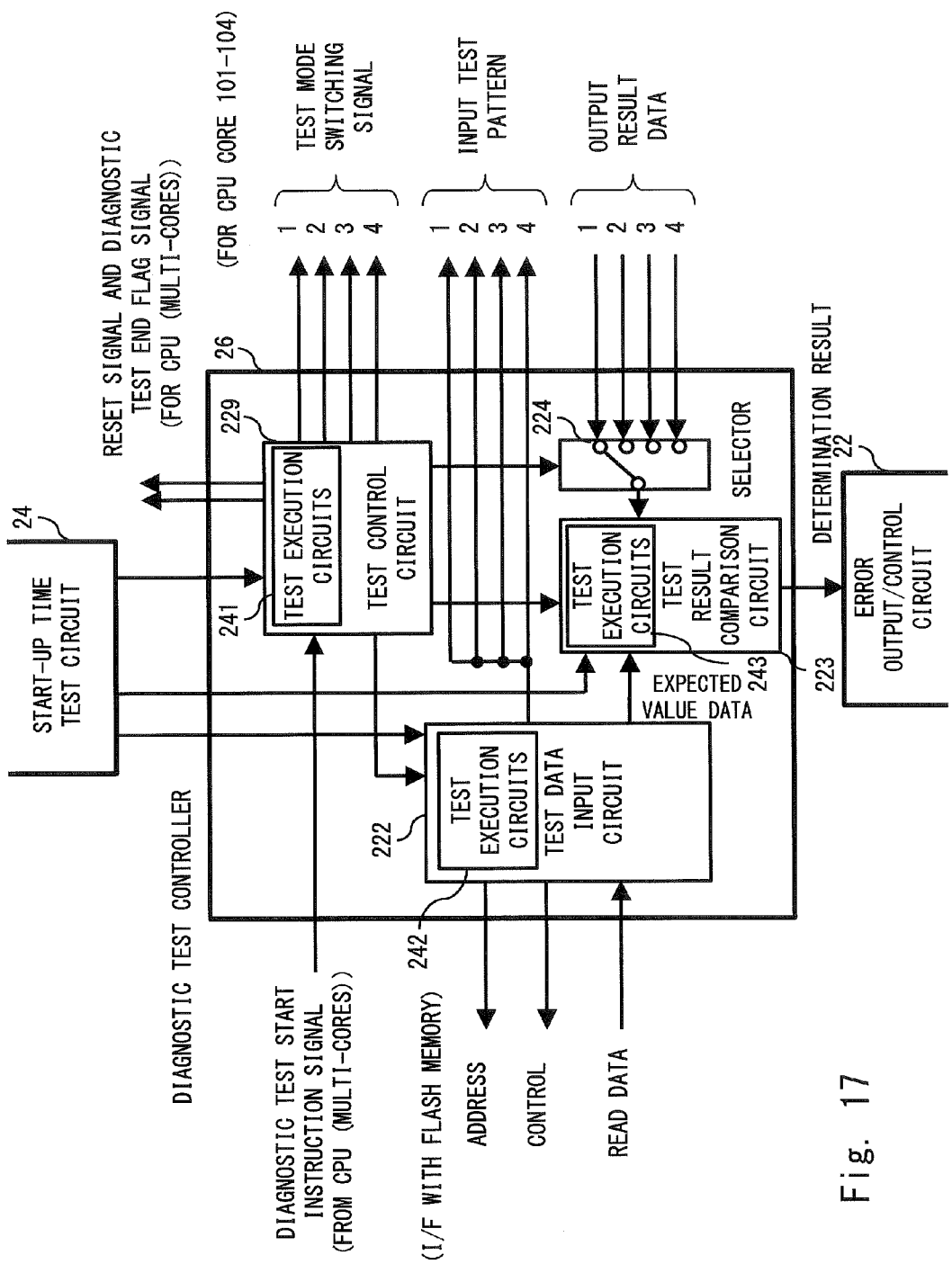
FIG. 17 is a block diagram showing a configuration of a diagnostic test controller shown in FIG. 16.

FIG. 17 is a block diagram showing a configuration of the diagnostic test controller 26 according to the fourth embodiment. The difference between the diagnostic test controller 26 according to the fourth embodiment and the diagnostic test controller 25 according to the third embodiment shown in FIG. 15 lies in that: the diagnostic test controller 26 does not includes the periodic counter 225 that determines the start timing of a periodic diagnostic test; the diagnostic test controller 26 receives a diagnostic test start instruction signal from the CPU 20; and because of these differences, the diagnostic test controller 26 does not output the flag signal indicating the start of a diagnostic test. Further, a part of the operation of a test control circuit 229 according to the fourth embodiment is different from that of the test control circuit 221 according to the third embodiment shown in FIG. 15.

The test control circuit 229 starts a diagnostic test for a CPU core in response to the input of a diagnostic test start instruction signal supplied from the CPU 20. After that, the operations performed by the test control circuit 229 after the test control circuit 229 outputs a test mode switching signal to the CPU core to be tested are similar to those performed by the test control circuit 221 shown in FIG. 15.

The configurations and the operations of the CPU system 5, the CPU 20 and the CPU cores 101 to 104 according to the fourth embodiment are fundamentally similar to those in the third embodiment. However, the details of the execution of a diagnostic test for a CPU core in the fourth embodiment is partially different from those explained in the first embodiment with reference to FIG. 7. Specifically, the software processes such as the task interruption or finish, and the task restoration or input (or start) in the fourth embodiment are different from those in the first embodiment. In the first embodiment, the CPU cores 101 to 104 (i.e., one of the CPU cores 101 to 104 to be diagnostically-tested) check which part of the loop process in execution that CPU core has already executed to and thereby perform switching whether the task should be interrupted or finished. Further, the CPU core performs switching whether the task should be restored or input (started) according to the aforementioned switching. The fourth embodiment is configured so that the need to create such software processes can be eliminated.

Figure 18:
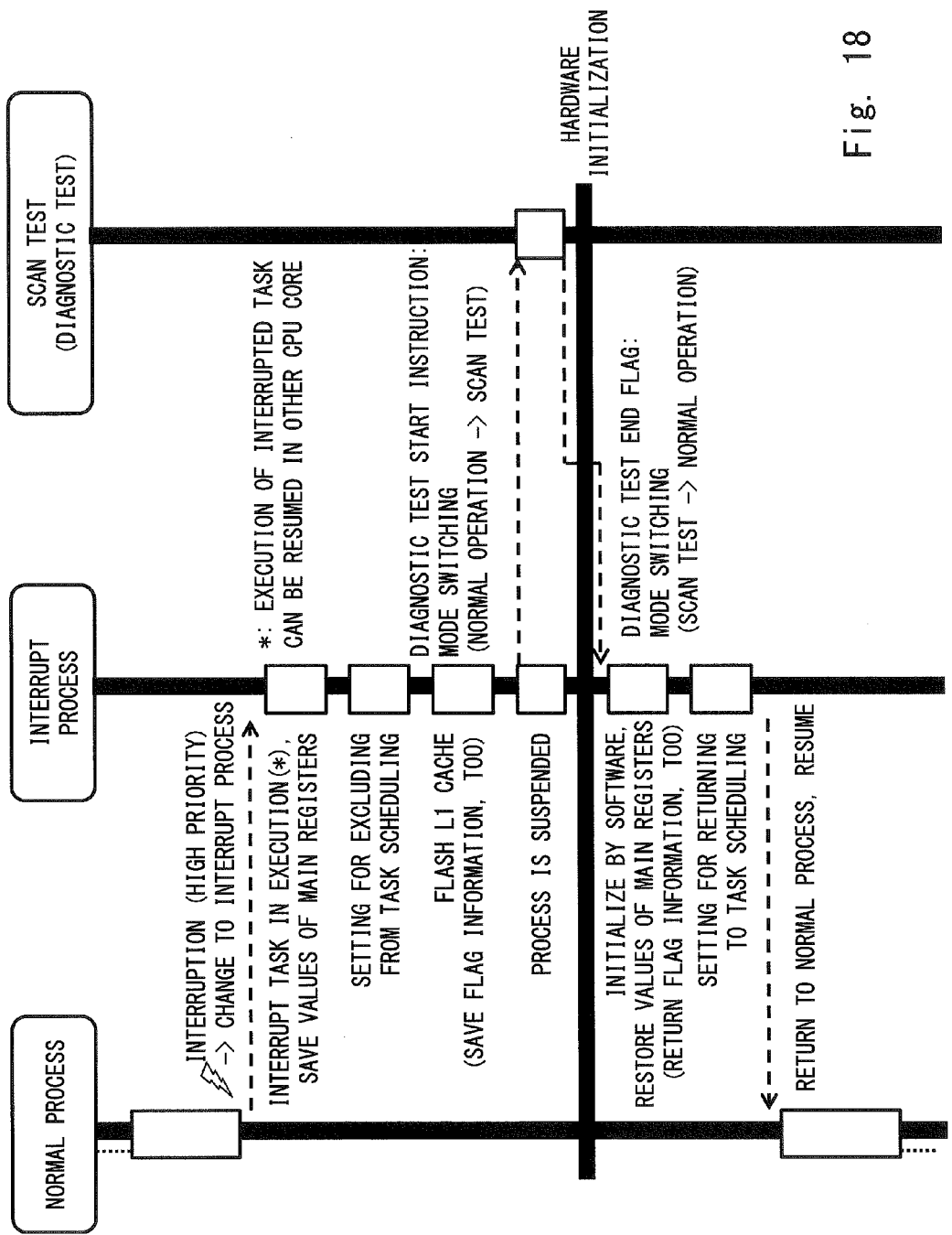
FIG. 18 is a flow diagram of a software process for performing a diagnostic test in the fourth embodiment.

FIG. 18 is a flow diagram of a software process for performing a diagnostic test according to the fourth embodiment. In particular, FIG. 18 shows switching between a normal operation and a diagnostic test operation in one CPU core. In FIG. 18, flows are shown in such a manner that a program is executed from the top to bottom in the figure. The normal operation of the CPU core corresponds to the flow on the left side. A diagnostic test starts from an interrupt process shown in the flow on the center. Further, the flow on the right side shows a scan test state.

In the first embodiment, when the operation of a CPU core is switched from a normal operation to a diagnostic test operation (a fault diagnosis by a scan test), it is necessary to interrupt the task that is executed in that CPU core at that moment and continue the execution of that task in another CPU core, or to finish that task within a predetermined short time. In the fourth embodiment, task scheduling is performed by an OS (Operating System) capable of coping with a multi-cores architecture. That is, this OS is included in the program executed by the above-described CPU 20 (CPU cores 101 to 104). In the CPU system 5, some kind of task is assigned to each of the CPU cores 101 to 104 on a time-to-time basis, and the CPU cores are in the normal operation state where the CPU cores are performing arithmetic processing corresponding to those tasks. The fourth embodiment makes it possible, in such cases, to interrupt the currently-executed task at an arbitrary timing and switch the operation from the normal operation to the diagnostic test operation. Further, the fourth embodiment provides a flexible switching method in which the execution of the interrupted task can be resumed in other CPU cores.

Specifically, when a timer interruption having a high priority higher than a predetermined threshold occurs in the system timer 122 while a certain task is being performed as a normal operation as shown in the flow on the left side, the CPU core, upon receiving that interruption, jumps to the flow on the center at the timing of the interruption occurrence. In this interrupt process routine, the CPU core first interrupts the currently-executed task and brings the task into an execution waiting state (executable state: Ready). This can be carried out by calling a system API function prepared in the OS capable of coping with the multi-core architecture. At this point, values in main registers included in the CPU core are saved into an external memory (e.g., the RAM 13) and the interrupted task is brought into an execution waiting state. If this interrupted task has a priority higher than other tasks that are also in an execution waiting state at that moment, the interrupted task is input to another CPU core when that CPU core is available and the execution of the interrupted task is resumed in that CPU core.

Next, this CPU core, which is about to be switched to the diagnostic test operation, is excluded from the task scheduling so that no new task is input to that CPU core by the task scheduler. Then, the CPU core performs flashing of data in the L1 cache associated with that CPU core and thereby brings the L1 cache into an invalidated state, and then finishes the process by outputting a diagnostic test start instruction signal to the diagnostic test controller 26. At this point, flag information (which is described later) that should be referred to when the CPU core returns from the diagnostic test operation to the normal operation is saved into an external memory. Further, the CPU core performs setting for the CPU common circuit 120 so that any access from the CPU common circuit 120 to that CPU core is prevented. Note that the execution order of the transit of a currently-executed task to an execution waiting state, the main register value saving, the setting for excluding a CPU core from the scheduling, the L1 cache flashing, and the flag information saving is not limited to the above-described order.

Upon receiving the diagnostic test start instruction signal from the CPU core, the diagnostic test controller 26 outputs a test mode switching signal to that CPU core and thereby changes the mode of the CPU core to a scan test mode. As a result, the process of the CPU core as the normal operation is stopped, and the diagnostic test operation shown in the flow on the right side (i.e., hardware scan test) is performed.

After that, when the operation of the CPU core is switched (returned) from the diagnostic test operation to the normal operation, the diagnostic test controller 26 first outputs a test mode switching signal to the CPU core at the timing at which the diagnostic test has been completed. As a result, the mode of the CPU core is returned to the normal mode. Further, at the same time, the diagnostic test controller 26 outputs a reset signal to the CPU core and thereby hardware-initializes the CPU core. As a result, the CPU core starts its operation from a reset routine. Further, the diagnostic test controller 26 outputs a flag signal indicating the end of the diagnostic test to the CPU 20. As a result, the CPU common circuit 120 cancels the prevention of access to the diagnostically-tested CPU core.

At this point, the CPU core acquires the flag information saved in the external memory. This flag information includes, for example, record information indicating that the CPU core itself has output the diagnostic test start instruction signal, and time information that is acquired from the system timer 122 at the time (i.e., at the time when diagnostic test start instruction signal is output). This record information indicating that the CPU core itself has output the diagnostic test start instruction signal is used as information for differentiating the state where the CPU core is restarted by the hardware initialization that is performed after the diagnostic test of the CPU core itself from a state where the CPU core is started up after normal system initialization that is performed when, for example, the CPU system 5 is powered up. Therefore, when the CPU core becomes operable after the hardware initialization, the CPU core firstly determines whether or not the record information is stored in the external memory (whether or not flag information can be acquired). When no record information is stored in the external memory, the CPU core performs an initialization process that is supposed to be performed after the normal system initialization.

On the other hand, when record information is stored in the external memory, the CPU core performs an initialization process that is supposed to be performed when the CPU core is started up after a diagnostic test (which is explained below). In this case, the CPU core checks whether the determination result of the diagnostic test is OK or NG by using information stored the error output/control circuit 22 or the test result comparison circuit 223 included in the diagnostic test controller 26. For example, in the case where the CPU core checks the determination result by using the error output/control circuit 22, the CPU system may be configured so that the information of the determination result indicated by the communication signal supplied from the test result comparison circuit 223 of the diagnostic test controller 26 is held in the error output/control circuit 22. Then, the CPU core may acquire the information of the determination result through the other I/F 18 and check the determination result. Alternatively, in the case where the CPU core checks the determination result by using the test result comparison circuit 223, the CPU system may be configured so that the information of the determination result is held in the test result comparison circuit 223 and the CPU core may acquire the information of the determination result through the system bus and check the determination result.

Further, the CPU core acquires a time from the system timer 122 and compares the acquired time with a time indicated by the time information stored in the external memory. When the difference between these times is greater than a predetermined threshold, the CPU core determines that there is an abnormality. On the other hand, when the difference between them is equal to or less than the predetermined threshold, the CPU core determines that there is no abnormality. As this threshold, a certain time period based on which it is considered that the diagnostic test for the CPU core has not been properly performed and the diagnostic test time is longer than expected may be arbitrarily defined.

When the checked determination result of the diagnostic test is OK and the comparison result of the times is also determined to be normal, the state of the CPU core is different from the system start-up state where the CPU system 5 is entirely powered up. Therefore, the CPU core returns to the middle of the interrupt process shown in the flow on the center. Note that the CPU core that has been hardware-initialized initializes registers that need to be set to perform a normal operation, performs setting so that the CPU core is returned to (i.e., included in) the scheduling, and thereby returns to a state where a new task can be input to (started in) the CPU core. This setting for including the CPU core in the scheduling can also be carried out by calling a system API function prepared in the OS capable of coping with the multi-core architecture. At this point, the values in the necessary registers are restored from the external memory, into which the values were saved when the diagnostic test is started. Note that the execution order of the register initialization, the main register value restoration, the setting for returning a CPU core into the scheduling, the L1 cache flashing, and the flag information saving is not limited to the above-described order.

When the above-described processes have been completed, the CPU core goes out of the interrupt routine and returns to the state shown in the flow on the left side in which the CPU core can perform the normal operation. In this state, the CPU core permits the input of other interruptions, which have been prohibited when and after the CPU core started the interrupt process. The above-described matters can also applied to the other CPU cores. After that, a task having the highest priority among tasks in an execution waiting state at that moment is input to this CPU core by the task scheduler of the OS, and that task starts to be processed.

On the other hand, when the checked determination result of the diagnostic test is NG or the comparison result of the time is determined to be abnormal, the CPU core does not perform, for the above-described process, the setting for returning (i.e., including) the CPU core in the scheduling.

Note that the time information stored in the external memory as the above-described flag information is also used for recognizing the execution timing of the periodic diagnostic test explained above with reference to FIG. 6. When a timer interruption occurs from the system timer 122 and the CPU cores 101 to 104 (i.e., one of the CPU cores 101 to 104) start an interrupt process, the CPU core firstly acquires time information from the system timer 122. When the time period from the time indicated by the time information stored in the external memory to the time indicated by the time information acquired from the system timer 122 reaches the diagnostic test interval, the CPU cores 101 to 104 (i.e., one of the CPU cores 101 to 104) output a diagnostic test start instruction signal to the diagnostic test controller 26. In other words, the difference between the previous diagnostic test start time recoded in the external memory and the current time obtained from the system timer 122 exceeds an elapsed-time threshold defined as the diagnostic test interval time, the CPU cores 101 to 104 (i.e., one of the CPU cores 101 to 104) output a diagnostic test start instruction signal to the diagnostic test controller 26. According to this feature, the CPU cores 101 to 104 output diagnostic test start instruction signals at the diagnostic test intervals and thereby cause the diagnostic test controller 26 to perform diagnostic tests of the CPU cores themselves at the diagnostic test intervals. Note that the CPU cores 101 to 104 firstly shift the timings at which diagnostic test start instruction signals are output to the diagnostic test controller 26 from one another so that the execution time periods of the scan tests do not overlap each other.

Further, in the above explanations, an example where the diagnostic test execution method according to the fourth embodiment is applied to the third embodiment is explained. However, needless to say, it can be applied to either of the first and second embodiments. Further, the diagnostic test execution method according to the fourth embodiment can also be applied to an embodiment that is obtained by applying the start-up time test circuit 24 and the test execution circuits 241 to 243 to the second embodiment.

According to the fourth embodiment explained above, the CPU core changes the program in execution to an execution waiting state in response to a timer interruption, and the operating system performs setting so that any arbitrary program is not task-scheduled in that CPU core and outputs an instruction signal indicating the start of a scan test to the diagnostic test controller 26. This feature can provide, in addition to the advantageous effects of the first to third embodiments, another advantageous effect that the flexibility of the switching method of the interruption and the restoration of tasks performed in the CPU cores 101 to 104 is high, and that it is possible to leave how all the processes that are performed in the CPU 20 are assigned to each of the CPU cores 101 to 104 in charge of the task scheduler of the OS capable of coping with the multi-core architecture.

Modified Example A of Fourth Embodiment

A configuration and an operation according to a modified example A of the fourth embodiment are explained hereinafter with reference to the drawings.

Figure 34:
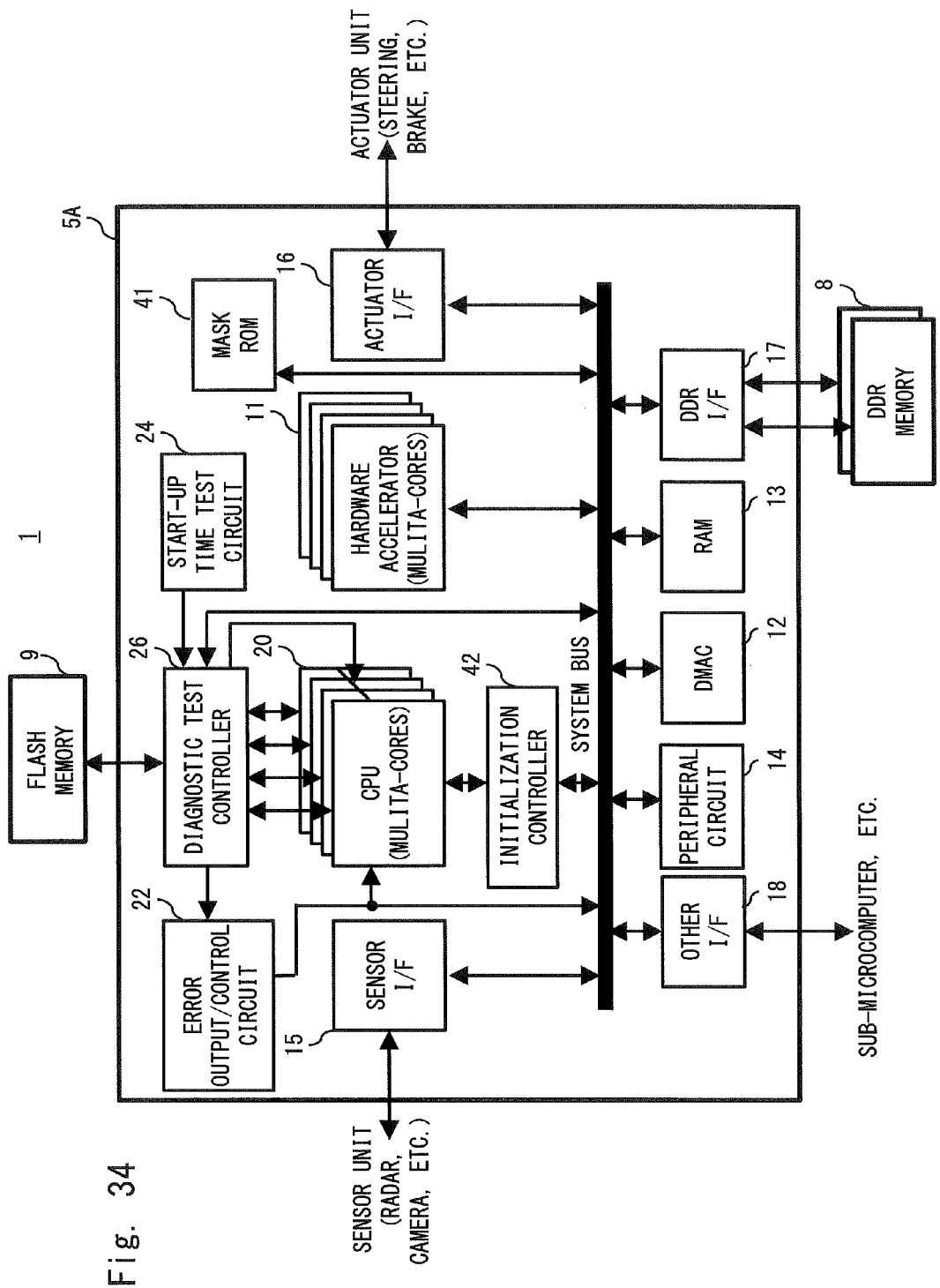
FIG. 34 is a block diagram showing a configuration of a CPU system according to a modified example A of the fourth embodiment.

FIG. 34 is a block diagram showing a configuration of a CPU system 5A according to a modified example A of the fourth embodiment. The difference between the CPU system 5A according to the modified example A of the fourth embodiment and the CPU system 5 according to the fourth embodiment shown in FIG. 14 lies in that the CPU system 5A additionally includes a mask ROM 41 and a reset controller 42.

In the mask ROM 41, the reset vectors for the CPU cores 101 to 104 are assigned. The reset vectors are addresses that the CPU cores 101 to 104 access when they are started up after the normal system initialization. The mask ROM 41 stores jump instructions for jumping to boot loaders stored at the addresses corresponding to the reset vectors. That is, each of the CPU cores 101 to 104 can execute the boot loader by reading and executing an instruction(s) stored in the reset vector when that CPU core is started up after the initialization thereof (after hardware initialization after a diagnostic test, and after system initialization upon power-up). Note that the boot loader may be stored in the mask ROM 41 or in other storage devices (e.g., the FLASH memory 9). In the case where the boot loader is stored in the FLASH memory 9, the CPU system may be configured so that the FLASH memory 9 is also connected to the system bus and hence can be accessed from the CPU cores 101 to 104.

The reset controller 42 is connected between the CPU 20 (CPU cores 101 to 104) and the system bus. Therefore, the CPU 20 (CPU cores 101 to 104) accesses the other circuits 11-18, 26 and 41 through the reset controller 42. The reset controller 42 has a function of rewriting a reset vector to a different address (i.e., overwriting a reset vector with a different address) when one of the CPU cores 101 to 104 accesses the reset vector. That is, the reset controller 42 has a function of changing the address at which one of the CPU cores 101 to 104 reads an instruction from the address of the jump instruction for jumping to the boot loader stored in the mask ROM 41 to an address of an instruction stored in other storage devices.

The details of the execution of a diagnostic test for a CPU core in the modified example A of the fourth embodiment is partially different from those explained in the fourth embodiment with reference to FIG. 18. Specifically, in the fourth embodiment, the differentiation between the restart by hardware initialization after a diagnostic test and the start-up after hardware initialization upon power-up is carried out by using the flag information. In contrast to this, the modified example A of the fourth embodiment eliminates the need for this differentiation by the above-described rewriting (i.e., overwriting) of the reset vector.

Figure 35:
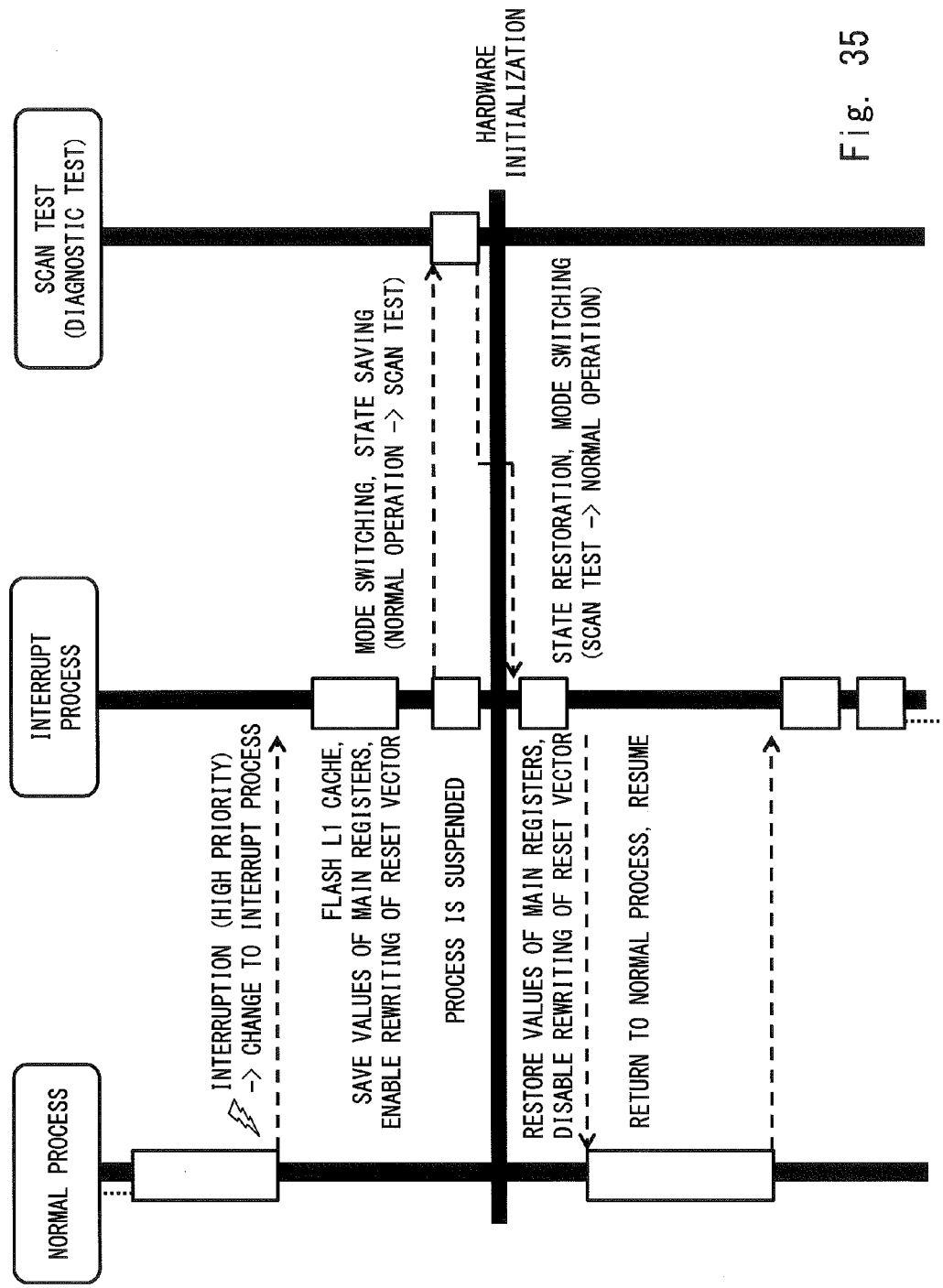
FIG. 35 is a flow diagram of a software process for performing a diagnostic test in the modified example A of the fourth embodiment.

FIG. 35 is a flow diagram of a software process for performing a diagnostic test according to the modified example A of the fourth embodiment. When compared to the flow diagram of a software process for performing a diagnostic test according to the fourth embodiment explained with reference to FIG. 18, the flag information saving/restoring process is eliminated (i.e., replaced) by the rewriting (i.e., overwriting) of the reset vector in the modified example A of the fourth embodiment. Further, the transit of a currently-executed task to an execution waiting state, and the setting for excluding a CPU core to be diagnostically-tested from the scheduling are also eliminated.

Some software processes such as a task stopping process are performed when the operation of a CPU core is switched from a normal operation to a diagnostic test operation. Further, some software processes such as a task resuming process are also performed when the operation of a CPU core is switched from the diagnostic test operation to the normal operation. Further, the CPU core is hardware-initialized when the operation of the CPU core is returned from a diagnostic test operation using a hardware scan test to a normal operation.

When a timer interruption having a high priority higher than a predetermined threshold occurs in the system timer 122 while a certain task is being performed as a normal operation as shown in the flow on the left side, the CPU core, upon receiving that interruption, jumps to the flow on the center at the timing of the interruption occurrence. At the moment when the CPU core enters this interrupt process routine, the task executed in the normal operation is suspended. At this point, this CPU core prohibits other interruptions from being accepted. This CPU core firstly performs flashing for the L1 cache associated with that CPU core and thereby brings the L1 cache into an invalidated state. Next, the CPU core saves values in main registers (system registers and general purpose registers) included in the CPU core into an external memory (e.g., RAM 13) and performs setting for enabling the reset controller 42 to rewrite (i.e., overwrite) the reset vector. Note that the execution order of the L1 cache flashing, the main register value saving, and the enabling of reset vector rewriting is not limited to the above-described order. For example, they are performed in the order of the main register value saving, the L1 cache flashing, and the enabling of reset vector rewriting.

This reset vector rewriting is performed to change the reset vector so that when the CPU core is returned from the diagnostic test operation to the normal operation later and the CPU core is thereby hardware-initialized, the CPU core recognizes the return address defined in the interrupt process as the jump destination and hence immediately returns to the middle of that interrupt process shown in the flow on the center. For example, in the case where the instructions of the interrupt process are stored in the RAM 13, when the reset controller 42 is enabled to rewrite (i.e., overwrite) the reset vector, the reset controller 42 changes the address at which the CPU core reads an instruction from the reset vector to the address at which the instruction at the return destination, among a plurality of instructions in the interrupt process stored in the RAM 13, is stored. This address at which the instruction(s) of the interrupt process is stored can be set for the reset controller 42 by the CPU core when, for example, the rewriting of the reset vector is enabled.

After that, when the CPU core outputs a diagnostic test start instruction signal to the diagnostic test controller 26, the mode of the CPU core is changed to a scan test mode by the diagnostic test controller 26 and the diagnostic test operation shown in the flow on the right side (i.e., hardware scan test) is thereby performed. At this point, at the timing at which the diagnostic test is completed, the mode of the CPU core is returned to the original normal mode and a reset signal is output to the CPU core. As a result, the CPU core is hardware-initialized and the CPU core returns to the jump destination indicated by the address changed from the reset vector so that the operation of the CPU core is continued from the middle of the interrupt process.

Information indicating whether the determination result of the diagnostic test is OK or NG is stored in the test result comparison circuit 223 included in the diagnostic test controller 26. Further, the test result comparison circuit 223 outputs that information as a notification signal to the error output/control circuit 22. When the determination result is NG, a process for bringing the CPU system 5 into a safe state (the above-described fault notification or the degeneration of the failed CPU core) is performed. When the determination result is OK, the CPU core confirms the information stored in the test result comparison circuit 223 and then continues the interrupt process. The CPU core reads out the values of the main registers saved in the external memory, and performs setting for the reset controller 42 for invalidating the rewriting of the reset vector so that, as the reset vector, the head of the initialization process that is supposed to be performed upon start-up after the ordinary system initialization becomes the jump destination. Note that the execution order of the main register value restoration and the invalidation of reset vector rewriting is not limited to the above-described order. For example, they are performed in the order of the invalidation of reset vector rewriting and the main register value restoration.

After that, the CPU core goes out of the interrupt routine, returns to the normal process shown in the flow on the left side, and resumes the task that was being executed in the normal operation. At this point, the CPU core cancels the prohibition of the acceptance of other interruptions and returns to the state where interruptions are permitted to be accepted. Note that in the software process according to the fourth embodiment explained with reference to FIG. 18, the task is brought into an execution waiting state. In contrast to this, in the modified example A of the fourth embodiment, the CPU core resumes the execution of the interrupted task. Therefore, in the modified example A of the fourth embodiment, all the values of the main registers necessary for the resumption of the execution of the task need to be restored. In contrast to this, in the fourth embodiment, the restoration of a part of the values can be omitted.

In order to advance the execution of a diagnostic test for each of the CPU cores 101 to 104 as in the case of FIG. 6, the respective CPU core uses a timer interruption from the system timer 122 as a trigger and thereby checks the elapsed time from the previous diagnostic test using the time information acquired from the system timer 122. Note that similarly to the forth embodiment, the CPU core can recognize the time at which the previous diagnostic test is performed by storing time information indicating that time into an external memory (e.g., the RAM 13) when the previous diagnostic test is started. Further, similarly to the forth embodiment, when the CPU cores 101 to 104 (i.e., one of the CPU cores 101 to 104 to be diagnostically-tested) determines that it is the timing at which the diagnostic test should be performed by comparing the start time of the previous diagnostic time with the time at the present moment, the CPU core may perform the diagnostic test from the interrupt process as described above. On the other hand, when the CPU core determines that it has not yet been the timing at which the diagnostic test should be performed, the CPU core may immediately go out of the interrupt routine and return to the normal process.

Further, in the above explanations, an example where the diagnostic test execution method according to the fourth embodiment is modified and applied to the third embodiment is explained. However, needless to say, it can be applied to either of the first and second embodiments. Further, needless to say, the diagnostic test execution method according to the modified example A of the fourth embodiment can also be applied to an embodiment that is obtained by combining two or more of the first to third embodiments.

According to the above-described modified example A of the forth embodiment, the reset controller 42 changes the address at which the CPU core reads an instruction in response to initialization performed after the execution of a scan test from the reset vector to the address of the instruction at which the task is interrupted due to the scan test in the interrupt process. This makes it possible to finish a scan test in a diagnostic test within an interrupt routine with some software processes included before and after the diagnostic test. This feature can provide, in addition to the advantageous effects of the first to third embodiments, another advantageous effect that the effect on the overall process of the CPU system caused by the diagnostic test of the CPU core can be reduced.

Modified Example B of Fourth Embodiment

Next, a configuration and an operation according to a modified example B of the fourth embodiment are explained hereinafter with reference to the drawings.

Figure 36:
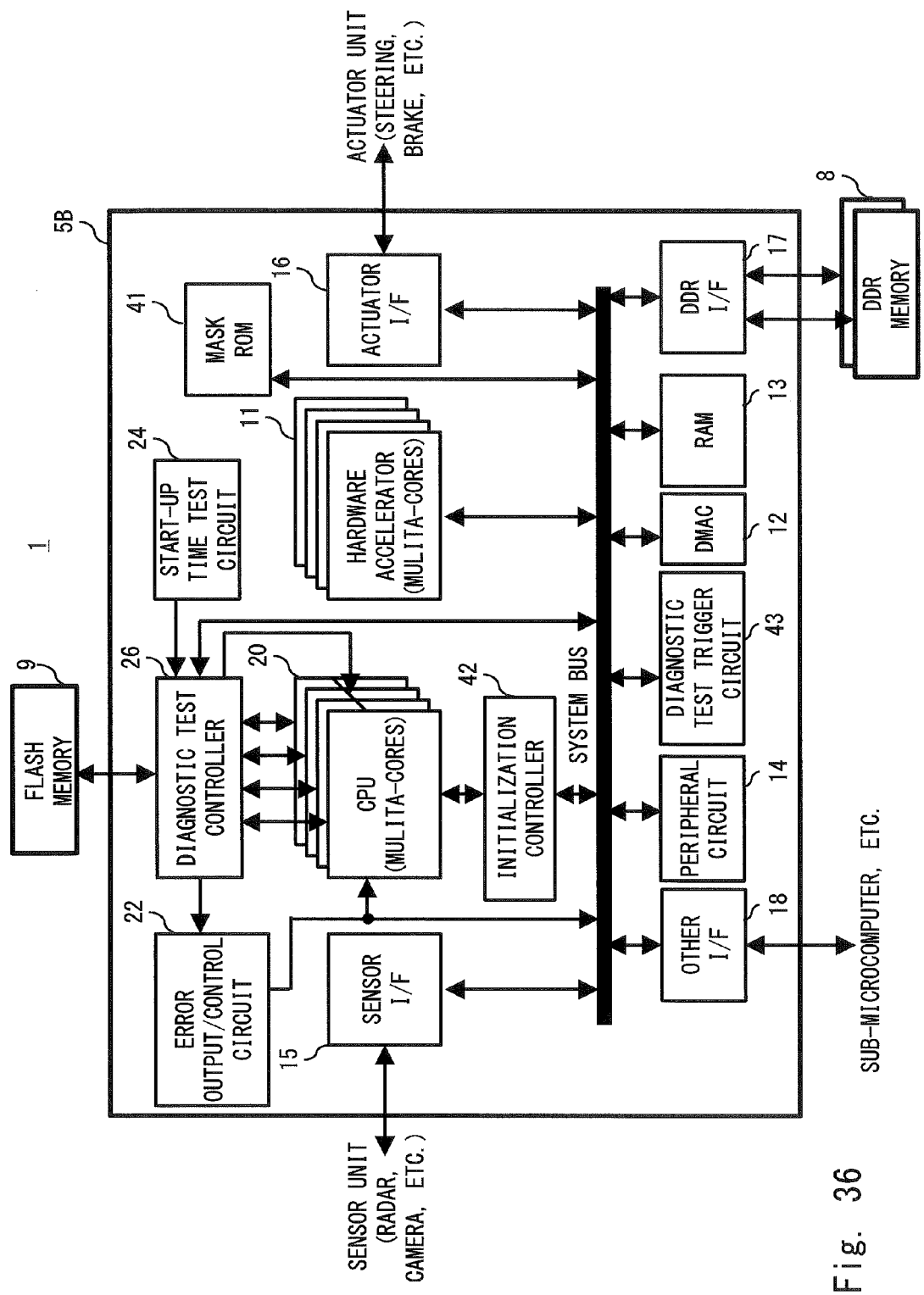
FIG. 36 is a block diagram showing a configuration of a CPU system according to a modified example B of the fourth embodiment.

FIG. 36 is a block diagram showing a configuration of a CPU system 5B according to a modified example B of the fourth embodiment. The difference between the CPU system 5B according to the modified example B of the fourth embodiment and the CPU system 5A according to the modified example A of the fourth embodiment shown in FIG. 34 lies in that the CPU system 5B according to the modified example B of the fourth embodiment additionally includes a diagnostic test trigger circuit 43 connected to the system bus. This diagnostic test trigger circuit 43 outputs an interrupt signal (not shown) to the interrupt controller 121 included in the CPU 20 at a predetermined timing. The interrupt controller 121 provides a trigger interruption to each of the CPU cores 101 to 104 according to the interrupt signal from the diagnostic test trigger circuit 43. This interrupt signal and the trigger interruption can be generated for an arbitrary one of the CPU cores 101 to 104.

In the modified example A of the fourth embodiment, the system timer 122 is used for the sequence control of the diagnostic tests. In contrast to this, the modified example B of the fourth embodiment includes the dedicated diagnostic test trigger circuit 43 for indicating a timing of a diagnostic test performed for each of the CPU cores 101 to 104. The diagnostic test trigger circuit 43 outputs an individual interrupt signal to each of the CPU cores 101 to 104 at a timing at which a diagnostic test for that CPU core is started. Information of the diagnostic test interval shown in FIG. 6, information of the timing for the diagnostic test for each CPU core that is performed during that period (the lapsed time from the start timing of the diagnosis test interval), and so on can be set in advance in a register(s) of the diagnostic test trigger circuit 43 from the CPU 20 through the system bus. This enables the diagnostic test trigger circuit 43 to provide a trigger interruption to a desired CPU core through the interrupt controller 121 at the execution timing of the diagnostic tests for each of the CPU cores 101 to 104 as shown in FIG. 6 based on the information set in the register.

Note that the CPU system may be configured so that an interrupt signal is output from the diagnostic test trigger circuit 43 to the CPU core 101 only at the execution start timing of the first diagnostic test in the diagnostic test interval (i.e., diagnostic test period) and the sequence control for performing the subsequent diagnostic tests for the CPU core 101 and those for the other CPU cores 102 to 104 are performed by using a different method.

For example, the CPU system 5B uses a general purpose timer that is separately provided from the system timer 122 included in the CPU 20 and is included in the other peripheral circuits 14. The CPU core 101 to which the trigger interrupt is provided starts this general purpose timer. The CPU cores 101 to 104 (i.e., one of the CPU cores 101 to 104 to be diagnostically-tested) may use a timer interruption supplied from this general purpose timer and thereby determines a timing at which the subsequent diagnostic test for the CPU cores 101 to 104 is performed. Note that the specific method for determining a diagnostic test execution timing is similar to that of the system timer 122, and therefore its explanations are omitted. Further, control by a software process using an inter-processor interruption (i.e., interruption between processors), for example, may be used. More specifically, only one of the CPU cores 101 to 104 may receive a trigger interruption and that one CPU core may determine the timings of diagnostic tests for each of all the CPU cores 101 to 104. Further, when that one CPU core determines that it is the timing at which a diagnostic test for another CPU core should be performed, that one CPU core notifies the other CPU core that it is the timing for a diagnostic test for that other CPU core by using an inter-processor interruption. Then, the other CPU core may perform the diagnostic test in response to the inter-processor interruption.

Further, in the above explanations, an example where the diagnostic test trigger circuit 43 according to the modified example B of the fourth embodiment is applied to the modified example A of the fourth embodiment is explained. However, needless to say, it can be applied to the fourth embodiment. Further, needless to say, the diagnostic test trigger circuit 43 according to the modified example B of the fourth embodiment can also be applied to an embodiment that is obtained by combining two or more of the first to third embodiments and applying the diagnostic test execution method according to the fourth embodiment or the modified example A thereof.

Similarly to the modified example A of the fourth embodiment, according to the modified example B of the fourth embodiment explained above, a scan test in a diagnostic test can be completed within an interrupt routine with some software processes included therein. Further, in the modified example B of the fourth embodiment, the diagnostic test trigger circuit 43 generates an interruption for each of the plurality of CPU cores 101 to 104 at a scan test execution timing for that CPU core. This feature can provide, in addition to the advantageous effects of the fourth and the modified example A of the fourth embodiments, another advantageous effect that the need for the software process for checking the elapsed time from the previous diagnostic test by using the time information acquired from the system timer 122 can be eliminated. Further, this diagnostic test trigger circuit 43 increases the flexibility of the execution pattern of diagnostic tests for the CPU cores.

Fifth Embodiment

Further, a configuration and an operation according to a fifth embodiment are explained with reference to the drawings.

Figure 19:
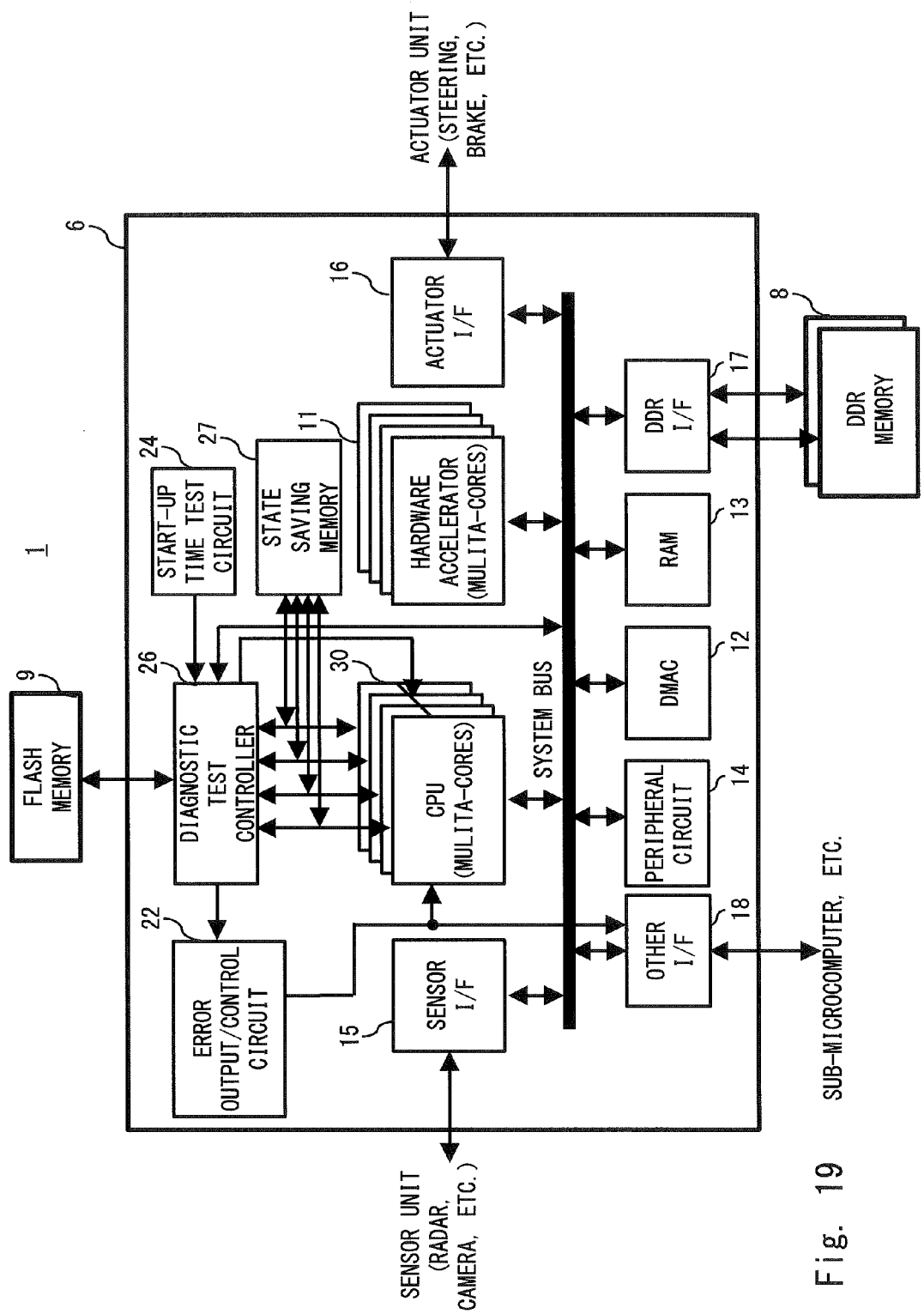
FIG. 19 is a block diagram showing a configuration of a CPU system according to a fifth embodiment.

FIG. 19 is a block diagram showing a configuration of a CPU system 6 according to the fifth embodiment. The difference from the CPU system 5 according to the fourth embodiment shown in FIG. 16 lies in that the CPU system 6 includes a state saving memory 27 that saves an FF (Flip Flop) state of the scan chain included in each of the CPU cores 101 to 104 included in the CPU 20.

The state saving memory 27 corresponds to a diagnostic test circuit. Further, when a diagnostic test for a CPU core to be scan-tested is started, data saved from the FF of the scan chain of that CPU core is stored in the state saving memory 27. When the diagnostic test for that CPU core has been finished, the state saving memory 27 returns the saved data to the FF of the scan chain of the CPU core.

Figure 20:
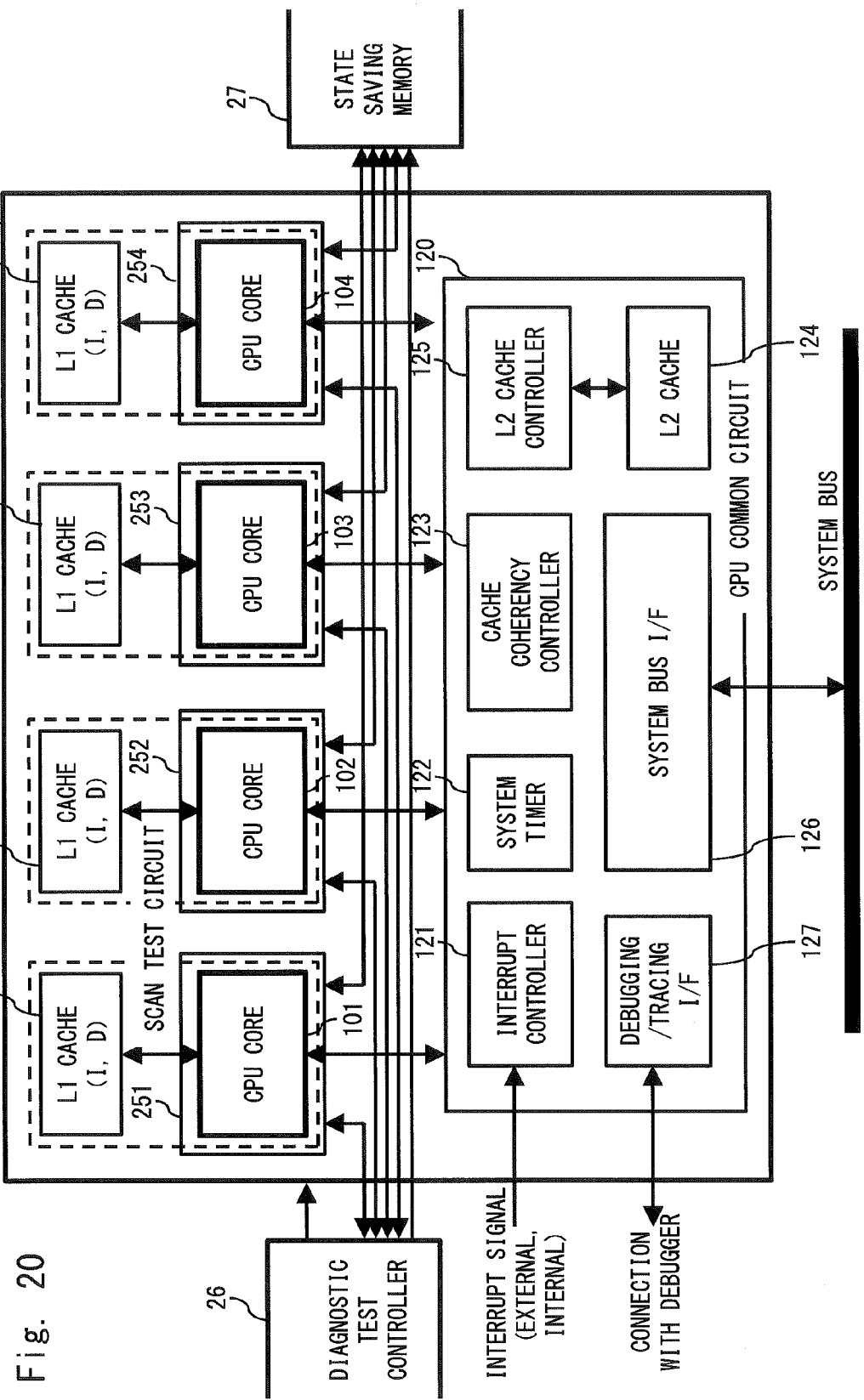
FIG. 20 is a block diagram showing a configuration of a CPU shown in FIG. 19.

FIG. 20 is a block diagram showing a configuration of the CPU 30 shown in FIG. 19. The difference from the CPU 20 explained in the first embodiment with reference to FIG. 4 lies in that the CPU 30 includes an additional input/output signal line between the four CPU cores and the state saving memory 27 disposed outside the CPU cores. Further, as a result of this modification, a part of the operation of scan test circuits 251 to 254 according to the fifth embodiment shown in FIG. 20 is different from that of the scan test circuits 201 to 204 according to the first embodiment shown in FIG. 4.

The scan test circuits 251 to 254 select either the diagnostic test controller 26 or the state saving memory 27 as the data input source for the scan chain. Further, the scan test circuits 251 to 254 output data from the scan chain to the state saving memory 27 as well as to the diagnostic test controller 26.

Figure 21:
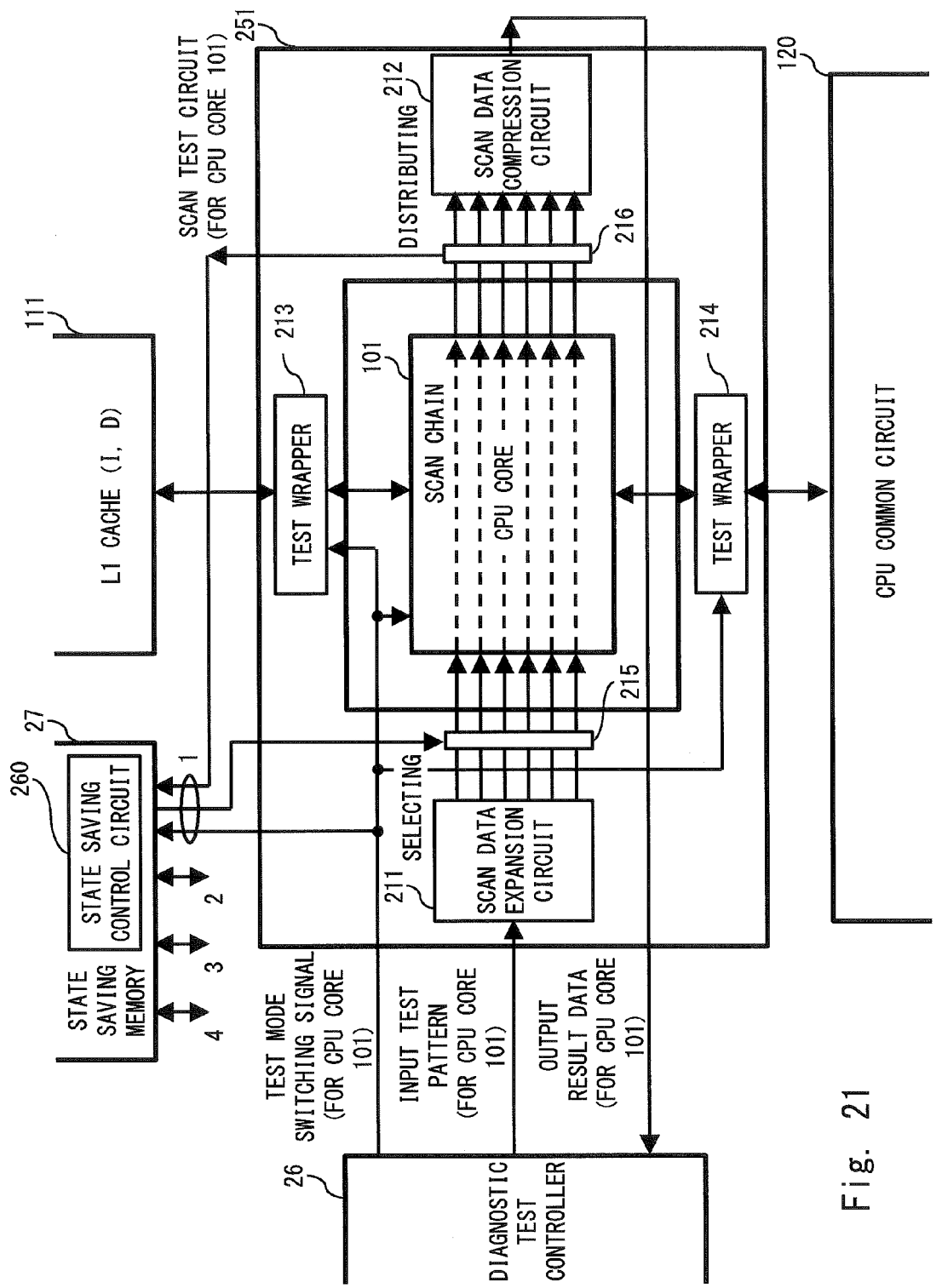
FIG. 21 is a block diagram showing a configuration of a CPU core shown in FIG. 20.

FIG. 21 is a block diagram showing a configuration of the CPU core 101 and the scan test circuit 251 shown in FIG. 20. The main difference between the scan test circuit 251 according to the fifth embodiment and the scan test circuit 201 explained in the first embodiment with reference to FIG. 5 lies in that a distribution circuit 216 and a select circuit 215 are disposed in the scan test circuit 251 of the CPU core 101. In particular, the select circuit 215 is disposed in the output of the scan data expansion circuit 211 (i.e., in the input to the scan chain of the CPU core). The select circuit 215 switches the connection destination between the input signal lines from the scan data expansion circuit 211 and the input signal line from the external state saving memory 27. The distribution circuit 216 distributes the input of the scan data compression circuit 212 (i.e., the output from the scan chain of the CPU core) and outputs the distributed signal to the external state saving memory 27.

The state saving memory 27 stores data that has been stored in the scan chain of the CPU core to be diagnostically-tested at the time when the scan test is started. The state saving memory 27 includes a state saving control circuit 260 that controls the saving and restoring of data of the CPU core. The state saving control circuit 260 also receives a test mode switching signal from the test control circuit 229 of the diagnostic test controller 26. The state saving control circuit 260 recognizes the start of a scan test by the input of the test mode switching signal from the test control circuit 229, acquires data output from the CPU core 101 after the start of the scan test by an amount corresponding to the size of the scan chain, and stores the acquired data into the state saving memory 27. Further, the state saving control circuit 260 monitors the progress state of the scan test by, for example, the scan clock and switches the connection destination of the select circuit 215 to the state saving memory 27 at a timing at which the input of all the input test patterns have been finished. Then, the state saving control circuit 260 successively supplies the data saved in the state saving memory 27 to the CPU core 101 through the select circuit 215. That is, the state saving control circuit 260 restores the original data into the scan chain of the CPU core 101 by using the drive period of the scan chain that starts when the input of the all the input test patterns have been finished and ends when the last output result data is output.

Note that the configuration of each of the scan test circuits 252 to 254, which are disposed so as to correspond to the CPU cores 102 to 104, is equivalent to that shown in FIG. 21, and therefore its explanations are omitted.

Figure 22:
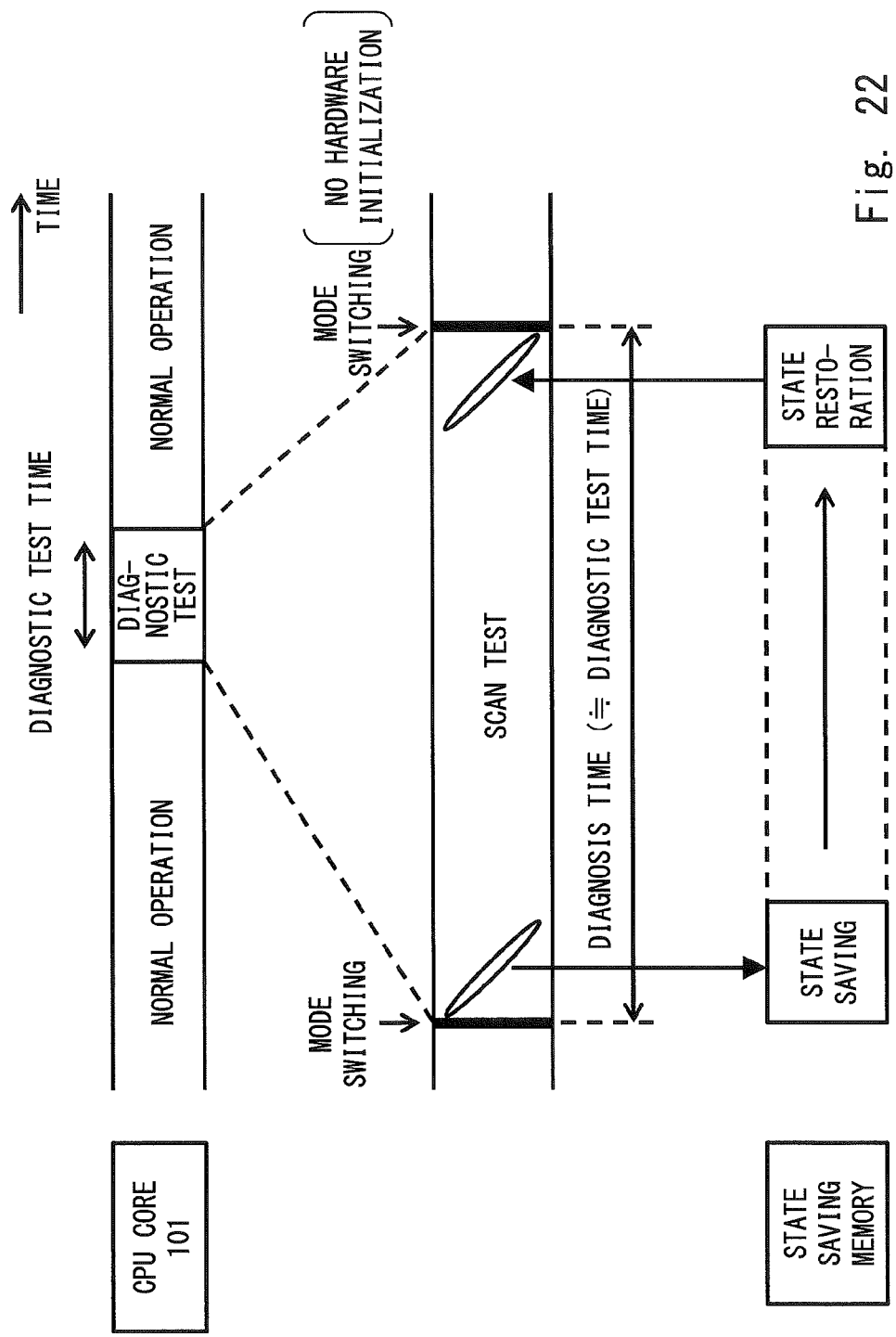
FIG. 22 is an explanatory diagram showing details of the execution of a diagnostic test for a CPU core in the fifth embodiment.

FIG. 22 shows details of the execution of a diagnostic test for the CPU core 101 according to the fifth embodiment. The fifth embodiment is characterized in that the need of some software processes (processes of task interruption/finish and task restoration/input) explained in the first embodiment with reference to FIG. 7 is eliminated and the need of the hardware initialization, which is performed when the CPU core is returned from the diagnostic test operation using the hardware scan test to the normal operation, is also eliminated.

The fifth embodiment further includes the state saving memory 27 having a memory (a FF group or an SRAM) for saving the FF state inside the CPU core 101 output from the scan chain. Therefore, it is possible, in a scan test mode, to output and store the internal FF state into the state saving memory 27 when the mode is switched from the normal mode to the scan test mode and the first input test pattern is input to the scan chain. Further, it is possible to input the FF state saved in the state saving memory 27 to the CPU core 101 and restore the state at the time immediately before stating the diagnostic test operation when result data corresponding to the last input test pattern is output from the scan chain. This feature makes it possible to immediately resume the normal operation.

Note that details of the execution of diagnostic tests for the CPU cores 102 to 104 are similar to those shown in FIG. 22, and therefore their explanations are omitted.

Further, in the above explanations, an example where the state saving memory 27 and the scan test circuits 251 to 254 according to the fifth embodiment are applied to the fourth embodiment is explained. However, needless to say, they can be applied to any of the first to third embodiments. Further, needless to say, the state saving memory 27 and the scan test circuits 251 to 254 according to the fifth embodiment can also be applied to an embodiment that is obtained by combining two or more of the first to fourth embodiments, and the modified examples A and B of the fourth embodiment.

According to the fifth embodiment explained above, data that is successively output when the scan test is started is acquired by an amount corresponding to the length of the scan chain, and the acquired data is stored in the state saving memory 27. Further, the data stored in the state saving memory 27 is input to the scan chain when the scan test is finished. This feature can provide, in addition to the advantageous effects of the first to fourth embodiments, another advantageous effect that the need of the software processes executed in the CPU cores 101 to 104, such as the processes of the task interruption/finish and the task restoration/input, is eliminated. Therefore, as viewed from the standpoint of the overall processes performed in the CPU 30, the need for taking account of the periodically-performed diagnostic tests for the CPU cores 101 to 104 is eliminated.

Sixth Embodiment

Further, a configuration and an operation according to a sixth embodiment are explained with reference to the drawings.

The configurations and the operations of the CPU system 6, the CPU 30, the CPU cores 101 to 104, and the diagnostic test controller 26 according to the sixth embodiment are fundamentally similar to those according to the fifth embodiment. However, the execution of a diagnostic test for a CPU core in the sixth embodiment is different from that explained in the first embodiment with reference to FIG. 6.

Figure 23:
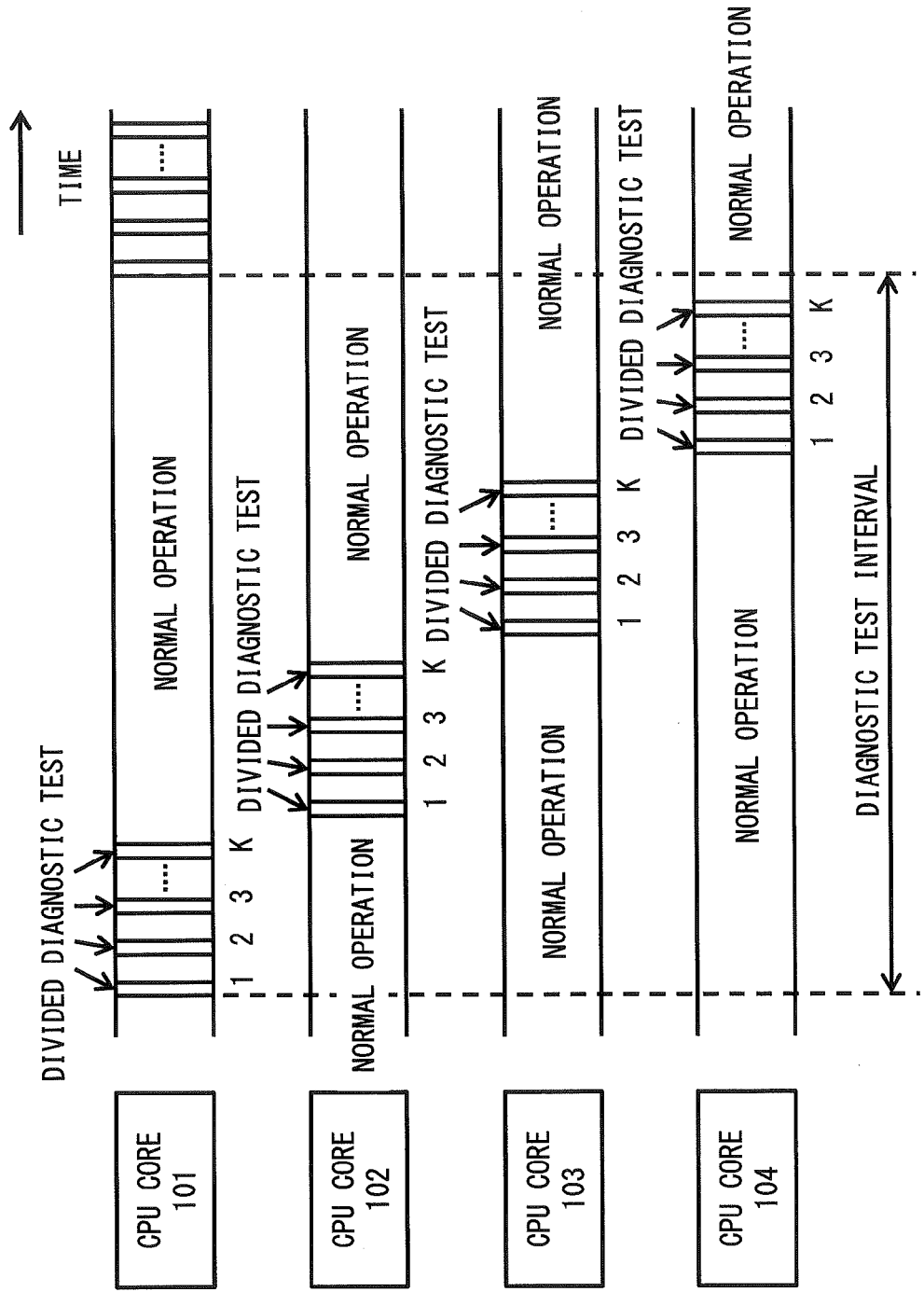
FIG. 23 is an explanatory diagram showing an execution state of a divided diagnostic test for each CPU core of a CPU in a sixth embodiment.

FIG. 23 shows an execution state of divided diagnostic tests for each of the CPU cores 101 to 104 of the CPU 30 according to the sixth embodiment. The sixth embodiment is characterized in that a diagnostic test for a CPU core is divided into K divided diagnostic tests and they are separately performed (K is an arbitrarily determined positive integer). Firstly, K divided diagnostic tests are successively performed for the CPU core 101, and then K divided diagnostic tests are successively performed for each of the CPU cores 102 to 104. As a result, the diagnostic tests for the four CPU cores 101 to 104 have been finished in a predetermined diagnostic test interval (or in a predetermined diagnostic test period). After that, similar diagnostic tests are continuously repeated.

That is, according to the sixth embodiment, the test data input circuit 222 and the test result comparison circuit 223 perform scan tests in the unit of data that is, for example, 1/K of all the test data stored in the FLASH memory 9. However, the number of test data in each divided diagnostic test does not necessarily have to be equal to each other. Further, the test data input circuit 222 holds information indicating which of the test data stored in the FLASH memory 9 the scan test has been already performed to when the scan test is finished, and performs (or resumes) the scan test from the subsequent test data based on that information in the next scan test.

Further, in this case, each of the CPU cores 101 to 104 uses different time periods for the first divided diagnostic test and for each of the second to K-th divided diagnostic tests as the elapsed-time threshold that is used for the difference between the time at the start of the previous divided diagnostic test indicated by the time information included in the flag information and the current time indicated by the time information acquired form the system timer 122. That is, as shown in FIG. 23, the elapsed-time threshold used for determining the start of the first divided diagnostic test is longer than that for determining the start of each of the second to K-th divided diagnostic tests.

For example, when one of the CPU cores 101 to 104 has finished the K-th divided diagnostic test and determines the start of the first divided diagnostic test in the next diagnostic test, that CPU core may use a time period expressed as "(diagnostic test interval−(diagnostic test interval×¼×(K−1)/K))" as the elapsed-time threshold. Further, for example, when one of the CPU cores 101 to 104 has finished one of the first to (K−1)th divided diagnostic tests and determines the start of the next divided diagnostic test, that CPU core may use a time period expressed as "(diagnostic test interval×¼×1/K)" as the elapsed-time threshold.

Figure 24:
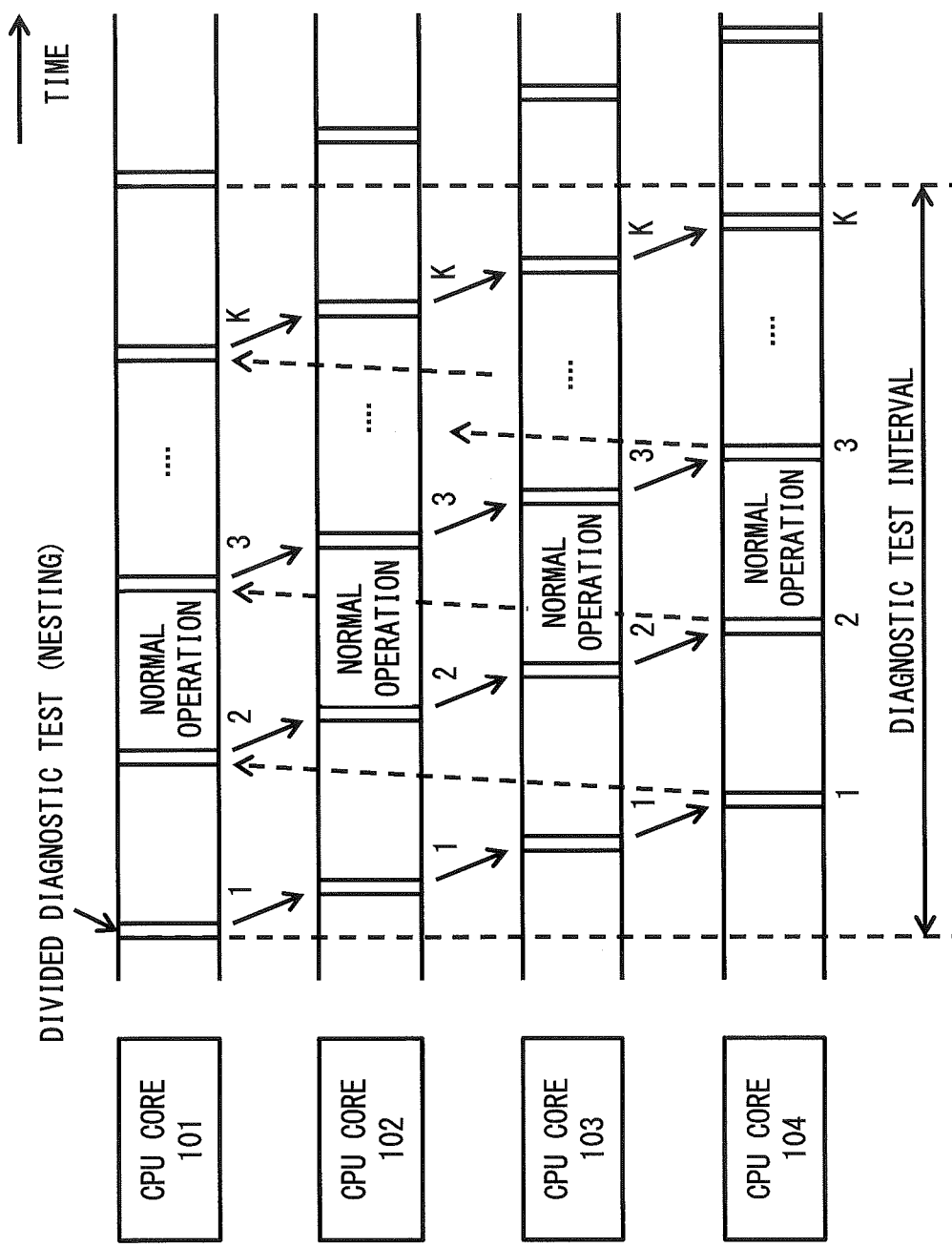
FIG. 24 is an explanatory diagram showing another example of an execution state of a divided diagnostic test for each CPU core of a CPU in the sixth embodiment.

FIG. 24 shows another example of an execution state of a divided diagnostic test for each of the CPU cores 101 to 104 of the CPU 30 according to the sixth embodiment. In this case, after the first divided diagnostic test for the CPU core 101 is performed, the first divided diagnostic test is also performed for each of the CPU cores 102 to 104. Then, the second divided diagnostic test is performed for the CPU core 101. As described above, the diagnostic test is advanced in such a manner that one divided diagnostic test is performed for each of the four CPU cores 101 to 104 in a cyclic manner. That is, the diagnostic test is performed in a nesting state.

Even in this case, the test data input circuit 222 and the test result comparison circuit 223 perform scan tests in the unit of data that is 1/K of all the test data stored in the FLASH memory 9. Further, as described above, the test data input circuit 222 records the progress state of the scan test.

Further, in this case, each of the CPU cores 101 to 104 uses the same time period (i.e., the time period having the same length as each other) for each of the first to K-th divided diagnostic tests as the elapsed-time threshold that is used for the difference between the time at the start of the previous divided diagnostic test indicated by the time information of the flag information and the current time indicated by the time information acquired form the system timer 122. For example, when one of the CPU cores 101 to 104 has finished a divided diagnostic test and determines the start of the next divided diagnostic test, it may use a time period expressed as "(diagnostic test interval×¼)" as the elapsed-time threshold.

Figure 25:
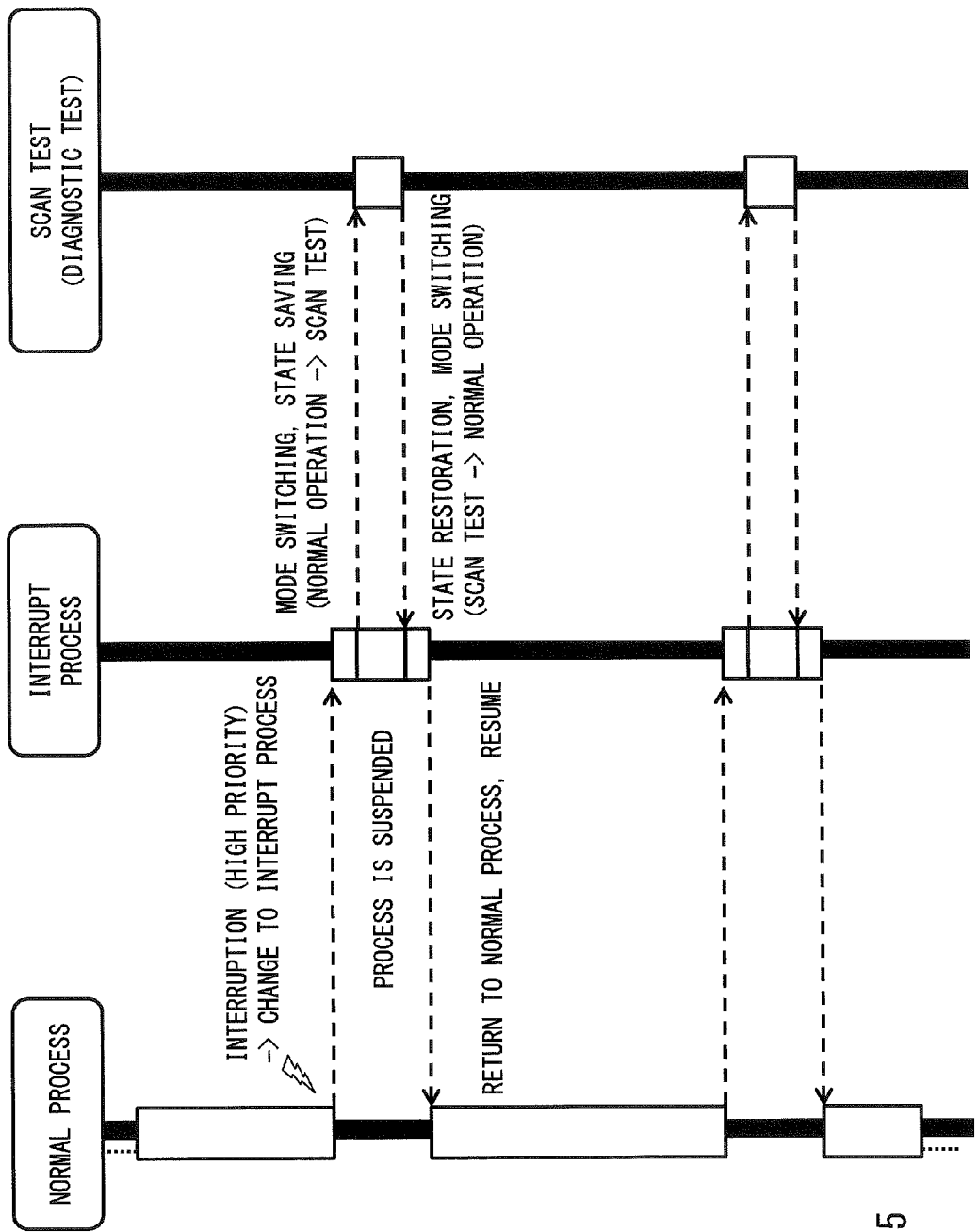
FIG. 25 is a flow diagram of a software process for performing a divided diagnostic test in the sixth embodiment.

FIG. 25 is a flow diagram of a software process for performing a divided diagnostic test according to the sixth embodiment. It can be understood that, in comparison to the flow diagram of the software processes for performing a diagnostic test explained in the fourth embodiment with reference to FIG. 18, the software processes of the task interruption or finish and the task restoration or input are eliminated by the use of the state saving memory 27. Further, since one divided diagnostic test, which is obtained by dividing a diagnostic test into K sections, is completed in a short time, the time during which the normal process is suspended due to the interrupt routine can also be shortened.

In general, by dividing the scan test pattern into a plurality of sections and performing them within interrupt routines in a divided manner as described above, it is possible to reduce the time required for one scan test to an amount (i.e., a length) equivalent to or less than the time required for each of various interruptions handled by the CPU system. Therefore, the suspension of the normal process due to the divided diagnostic test does not have any adverse effect in the processes for such original (or ordinary) interruptions.

Further, in general, in an operating system, for example, when a given CPU core is executing an interrupt process, other interruptions to that CPU core are prohibited from being accepted. Further, it is brought into a state where interruptions to the other CPU cores are prohibited. In contrast to this, according to the above-described divided diagnostic test, since the CPU core can immediately return from the interrupt process to the normal process, the execution of the original (or ordinary) interruption process performed by the CPU core is not hindered.

According to the sixth embodiment explained above, the CPU core returns from an interrupt process every time a divided diagnostic test (divided scan test) that is obtained by dividing a diagnostic test into a plurality of sections is finished. That is, the CPU core interrupts the execution of a task when the CPU core starts a divided scan test, and resumes the execution of the task when the CPU core finishes the divided scan test. In contrast to this, the diagnostic test controller 26 diagnoses a CPU core by supplying, every time a divided scan test is performed, divided test data, which is obtained by dividing a plurality of input test data stored in the FLASH memory 9 into a predetermined number of sections, one by one. That is, it is possible to complete a divided diagnostic test for a CPU core in a short time. This feature can provide, in addition to the advantageous effects of the fifth embodiment, another advantageous effect that the diagnostic test for the CPU core can be concealed in the sense that the effect to the overall process of the CPU system is not apparently observed.

Further, in the above explanations, an example where the diagnostic test execution according to the sixth embodiment is applied to the fifth embodiment is explained. However, needless to say, it can be applied to any of the first to fourth embodiments, and the modified examples A and B of the fourth embodiment. Further, needless to say, the diagnostic test execution according to the sixth embodiment can also be applied to an embodiment that is obtained by combining two or more of the first to fifth embodiments, and the modified examples A and B of the fourth embodiment.

However, in particular, the diagnostic test execution according to the sixth embodiment is preferably applied to an embodiment in which the diagnostic test execution according method according to the modified example A of the fourth embodiment. In the diagnostic test execution according method according to the modified example A of the fourth embodiment, the CPU core finishes a scan test in a divided diagnostic test (divided scan test) within an interrupt routine with some software processes included before and after the diagnostic test. This feature can provide an advantageous effect that the effect on the overall process of the CPU system caused by the diagnostic test of the CPU core can be reduced as described above. According to this feature, the process for one divided diagnostic test can be completed within a time equivalent to or less than the time required for each of various interruptions handled by the CPU system. Therefore, it is possible to prevent the execution of the divided diagnostic test from hindering the execution of the original (or ordinary) interruption process performed by the CPU core Further, when the divided diagnostic test execution according to the sixth embodiment is applied to an embodiment in which the diagnostic test execution according method according to the modified example B of the fourth embodiment, information of the diagnostic test interval (shown in FIG. 23 or 24) (the period in which K divided diagnostic tests for every CPU core are completed), information of the timings for the divided diagnostic tests for each CPU core that are performed during that period (the lapsed time from the start timing of the diagnosis test interval), and so on are set in advance in a register(s) of the diagnostic test trigger circuit 43 from the CPU 20 through the system bus. This makes it possible to provide a trigger interruption to a desired CPU core through the interrupt controller 121 at the (first to K-th) execution timings of the divided diagnostic tests for each CPU core as shown in FIG. 23 or 24.

Note that even in this case, the CPU system may be configured so that an interrupt signal is output form the diagnostic test trigger circuit 43 to the CPU core 101 only at the execution start timing of the first divided diagnostic tests in the diagnostic test interval and the sequence control for performing the subsequent divided diagnostic tests for the CPU core 101 and those for the other CPU cores 102 to 104 are performed by using a different method as in the case of the above-described example.

Seventh Embodiment

Further, a configuration and an operation according to a seventh embodiment are explained with reference to the drawings.

Figure 26:
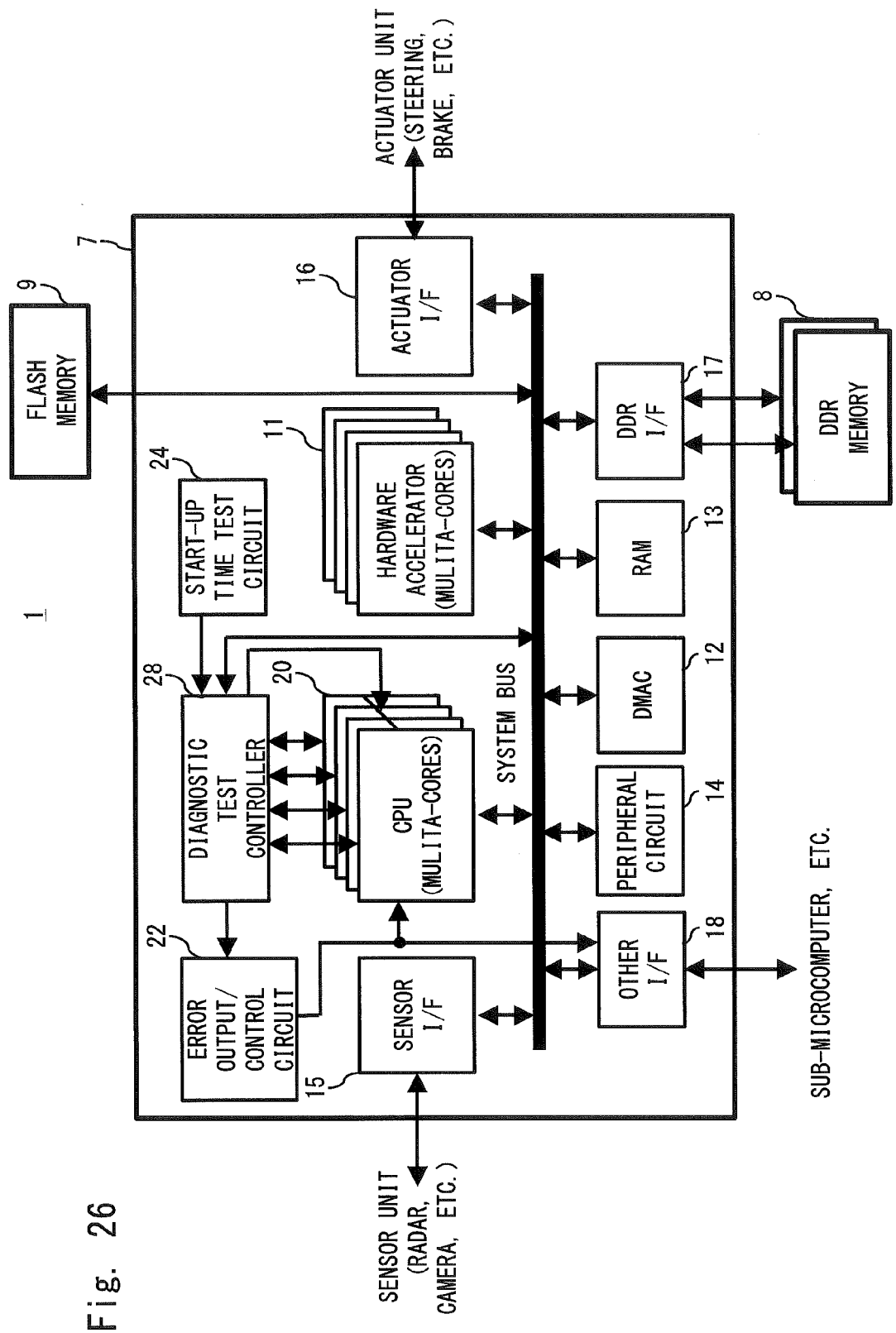
FIG. 26 is a block diagram showing a configuration of a CPU system according to a seventh embodiment.

FIG. 26 is a block diagram showing a configuration of a CPU system 7 according to the seventh embodiment. The difference from the CPU system 5 according to the fourth embodiment shown in FIG. 16 lies in that the FLASH memory 9, which is the external memory for storing test data, is not directly connected to the diagnostic test controller 26 but is indirectly connected (to the diagnostic test controller 26) through the system bus in the CPU system 7.

Figure 27:
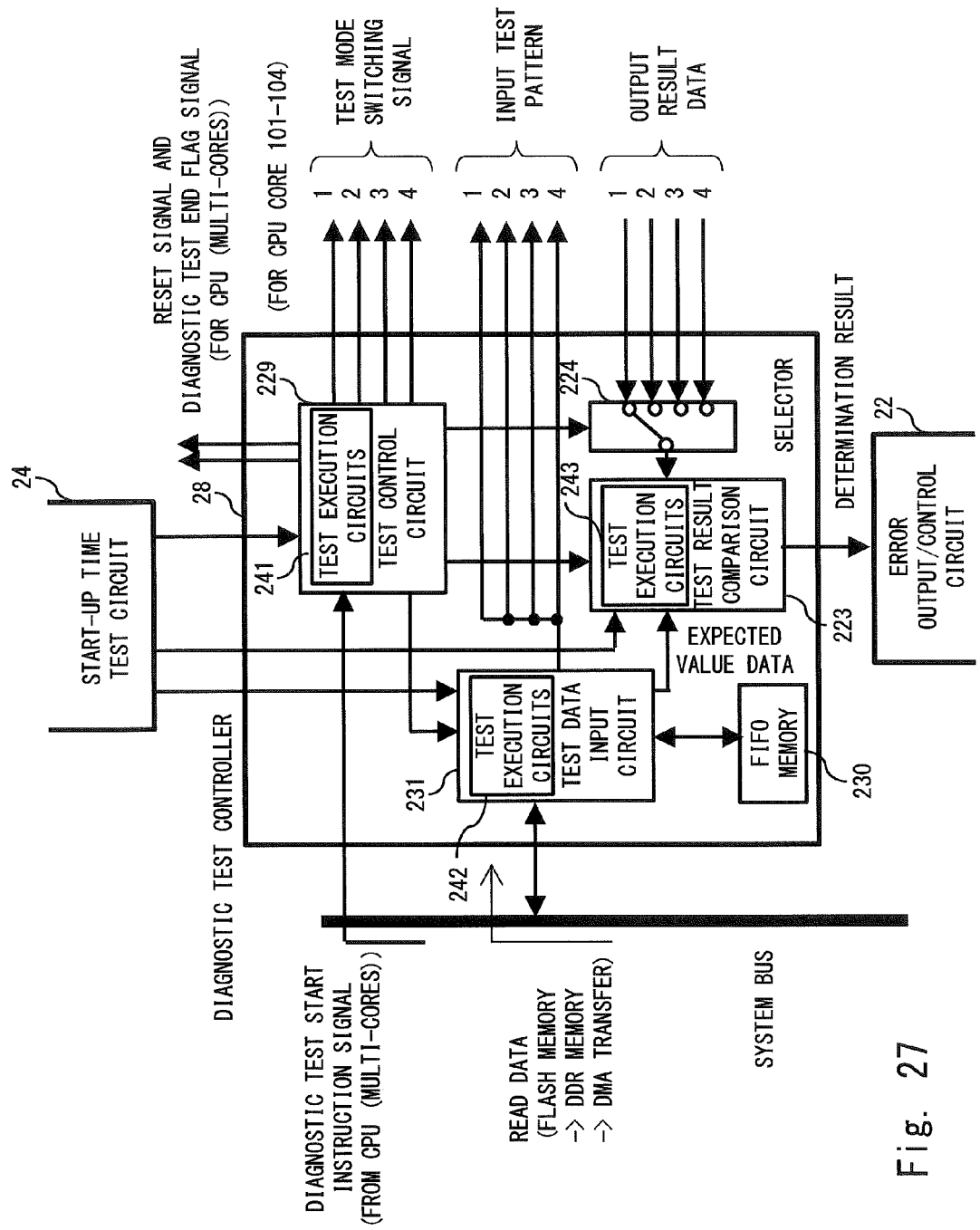
FIG. 27 is a block diagram showing a configuration of a diagnostic test controller shown in FIG. 26.

FIG. 27 is a block diagram showing a configuration of a diagnostic test controller 28 shown in FIG. 26. When the CPU system 7 is started up, the DMAC 12 transfers all the test data from the FLASH memory 9 storing the test data to the external high-speed large-capacity DDR memory 8. Note that the programs that are executed by the CPU cores 101 to 104 may be also stored in the FLASH memory 9 in advance and these programs may also be transferred to the DDR memory 8 together with the test data at the same time.

Further, the DMAC 12 transfers test data that is required when diagnostic tests (fault diagnoses by scan tests) for the CPU cores are performed from the DDR memory 8 to the control circuit for the scan tests (i.e., the diagnostic test controller 28). (Hereinafter, transfers performed by using the DMAC are called "DMA-transfers".) In the seventh embodiment, a test data input circuit 231 of the diagnostic test controller 28 includes an I/F with the system bus. The test data input circuit 231 receives DMA-transferred test data and supplies patterns to the CPU cores.

The system bus in the CPU system 7 is an internal bus which has a high bandwidth and through which various data are transferred. The bus access for the system bus for various access operations is arbitrated based on their priorities and/or timing regulations. Therefore, there is some degree of variations in the timings at which each of a plurality of test data for diagnostic tests is DMA-transferred to the diagnostic test controller 28 through this system bus. The CPU system 7 includes a small-capacity FIFO memory 230 that absorbs these timing variations, thus enabling access from the test data input circuit 231.

That is, when a scan test is executed, the DMAC 12 successively DMA-transfers test data stored in the DDR memory 8 to the FIFO memory 230 of the test data input circuit 231. Then, the diagnostic test controller 28 successively acquires the test data (input test patterns) stored in the FIFO memory 230 and supplies them to the scan chains of the CPU cores 101 to 104.

Typically, when the seventh embodiment is applied to the second embodiment, the FIFO memory 230 needs to have only a capacity in which one set of input pattern data (8-bit data×N) explained above with reference to FIG. 12 can be stored. Alternatively, the FIFO memory 230 may be a double-buffer type memory capable of storing two sets of input pattern data. In this case, the last cumulative expected value data (e.g., 24 bits) is not stored in this FIFO memory 230 and the DDR memory 8. For example, when the CPU system 7 is started up, the test data input circuit 231 may read the last cumulative expected value data from the FLASH memory 9 and store the read cumulative expected value data in its own register (not shown). Further, the CPU 20 may read it from the FLASH memory 9 and set it in a register of the test data input circuit 231. However, the present invention is not necessarily limited to the above-described configuration in which the cumulative expected value data is not stored in the FIFO memory 230 and the DDR memory 8. The CPU system may be configured so that the cumulative expected value data is DMA-transferred to the test data input circuit 231 through the DDR memory 8 as in the case of the other test data.

Further, in the above explanations, an example where the test data transfer method according to the seventh embodiment is applied to the fourth embodiment is explained. However, needless to say, it can be applied to any of the first to third, fifth, and sixth embodiments, and the modified examples A and B of the fourth embodiment. Further, needless to say, the test data transfer method according to the seventh embodiment can also be applied to an embodiment that is obtained by combining two or more of the first to sixth embodiments, and the modified examples A and B of the fourth embodiment.

According to the seventh embodiment explained above, as a form of connection of the FLASH memory 9 storing test data to the system bus, a plurality of input test data stored in the FLASH memory 9 are DMA-transferred to the DDR memory 8 through the system bus when the CPU system 7 is started up. Then, the plurality of input test data stored in the DDR memory 8 are successively DMA-transferred to the diagnostic test controller 28. Further, the diagnostic test controller 28 includes the FIFO memory 230 that temporarily stores a part of the input test pattern transferred by the DMA controller, and supplies the input test pattern stored in the FIFO memory 230 to the scan chains of the CPU cores 101 to 104. This feature can provide, in addition to the advantageous effects of the first to sixth embodiments, and the modified examples A and B of the fourth embodiment, another advantageous effect that the above-described feature can also be used for the FLASH memory 9 for storing ordinary programs (for example, a necessary program is transferred to the external DDR memory 8 upon start-up and the program is read from the DDR memory 8 during the operation). Further, even in such cases, a scan test can be performed without being affected by the delay of transfers through the system bus.

Eighth Embodiment

Further, a configuration and an operation according to an eighth embodiment are explained with reference to the drawings.

Figure 28:
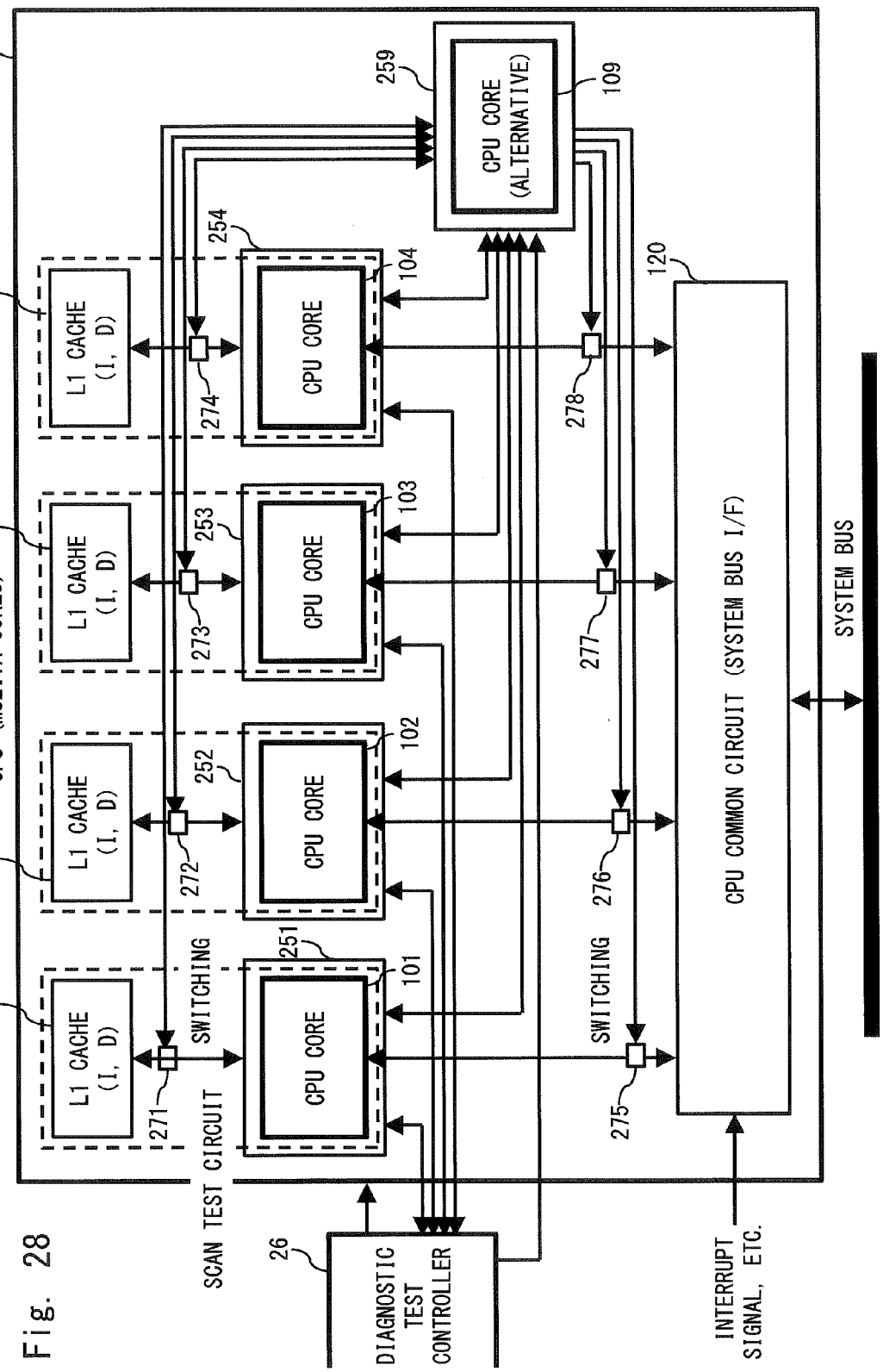
FIG. 28 is a block diagram showing a configuration of a CPU according to an eighth embodiment.

FIG. 28 is a block diagram showing a configuration of a CPU 40 according to the eighth embodiment. The difference from the CPU 30 explained in the fifth embodiment with reference to FIG. 20 lies in that, instead of externally providing the state saving memory 27 capable of saving the FF state held by one of the CPU cores, an alternative CPU core 109 that can take over the normal operation of one of the CPU cores by transferring the FF state held by that CPU core is provided inside the CPU 40. Selectors 271 to 274 are added in the input/output signal lines between the CPU cores 101 to 104 and the L1 caches 111 to 114, respectively. Further, selectors 275 to 278 are added in the input/output signal lines between the CPU cores 101 to 104, respectively, and the CPU common circuit 120.

The selector 271 switches the connection destination of the L1 cache 111 to either the CPU core 101 or the CPU core 109. The selector 272 switches the connection destination of the L1 cache 112 to either the CPU core 102 or the CPU core 109. The selector 273 switches the connection destination of the L1 cache 113 to either the CPU core 103 or the CPU core 109. The selector 274 switches the connection destination of the L1 cache 114 to either the CPU core 104 or the CPU core 109.

The selector 275 switches the connection destination of the CPU common circuit 120 to either the CPU core 101 or the CPU core 109. The selector 276 switches the connection destination of the CPU common circuit 120 to either the CPU core 102 or the CPU core 109. The selector 277 switches the connection destination of the CPU common circuit 120 to either the CPU core 103 or the CPU core 109.

The selector 278 switches the connection destination of the CPU common circuit 120 to either the CPU core 104 or the CPU core 109.

Further, the operations and the configurations of the scan test circuits 251 to 254 according to the eighth embodiment are similar to those of the scan test circuits 251 to 254 according to the fifth embodiment. However, the connection destination of the select circuit 215 and the distribution circuit 216 is not the state saving memory 27 but is the CPU core 109.

An alternative control circuit 259 receives the input of a test mode switching signal from the test control circuit 229 of the diagnostic test controller 26. The alternative control circuit 259 recognizes the start of a scan test by the input of a test mode switching signal indicating the switching to a test mode supplied from the test control circuit 229, acquires data output from the CPU core after the scan test is started by an amount corresponding to the size of the scan chain by using the distribution circuit 216, and stores the acquired data into the scan chain of the CPU core 109. Further, in response to the input of the test mode switching signal from the test control circuit 229, the CPU core 109 switches the connection destination of one of the selectors 271 to 278 corresponding to the CPU core to be diagnostically-tested from the CPU core to be diagnostically-tested to the CPU core 109. As a result, the CPU core 109 takes over and executes the process of the CPU core to be diagnostically-tested based on the data stored in the scan chain of the CPU core 109. Further, in this process, the CPU core 109 can advance the process by accessing the L1 cache associated with the CPU core to be diagnostically-tested and the CPU common circuit 120 on behalf of the CPU core to be diagnostically-tested.

Further, the alternative control circuit 259 monitors the progress state of the scan test by, for example, the scan clock and switches the connection destination of the select circuit 215 to the CPU core 109 at a timing at which the input of all the input test patterns have been finished. Then, the alternative control circuit 259 successively supplies the data saved in the scan chain of the CPU core 109 to the diagnostically-tested CPU core through the select circuit 215. That is, the alternative control circuit 259 restores the data from the CPU core 109 into the scan chain of the diagnostically-tested CPU core by using the drive period of the scan chain that starts when the input of the all the input test patterns have been finished and ends when the last output result data is taken out. According to this feature, the diagnostically-tested CPU core can take over the process that the CPU core 109 has performed on behalf of that CPU core.

Figure 29:
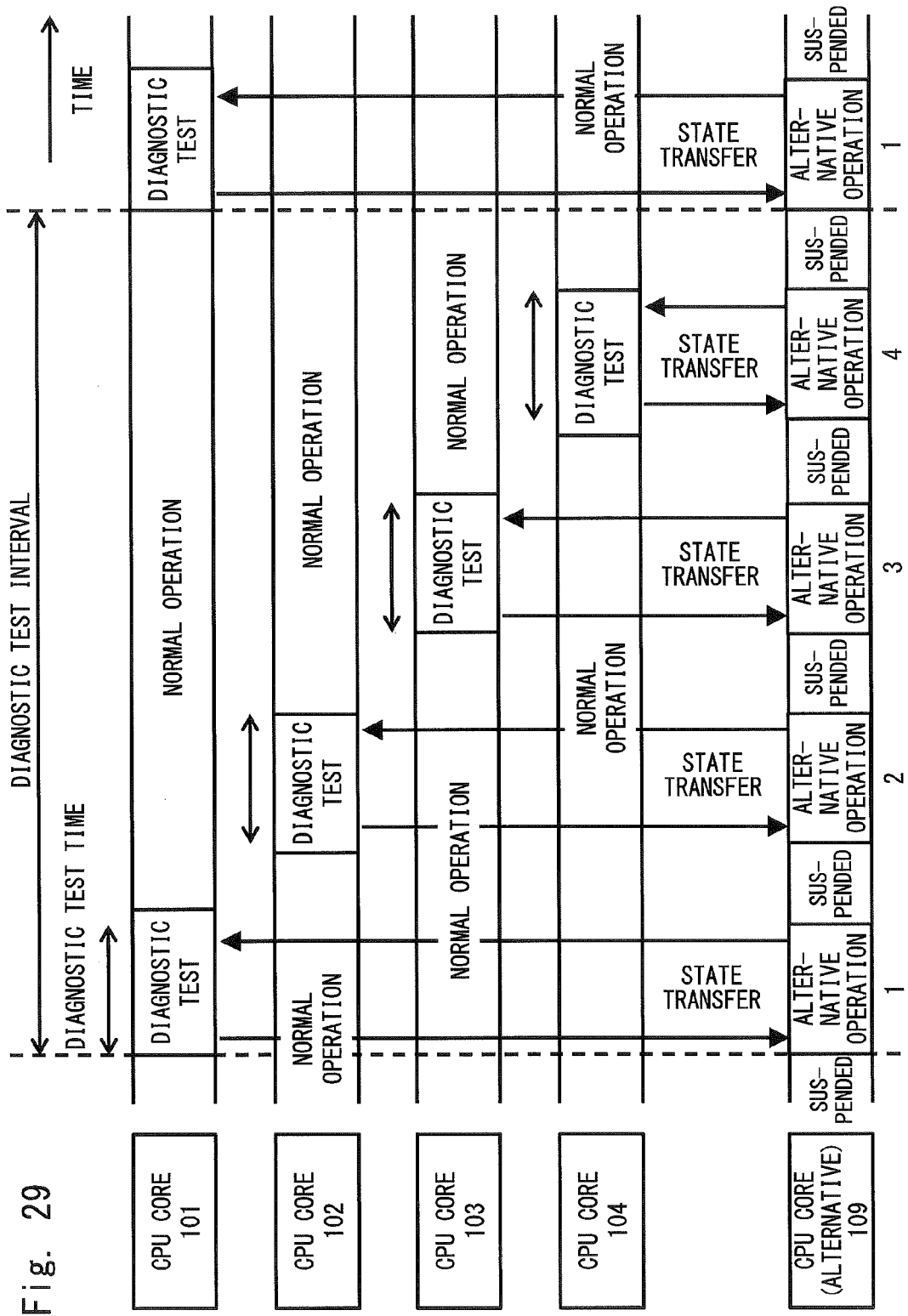
FIG. 29 is an explanatory diagram showing an execution state of a diagnostic test for each CPU core of the CPU shown in FIG. 28.

FIG. 29 shows an execution state of a diagnostic test for each of the CPU cores 101 to 104 of the CPU 40 shown in FIG. 28. When compared to the execution state of a diagnostic test explained in the first embodiment with reference to FIG. 6, the eighth embodiment has the additional CPU core 109 that takes over the normal operation of one of the CPU cores 101 to 104 when the operation of that CPU core is switched to a diagnostic test operation (a fault diagnosis by a scan test). It can be understood that the internal FF state of one of the CPU cores 101 to 104 can be transferred to the CPU core 109 and its normal operation can be thereby continued (alternative operation). At this point, the connection destinations of (one of) the L1 caches 111 to 114 that is directly connected to that CPU core to be diagnostically-tested, the CPU common circuit 120, and so on are switched to the CPU core 109.

Upon completing the diagnostic test operation, the FF state is returned from the CPU core 109 to the original CPU core and the normal operation of that CPU core is continued in the original state. When the CPU core 109 does not need to be operated, its operation is stopped during that period. Note that the signal line length of the path through which the CPU core 109 exchanges data with the L1 cache or the DMAC 12 through the selector becomes longer than that of the path through which the original CPU core exchanges data with the L1 cache or the DMAC 12. Therefore, the frequency in the alternative operation in the CPU core 109 is preferably lowered according to this path length difference. That is, the operating frequency of the CPU core 109 is preferably lower than that of the CPU cores 101 to 104.

Further, the above-described CPU core 109, the scan test circuits 251 to 254, and the alternative control circuit 259 according to the eighth embodiment can also be applied to any of the first to fourth, sixth, and seventh embodiments, and the modified examples A and B of the fourth embodiment, provided that they are not inconsistent with the fifth embodiment. Further, needless to say, the CPU core 109, the scan test circuits 251 to 254, and the alternative control circuit 259 according to the eighth embodiment can also be applied to an embodiment that is obtained by combining two or more of the first to fourth, sixth, and seventh embodiments, and the modified examples A and B of the fourth embodiment.

According to the eighth embodiment explained above, data that is successively output after a scan test is started is acquired by an amount corresponding to the length of the scan chain and stored in the scan chain of the alternative CPU core 109. Then, the alternative CPU core 109 performs the process of the CPU core to be scan-tested on behalf of that CPU core based on the data stored in the scan chain of the CPU core 109. This feature can provide, in addition to the advantageous effects of the first to fourth, sixth, and seventh embodiments, and the modified examples A and B of the fourth embodiments, another advantageous effect that the deterioration in the performance due to the execution of a diagnostic test for a CPU core can be significantly reduced.

Ninth Embodiment

Further, a configuration and an operation according to a ninth embodiment are explained with reference to the drawings.

Figure 30:
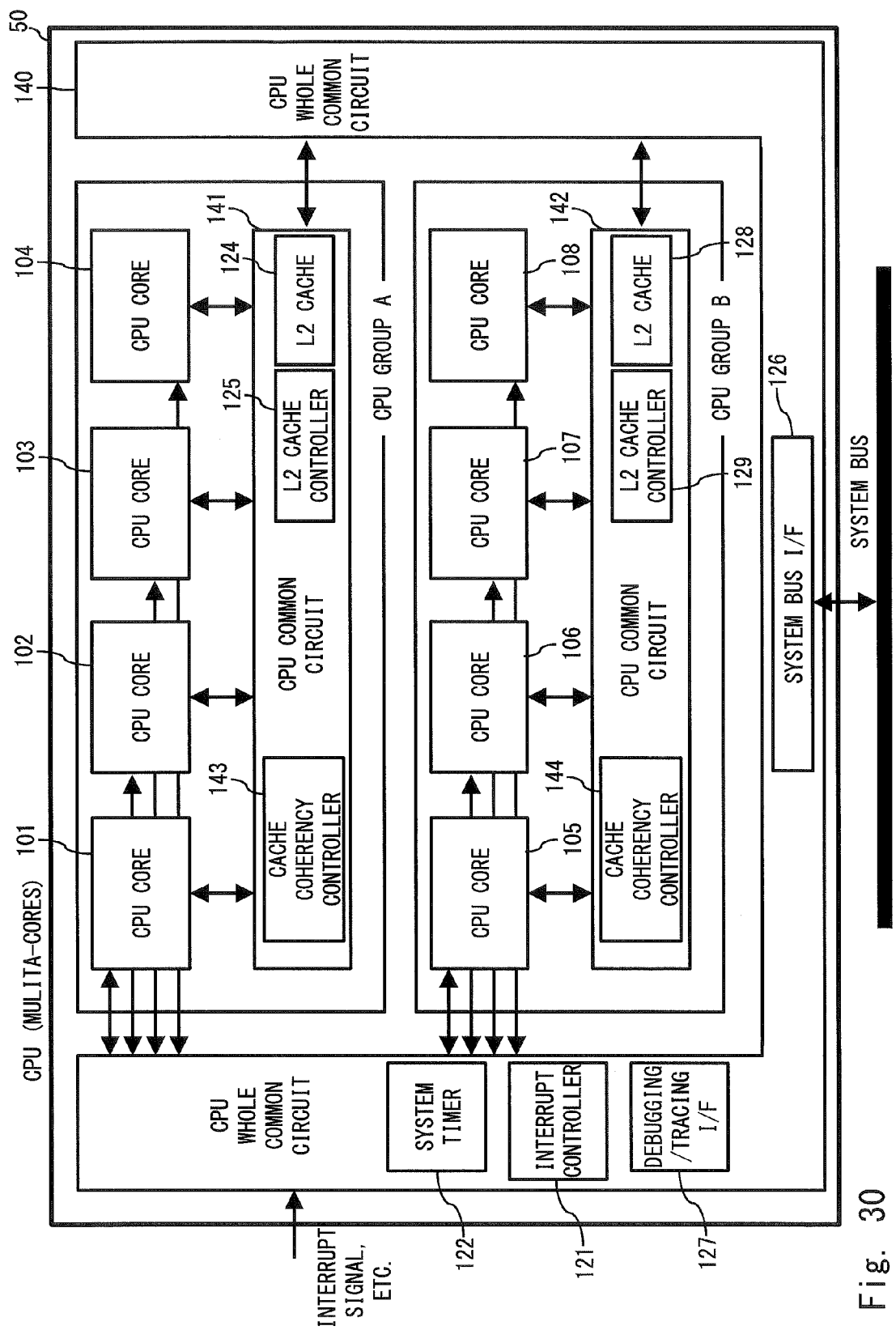
FIG. 30 is a block diagram showing a configuration of a CPU of another example of a CPU system that achieves high operation performance.

A case where a CPU 60 according to this embodiment is applied to the CPU system 3 according to the first embodiment is explained. FIG. 30 is a block diagram showing a configuration of a CPU 50 of another example of the CPU system 2 that achieves high operation performance. The CPU 10 in the CPU system 2 shown in FIG. 2 includes the four CPU cores 101 to 104 and the CPU common circuit 120. In contrast to this, the CPU 50 has a configuration that is obtained by doubling the configuration of the CPU 10. The CPU 50 includes two CPU groups each of which includes four CPU cores and a CPU common circuit, and also includes a CPU whole common circuit 140. Note that the illustration of the L1 caches (L, D) associated with their respective CPU cores 101 to 108 is omitted.

The CPU 50 includes the CPU cores 101 to 108, the CPU whole common circuit 140, and the CPU common circuits 141 and 142. The CPU whole common circuit 140 includes an interrupt controller 121, a system timer 122, and a debugging/tracing I/F 127. The CPU common circuit 141 includes an L2 cache 124, an L2 cache controller 125, and a cache coherency controller 143. The CPU common circuit 142 includes an L2 cache 128, an L2 cache controller 129, and a cache coherency controller 144. The CPU cores 101 to 104 and the CPU common circuit 141 are included in a group A, and the CPU cores 105 to 108 and the CPU common circuit 142 are included in a group B.

Fundamentally, the CPU cores 105 to 108 operate in a similar manner to the CPU cores 101 to 104. However, the CPU cores 105 to 108 are smaller than the CPU cores 101 to 104 and hence have power consumptions lower than those of the CPU cores 101 to 104. For example, the CPU 50 executes a task that requires high processing performance by using the CPU cores 101 to 104 and executes a task that does not requires high processing performance by using the CPU cores 105 to 108. By doing so, the CPU 50 can provide required performance when the process requires high processing performance while reducing the power consumption.

The L2 cache 124 and the L2 cache controller 125 according to the ninth embodiment are similar to those in the first embodiment. The L2 cache 128 and the L2 cache controller 129 according to the ninth embodiment are similar to the L2 cache 124 and the L2 cache controller 125, respectively, according to the first embodiment, except that the L2 cache 128 and the L2 cache controller 129 are used for the CPU cores 105 to 108.

The cache coherency controllers 143 and 144 according to the ninth embodiment establish the cache coherency of the L1 caches as in the case of the cache coherency controller 123 according to the first embodiment. The cache coherency controller 143 controls the L1 caches of the CPU cores 101 to 104. The cache coherency controller 144 controls the L1 caches of the CPU cores 105 to 108. Further, in contrast to the cache coherency controller 123, the cache coherency controllers 143 and 144 also establish the cache coherency of the L1 caches and the L2 caches 124 and 128 between the CPU groups. For example, when data writing is performed at an address in the address area of the RAM 13 by one of the CPU cores 105 to 108 of the CPU group B, the cache coherency controller 143 invalidates data stored at that address of the L1 caches associated with the CPU cores 101 to 104 and the L2 cache 124.

The system bus I/F 126, the interrupt controller 121, the system timer 122, and the debugging/tracing I/F 127 according to the ninth embodiment are fundamentally similar to those in the first embodiment. However, in the ninth embodiment, the interrupt controller 121 and the system timer 122 can generate an interruption for the CPU cores 105 to 108.

Figure 31:
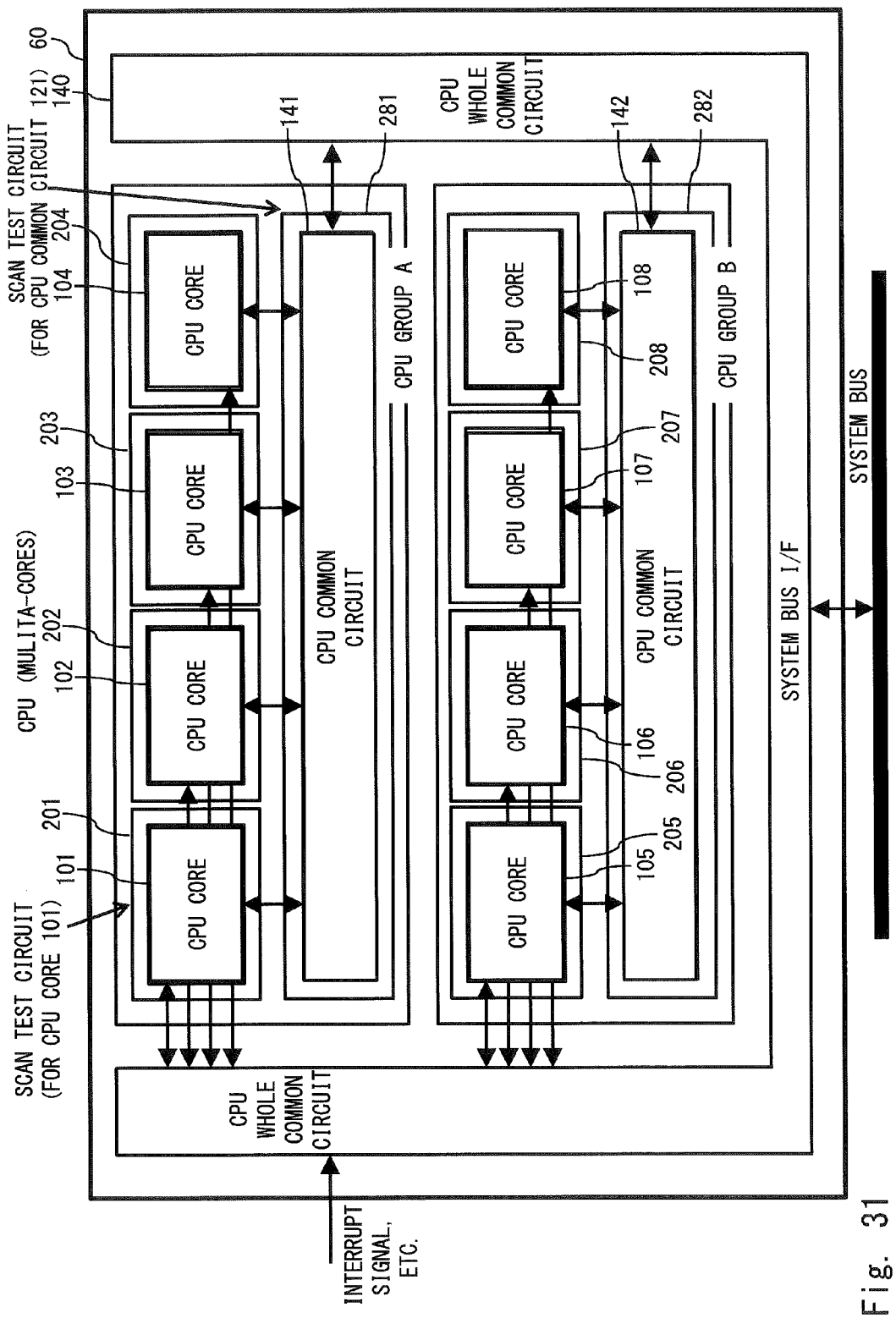
FIG. 31 is a block diagram showing a configuration of a CPU according to a ninth embodiment.

FIG. 31 is a block diagram showing a configuration of the CPU 60 of the CPU system 3 according to the ninth embodiment. The CPU 60 is obtained by adding scan test circuits 201 to 204 and scan test circuits 205 to 208 in the CPU cores 101 to 104 of the CPU group A and the CPU cores 105 to 108 of the CPU group B, respectively, and adding scan test circuits 281 and 282 in the CPU common circuit 141 of the CPU group A and the CPU common circuit 142 of the CPU group B, respectively, in the CPU 50 shown in FIG. 30. These scan test circuits 281 and 282 are individually connected to the diagnostic test controller 21, and the scan tests in these scan test circuits 281 and 282 are controlled by the diagnostic test controller 21. That is, in the diagnostic test controller 21 according to the ninth embodiment, a reset signal, a flag signal, a test mode switching signal, an input test pattern can also be output to the CPU cores 105 to 108 and the CPU common circuits 141 and 142. Further, the selector 224 of the diagnostic test controller 21 can select an output result data from the CPU cores 105 to 108 and the CPU common circuits 141 and 142. Note that similarly to the example shown in FIG. 30, the illustration of the L1 caches (L, D) associated with their respective CPU cores 101 to 108 is omitted.

The scan test circuits 201 to 204 according to this embodiment are similar to those in the first embodiment. The scan test circuits 205 to 208 are similar to the scan test circuits 201 to 204. However, the scan test circuits 205 to 208 control the CPU cores 105 to 108, respectively.

Further, similarly to the scan test circuits 201 to 204, each of the scan test circuits 281 and 282 includes a scan data compression circuit 212 and a scan data expansion circuit 211. However, the scan data expansion circuit 211 and the scan data compression circuit 212 expand or contract data according to the number of scan chains included in each of the CPU common circuits 141 and 142. Note that one of the examples of the method for performing a fault diagnosis of the CPU whole common circuit 140 is to make its circuit redundant. Note that a comparison circuit for checking the match between (a plurality of) output signals of the redundant circuits may be provided. Then, when at least one of the output signals does not match the counterpart output signal, a notification signal indicating a failure in the CPU whole common circuit 140 may be output.

Figure 32:
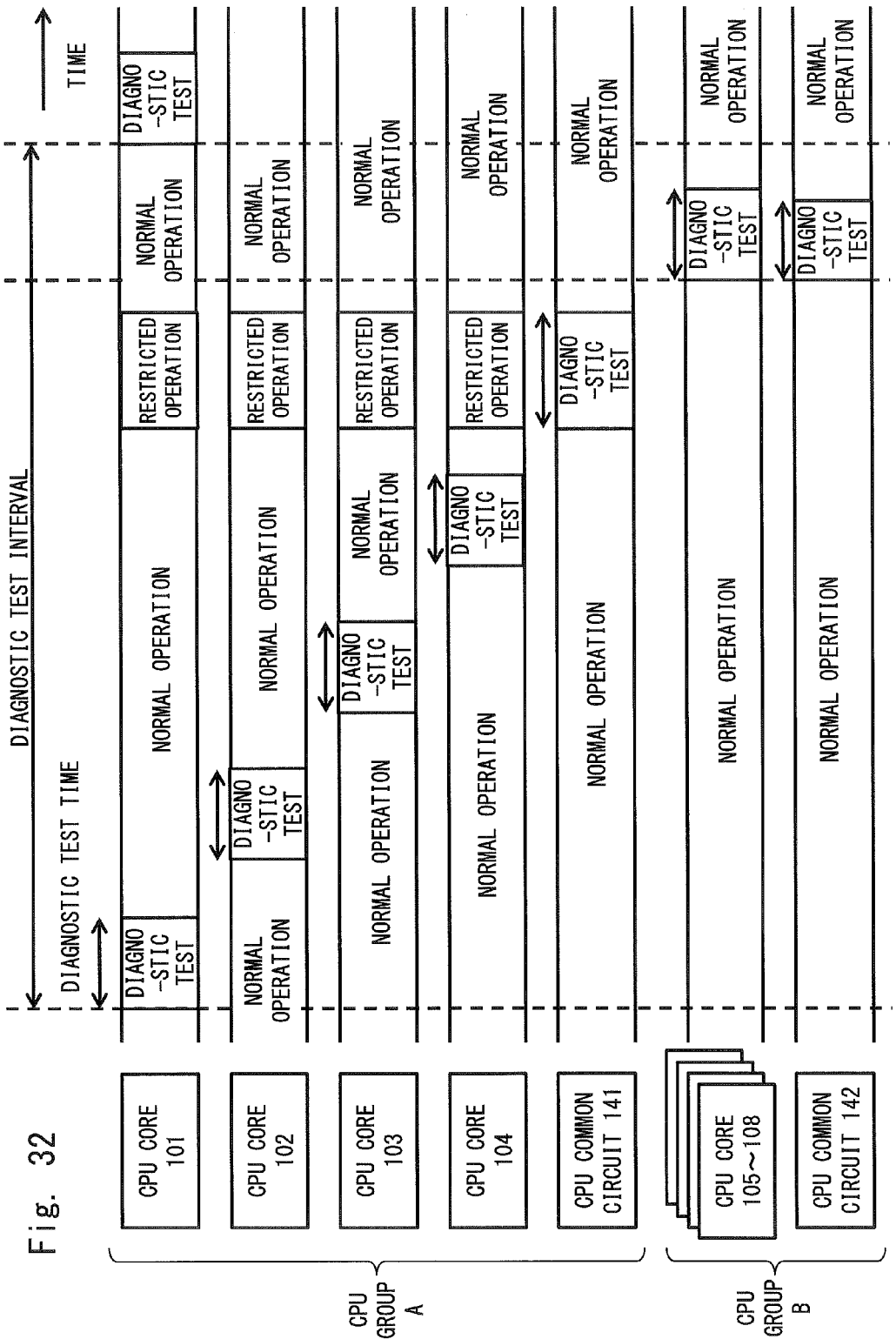
FIG. 32 is an explanatory diagram showing an execution state of a diagnostic test of the CPU shown in FIG. 31.

FIG. 32 shows an execution state of a diagnostic test for the CPU 60 shown in FIG. 31. In the multi-core architecture CPU system 3 including a plurality of CPU cores 101 to 108 and a plurality of CPU groups, fault diagnoses for individual CPU cores are performed on a periodic basis while successively selecting the CPU cores 101 to 108 of the CPU groups A and B as in the case of the first embodiment. However, the ninth embodiment is characterized in that one of the CPU groups is selected one by one at a predetermined timing and a fault diagnose is also performed for the CPU common circuit 141 or 142. It is possible to perform fault diagnoses for the CPU common circuits 141 and 142, which are excluded from the circuits for which fault diagnoses are performed in the first embodiment, as well as a fault diagnosis for each of the CPU cores 101 to 108 by using high-speed hardware scan tests.

The diagnostic tests for each of the CPU cores 101 to 108 and for the CPU common circuits 141 and 142 (fault diagnoses by scan tests) shown in FIG. 32 are merely an example. It should be noted that when the diagnostic test for the CPU common circuit 141 in the CPU group A is performed at a timing different from that for the CPU cores 101 to 104, there is a restriction that each operating CPU core cannot communicate with the system bus at that timing. Therefore, the CPU system may be configured so that the CPU cores 101 to 104 perform predetermined restricted operations when a diagnostic test is performed for the CPU common circuit 141. For example, the processes in the CPU cores 101 to 104 may be suspended.

Further, as shown in FIG. 32, for example, a diagnostic test for the CPU common circuit 142 in the CPU group B can be performed at the same timing as that for one of the CPU cores 105 to 108. That is, since each of the CPU cores 105 to 108 cannot communicate with the system bus at that timing, diagnostic tests for all the CPU cores 105 to 108 may be performed simultaneously with the diagnostic test for the CPU common circuit 142.

Note that since all of four CPU cores included in each CPU group are identical with each other, their test data necessary for their diagnostic tests are identical with each other. However, since the CPU common circuit is a circuit different from those for the CPU cores, its test data necessary for its diagnostic test is different from those for the CPU cores. That is, the amount of data and the diagnostic test time for the CPU common circuit are different from those for the CPU cores. When diagnostic tests for the plurality of CPU cores 105 to 108 and for the CPU common circuit 142 are performed at the same timing as each other, it is necessary to conform the configuration and the operation of the diagnostic test controller 21 to their degree of parallelization. That is, the test data input circuit 222, the test result comparison circuit 223, and the selector 224 are separately provided for the CPU cores 104 to 108 and for the CPU common circuit 142.

Note that as shown in FIG. 32, the diagnostic test controller 21 performs scan tests for the CPU common circuits 141 and 142 in a predetermined order on a periodic basis so that the execution time periods (execution periods) of the scan tests for these CPU common circuits do not overlap each other. The diagnostic test controller 21 performs scan tests for the CPU common circuits 141 and 142 at same diagnostic test intervals (i.e., regular diagnostic test intervals) on a periodic basis so that the execution time periods (execution periods) of the scan tests are less likely to overlap each other. The diagnostic test interval is also defined to an arbitrary value equal to or less than the FTTI (e.g., 0.1 s). The diagnostic test intervals for the CPU common circuits 141 and 142 do not necessarily have to be regular intervals (diagnostic test period×½), provided that they do not overlap each other. However, the diagnostic test times for the CPU common circuits 141 and 142 are preferably shifted from one another at regular intervals so that the bias in the performances due to the timings of the execution time periods (execution periods) of the diagnostic test (i.e., the bias in the performances that is caused because the diagnostic test execution periods are too close to each other or too far away from each other) can be reduced.

Further, in the above explanations, an example where the CPU 60 and its diagnostic test execution method according to the ninth embodiment are applied to the first embodiment is explained. However, needless to say, they can be applied to any of the second to eighth embodiments, and the modified examples A and B of the fourth embodiment. Further, needless to say, the CPU 60 and its diagnostic test method according to the ninth embodiment can also be applied to an embodiment that is obtained by combining two or more of the first to eighth embodiments, and the modified examples A and B of the fourth embodiment. For example, when they are applied to the fourth embodiment, the CPU cores 101 to 104 belonging to the CPU group A, to which the CPU common circuit 141 also belongs, may output the diagnostic test start signal for the CPU common circuit 141 to the diagnosis test controller 26 on behalf of the CPU common circuit 141. This also holds true for the CPU group B.

According to the ninth embodiment explained above, the respective scan tests for the CPU common circuits 141 and 142 are performed in a predetermined order on a periodic basis so that the execution time periods (execution periods) of the scan tests do not overlap each other. This feature can provide, in addition to the advantageous effects of the previously-explained embodiments, another advantageous effect that the target of diagnostic tests in the CPU can be broadened and fault diagnoses can also be carried out for the CPU common circuits 141 and 142 as well as for the CPU cores 101 to 108.

Other Embodiments

Finally, other embodiments (variations) are explained hereinafter.

In each of the above-shown embodiments, a compression scan method is used as a scan test and the relation "the number of inputs>the number of outputs" holds. However, various variations are conceivable as a method for performing a fault diagnosis by performing a hardware scan test. When a compression scan method is applied, the system can be configured so that a relation "the number of inputs=the number of outputs" holds. Further, a normal scan test (in which the number of inputs and/or the number of outputs is equal to the number of scan chains) may be applied instead of using the compression scan method, though, in general, the capacity of test data increases and hence it is necessary to increase the input data rate for the diagnostic test.

Examples of candidates for the external FLASH memory 9 for storing the test data of diagnostic tests include various types of memories such as a Serial FLASH. Further, the method for storing test data into the FLASH memory 9 (the bit width of the data unit, the address range, and so on) can also be changed from those shown in FIGS. 9 and 12. Further, though there is a tendency that the length of necessary patterns increases in order to achieve a comparable fault detection rate, a method in which a circuit for generating a scan test pattern(s) based on pseudo random numbers is internally provided and used, instead of storing test data in the external FLASH memory 9 in advance and using them in the tests, may be used, provided that the diagnosis time for a circuit to be tested can be sufficiently reduced.

Further, in each of the above-shown embodiments, the circuit for which the diagnostic test is performed is each of the CPU cores in a multi-core architecture CPU. However, it is possible to perform diagnostic tests for other multi-core architecture processing circuits based on a similar concept. For example, a similar diagnostic test may be performed for each core (PE: Processing Element) of the hardware accelerator 11 included in the block diagram of the CPU system shown in FIG. 3, 14, 16, 19, 26, 34 or 36.

In the explanations of the third embodiment, the diagnostic test controller 25 (the circuit for controlling diagnostic tests for the CPU cores) additionally includes the circuits 241 to 243 for performing diagnostic tests when the system is started up (the circuits for generating scan test patterns based on pseudo random numbers and performing scan tests). However, it is possible to perform diagnostic tests for both the circuits, i.e., both the circuits to be tested, by using the same method as each other. That is, two similar diagnostic test controllers may be provided, and they may perform diagnostic tests for the other circuits in turn and confirm that they are normal upon start-up. Then, they start their original operations (i.e., diagnostic tests for circuits to be tested). Further, the two diagnostic test controllers may be configured so that when those two diagnostic test controllers perform the original operations, they operate in a redundant manner (a circuit that continuously compares the output signals of both circuits with each other is added). Alternatively, the two diagnostic test controllers may be configured so that when the circuits to be tested are divided into two groups as in the case of the ninth embodiment in which the circuits to be tested are divided into two CPU groups or divided into the CPU cores 101 to 108 and the CPU common circuits 141 and 142, those diagnostic test controllers operate to control their respective diagnostic tests.

In the explanations of the fourth embodiment, when the diagnostic test controller 26 receives a diagnostic test start instruction signal from a CPU core, its test control circuit 229 outputs a test mode switching signal, which is set to a scant test mode, to the CPU core. After that, at the timing at which the diagnostic test is completed, the test control circuit 229 outputs a test mode switching signal, which is returned to the normal mode, to the CPU core. Further, the test control circuit 229 outputs a reset signal to the CPU core. However, these processes may be controlled by a programmable circuit (e.g., a separately provided sub-CPU). This can improve the flexibility of the signal output timing and the like.

Note that the technology of scan tests (including the compression scan method) are widely used in mass-production tests for semiconductor devices. Therefore, it is advisable to skillfully use the scan test controllers for diagnostic tests for CPU cores and the scan test circuits incorporated into the CPU cores as the test circuits that are added for those mass-production tests in addition to their original purposes.

Figure 33:
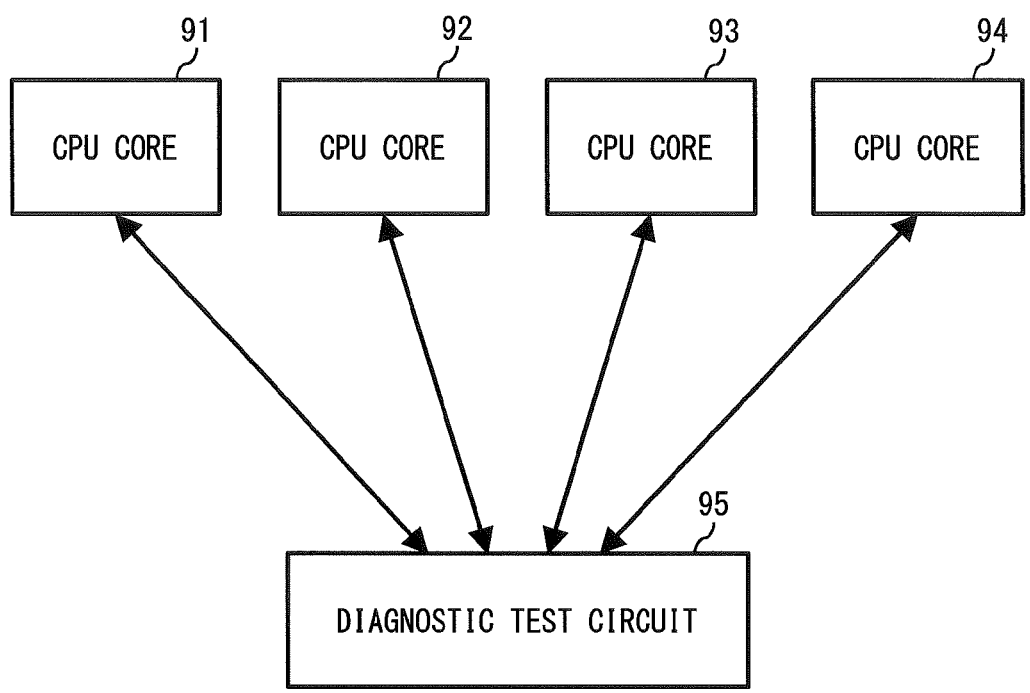
FIG. 33 shows a semiconductor device according to an embodiment.

An embodiment that can be obtained from each of the above-described embodiments is explained hereinafter with reference to FIG. 33. FIG. 33 shows a semiconductor device 90 according to an embodiment obtained from each of the above-described embodiments.

The semiconductor device 90 includes a plurality of CPU cores 91 to 94 and a diagnostic test circuit 95. The semiconductor device 90 corresponds to the CPU systems 2, 3, 4, 5, 6, 7, 5A and 5B. Each of the plurality of CPU cores 91 to 94 includes a scan chain. The CPU cores 91 to 94 correspond to CPU cores 101, 102, 103, 104, 105, 106, 107, 108 and 109. The diagnostic test circuit 95 performs scan tests for the CPU cores 91 to 94 by using the scan chains. The diagnostic test circuit 95 corresponds to the diagnostic test controllers 21, 23, 25, 26 and 28.

Note that the diagnostic test circuit 95 performs a scan test for each of the CPU cores 91 to 94 in a predetermined order on a periodic basis so that the execution time periods (execution periods) of the scan tests do not overlap each other. This makes it possible to prevent or minimize the deterioration in the operation performance.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

What is claimed is:

1. A semiconductor device comprising:
a plurality of CPU (Central Processing Unit) cores each comprising a scan chain; and
a diagnostic test circuit that performs a scan test for the plurality of CPU cores by using the scan chain in each of the CPU cores, wherein
the diagnostic test circuit performs a scan test for each of the plurality of CPU cores in a predetermined order so that execution time periods of the scan tests do not overlap each other,
the scan test for each of the plurality of CPU cores is repeated periodically until the diagnostic test circuit determines that there is a failure in the plurality of CPU cores, and
during an execution time period of the scan test for one of the plurality of CPU cores, the rest of the plurality of CPU core perform normal operations.

2. The semiconductor device according to claim 1, further comprising an interrupt circuit that generates an interruption for each of the plurality of CPU cores, wherein each of the plurality of CPU cores outputs an instruction signal indicating a start of the scan test in response to the interruption, and
the diagnostic test circuit performs a scan test for each of the plurality of CPU cores in response to the output of the instruction signal from a respective one of the plurality of CPU cores.

3. The semiconductor device according to claim 2, wherein
each of the plurality of CPU cores executes a program scheduled by an operating system, and
each of the plurality of CPU cores interrupts, when the interruption is generated, execution of the program currently executed by the CPU core itself to bring the program into an execution waiting state and performs setting so that the operating system does not schedule an arbitrary program for the that CPU core.

4. The semiconductor device according to claim 3, further comprising a record information storage unit that stores, when each of the CPU cores outputs the instruction signal to the diagnostic test circuit, record information indicating that the instruction signal is output from each of the CPU cores, wherein
each of the plurality of CPU cores checks, when the record information is stored in the record information storage unit after a scan test is performed in that CPU core itself, an execution result of that scan test, and when an abnormality is detected, prevents setting for restoring the scheduling for allowing an arbitrary program to be scheduled for that CPU core.

5. The semiconductor device according to claim 3, wherein
the interrupt circuit is a system timer that generates a timer interruption as the interruption in a predetermined interrupt cycle,
the semiconductor device further comprises a time information storage unit that stores, when each of the plurality of CPU cores outputs the instruction signal to the diagnostic test circuit, a time information indicating a time at that moment, the time information being stored into the time information storage unit by a respective one of the plurality of CPU cores,
each of the plurality of CPU cores prevents, when a difference between a time acquired from the system timer after a scan test is performed in that CPU core itself and a time indicated by the time information stored in the time information storage unit is greater than a predetermined threshold, setting for restoring the scheduling for allowing an arbitrary program to be scheduled for that CPU core.

6. The semiconductor device according to claim 2, wherein
the interrupt circuit is a system timer that generates a timer interruption as the interruption in a predetermined interrupt cycle,
the semiconductor device further comprises a time information storage unit that stores, when each of the plurality of CPU cores outputs the instruction signal to the diagnostic test circuit, a time information indicating a time at that moment, the time information being stored into the time information storage unit by a respective one of the plurality of CPU cores,
each of the CPU cores outputs the instruction signal to the diagnostic test circuit when a difference between a time acquired from the system timer in an interrupt process performed in response to the timer interruption and a time indicated by the time information stored in the time information storage unit reaches an execution period of the scan test.

7. The semiconductor device according to claim 2, wherein
the diagnostic test circuit initializes each of the plurality of CPU cores after the scan test for a respective one of the plurality of CPU cores is performed, and
the semiconductor device further comprises:
a storage unit that stores an instruction in an interrupt process executed in response to the interruption; and
a reset controller that changes an address at which each of the plurality of CPU cores reads an instruction in response to the initialization from a reset vector to an address of an instruction at which the execution by the CPU core is interrupted due to the scan test in the interrupt process.

8. The semiconductor device according to claim 2, wherein the interrupt circuit is a diagnostic test trigger circuit that generates the interruption for each of the plurality of CPU cores at an execution timing of the scant test performed in a respective one of the plurality of CPU cores.

9. The semiconductor device according to claim 1, wherein
the diagnostic test circuit successively supplies a plurality of input test data to a currently-diagnosed CPU core through the scan chain,
the currently-diagnosed CPU core successively outputs a plurality of output result data to the diagnostic test circuit through the scan chain, each of the plurality of output result data being generated based on a respective one of the plurality of supplied input test data,
the diagnostic test circuit diagnoses the currently-diagnosed CPU core by reading a first cumulative calculation result from a test data storage unit storing the plurality of input test data and the first cumulative calculation result and comparing the read first cumulative calculation result with a second cumulative calculation result, the first cumulative calculation result being an expected value of a cumulative calculation result of the plurality of output result data, the second cumulative calculation result being obtained by cumulatively calculating the plurality of output result data successively output from the currently-diagnosed CPU core.

10. The semiconductor device according to claim 1, further comprising a DMA controller connected to the diagnostic test circuit through a system bus, the DMA controller being configured to acquire a plurality of input test data from a test data storage unit and successively DMA-transfer the acquired input test data to the diagnostic test circuit through the system bus, the test data storage unit being configured to store the plurality of input test data, the plurality of input test data being successively supplied to the scan chain in the scan test, wherein
the diagnostic test circuit comprises a FIFO memory that temporarily stores a part of the plurality of input test data, acquires the input test data stored in the FIFO memory, and supplies the acquired input test data to the currently-diagnosed CPU core through the scan chain.

11. The semiconductor device according to claim 1, further comprising a second diagnostic test circuit that performs a test for the diagnostic test circuit before the diagnostic test circuit starts a scan test for the plurality of CPU cores.

12. The semiconductor device according to claim 1, wherein
when the diagnostic test circuit performs the scan test, the diagnostic test circuit acquires the input test data from a test data storage unit and supplies the acquired input test data to the scan chain, the test data storage unit storing the input test data to be supplied to the scan chain and an error detection code of the input test data, and
the semiconductor device further comprises a storage unit diagnosis circuit that diagnoses the test data storage unit by calculating an error detection code from the input test data stored in the test data storage unit and comparing the calculated error detection code with the error detection code stored in the test data storage unit before the diagnostic test circuit starts a scan test for the plurality of CPU cores.

13. The semiconductor device according to claim 1, wherein
the diagnostic test circuit successively supplies a plurality of input test data to a currently-diagnosed CPU core through the scan chain,
the currently-diagnosed CPU core outputs a plurality of output result data to the diagnostic test circuit with a difference corresponding to a predetermined number of cycles from the input of the plurality of input test data, each of the plurality of output result data being generated based on a respective one of the plurality of supplied input test data, and
the diagnostic test circuit diagnoses the currently-diagnosed CPU core by reading a plurality of expected value data from a test data storage unit and successively comparing the read expected value data with output result data corresponding to the input test data in an on-the-fly manner, the test data storage unit being configured to store the plurality of input test data and the plurality of expected value data so that given input test data and expected value data that is generated based on input test data preceding the aforementioned given input test data by the predetermined number of cycles are simultaneously read from the test data storage unit, the plurality of expected value data serving as expected values of the plurality of output result data.

14. The semiconductor device according to claim 1, wherein the diagnostic test circuit further comprises:
a state saving storage circuit; and
a state saving control circuit that acquires data successively output after the scan test is started by an amount corresponding to a length of the scan chain, stores the acquired data into the state saving storage circuit, and supplies the data stored in the state saving storage circuit into the scan chain when the scan test is finished.

15. The semiconductor device according to claim 1, further comprising a test data storage unit that stores a plurality of input test data, the plurality of input test data being successively input to the scan chain in the scan test, wherein
the diagnostic test circuit supplies divided test data every time the diagnostic test circuit performs the scan test, the divided test data being obtained by dividing the plurality of input test data into a predetermined number of divided test data, and
each of the plurality of CPU cores interrupts execution of a program when the CPU core starts the scan test, and resumes the execution of the program when the CPU core finishes the scan test.

16. The semiconductor device according to claim 1, further comprising:
an alternative CPU core including the scan chain; and an alternative core control circuit that acquires data successively output after the scan test is started by an amount corresponding to a length of the scan chain, and stores the acquired data into the scan chain of the alternative CPU core, wherein the alternative CPU core performs a process of a CPU core to be scan-tested on behalf of that CPU core based on the data stored in the scan chain of the alternative CPU core.

17. The semiconductor device according to claim 1, wherein the plurality of CPU cores are a plurality of first CPU cores, the semiconductor device further comprises:

a plurality of second CPU cores each comprising a scan chain;

a first CPU comprising the plurality of first CPU cores, and a first CPU common circuit including a scan chain, the first CPU common being commonly used by the plurality of first CPU cores; and a second CPU comprising the plurality of second CPU cores, and a second CPU common circuit including a scan chain, the second CPU common being commonly used by the plurality of second CPU cores, the diagnostic test circuit further performs a scan test for the plurality of second CPU cores and for the first and second CPU common circuits by using the scan chains, and the diagnostic test circuit performs a scan test for each of the first and second CPU common circuits in a predetermined order on a periodic basis so that execution time periods of the scan tests do not overlap each other.

18. The semiconductor device according to claim 1, wherein the plurality of CPU cores perform a process for controlling an actuator unit mounted on a car according to a detection result of a sensor unit mounted on the car.

19. A diagnostic test method for a plurality of CPU (Central Processing Unit) cores including first and second CPU cores, comprising:

starting execution of a scan test for the first CPU core by using a scan chain included in the first CPU core;

starting, after the execution of the scan test for the first CPU core is finished, execution of a scan test for the second CPU core by using a scan chain included in the second CPU core; and starting, after the execution of the scan test for the second CPU core is finished, execution of a scan test for the first CPU core by using the scan chain included in the first CPU core, wherein the scan test for each of the plurality of CPU cores is repeated periodically until a failure in the plurality of CPU cores is determined, and during an execution time period of the scan test for one of the plurality of CPU cores, the rest of the plurality of CPU cores perform normal operations.

20. A circuit, comprising:

a diagnostic test circuit, wherein the diagnostic test circuit performs a fault diagnosis of a plurality of CPU cores each comprising a scan chain, wherein the diagnostic test circuit performs a scan test for each of the plurality of CPU cores by using the scan chain in each of the CPU cores in a predetermined order on a periodic basis so that execution time periods of the scan tests do not overlap each other, wherein the scan test for each of the plurality of CPU cores is repeated periodically until the diagnostic test circuit determines that there is a failure in the plurality of CPU cores, and wherein during an execution time period of the scan test for one of the plurality of CPU cores, the rest of the plurality of CPU cores perform normal operations.

* * * * *